United States Patent [19]

Itaba et al.

[11] Patent Number: 5,788,868
[45] Date of Patent: Aug. 4, 1998

[54] SUBSTRATE TRANSFER METHOD AND INTERFACE APPARATUS

[75] Inventors: Masayuki Itaba; Kazuhiro Nishimura, both of Kyoto, Japan

[73] Assignee: Dainippon Screen Mfg. Co., Ltd., Kyoto, Japan

[21] Appl. No.: 704,261

[22] Filed: Aug. 28, 1996

[30] Foreign Application Priority Data

Sep. 4, 1995 [JP] Japan .................................. 7-251912
Sep. 4, 1995 [JP] Japan .................................. 7-251913

[51] Int. Cl.⁶ .......................... B44C 1/22; H01L 21/00
[52] U.S. Cl. .................... 216/41; 156/345; 438/716
[58] Field of Search .......................... 216/2, 40, 41; 156/345 L, 345 WH, 345 PC; 438/689, 716, 745

[56] References Cited

U.S. PATENT DOCUMENTS 4,816,116  3/1989  Davis et al. ............... 156/345
5,601,686  2/1997  Kanamura et al. .......... 156/345

FOREIGN PATENT DOCUMENTS 62-213259  6/1987  Japan.
63-139809  4/1988  Japan.

*Primary Examiner*—William Powell
*Attorney, Agent, or Firm*—Ostrolenk, Faber, Gerb & Soffen, LLP

[57] ABSTRACT

An interface apparatus is disposed between a processing unit for performing varied treatments on substrates before and after exposure of the substrates, and an exposure unit for performing the exposure. The interface apparatus includes first and second substrate transfer robots, and a substrate storage having a plurality of storage racks for storing a plurality of substrates. The first substrate transfer robot transfer substrates between the processing unit and substrate storage while the second substrate transfer robot transfers substrates between the substrate storage and exposure unit. Each of the robots is operable independently of and parallel to the other robot. The first transfer robot may be omitted, and when it is so omitted, a substrate transport robot in the processing unit performs the functions of the first transfer robot.

19 Claims, 24 Drawing Sheets

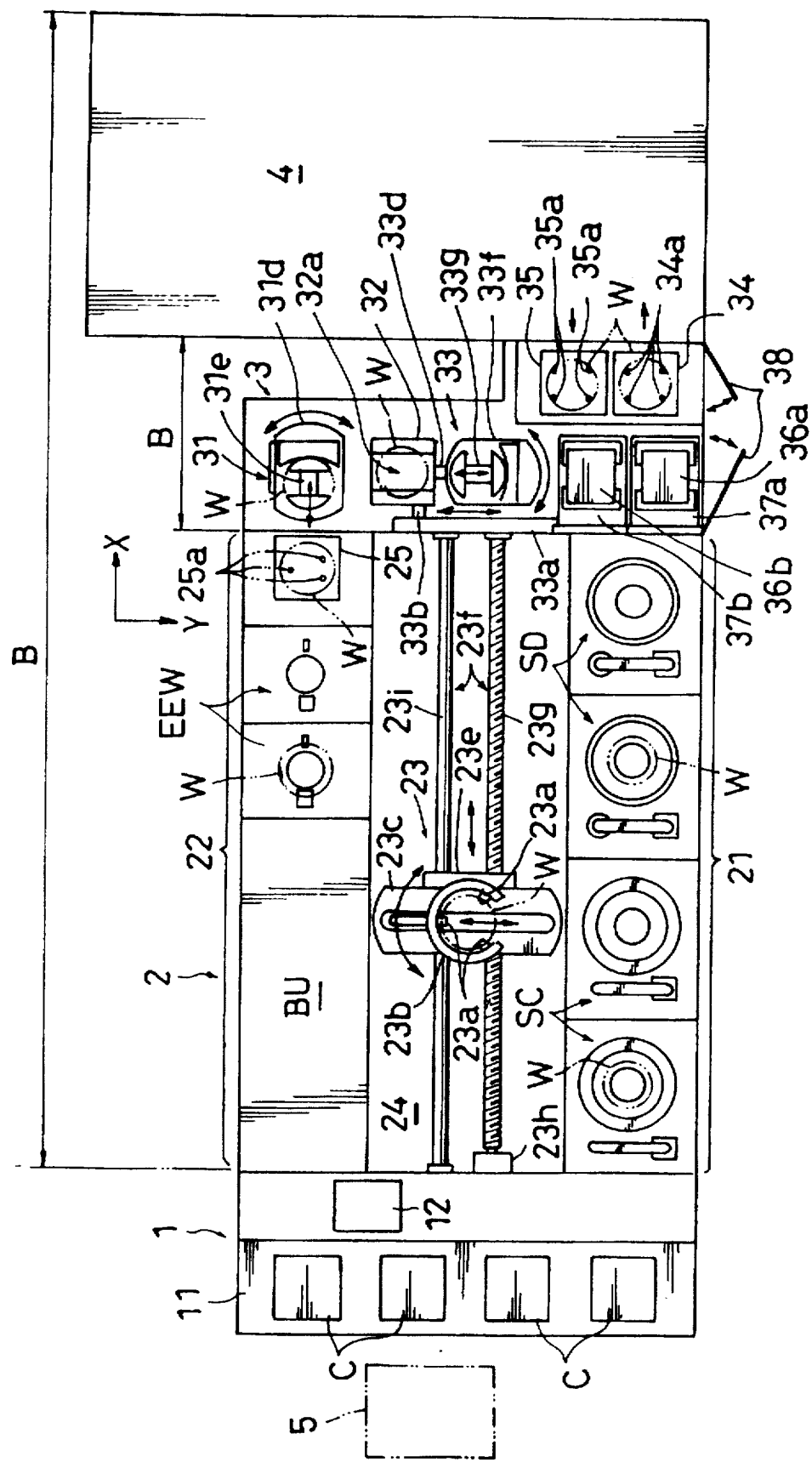

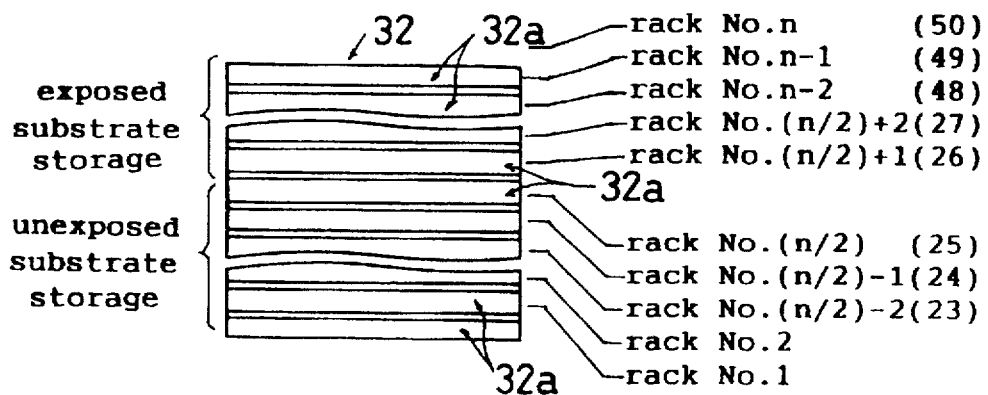

Fig 11A
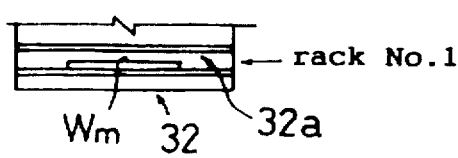
Fig 11B
| rack No. | substrate No. |
|---|---|
| 2 | |
| 1 | m |
Fig 11C
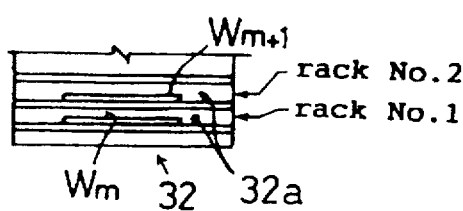
Fig 11D
| rack No. | substrate No. |
|---|---|
| 3 | |
| 2 | m+1 |
| 1 | m |
Fig 11E
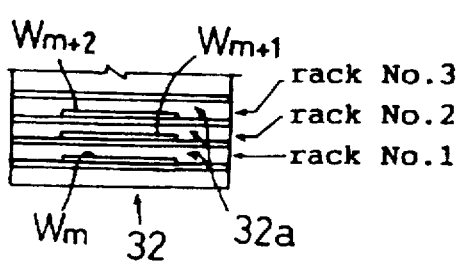
Fig 11F
| rack No. | substrate No. |
|---|---|
| 4 | |
| 3 | m+2 |
| 2 | m+1 |
| 1 | m |
Fig 11G
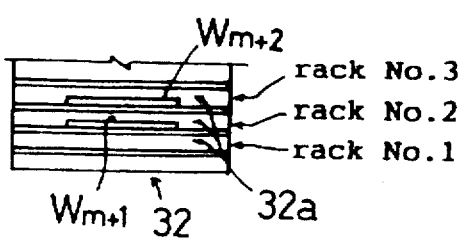
Fig 11H
| rack No. | substrate No. |
|---|---|
| 4 | |
| 3 | m+2 |
| 2 | m+1 |
| 1 | |
Fig 11I
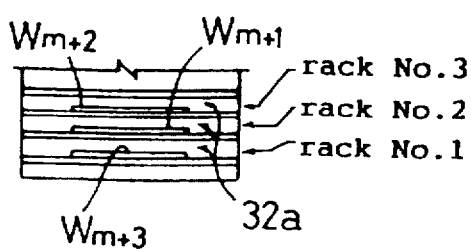
Fig 11J
| rack No. | substrate No. |
|---|---|
| 4 | |
| 3 | m+2 |
| 2 | m+1 |
| 1 | m |

| rack No. | substrate No. | flag |
|---|---|---|
| 6 | | |
| 5 | m-3 | 1 |
| 4 | m+2 | 0 |
| 3 | m-4 | 1 |
| 2 | m+1 | 0 |
| 1 | m | 0 |

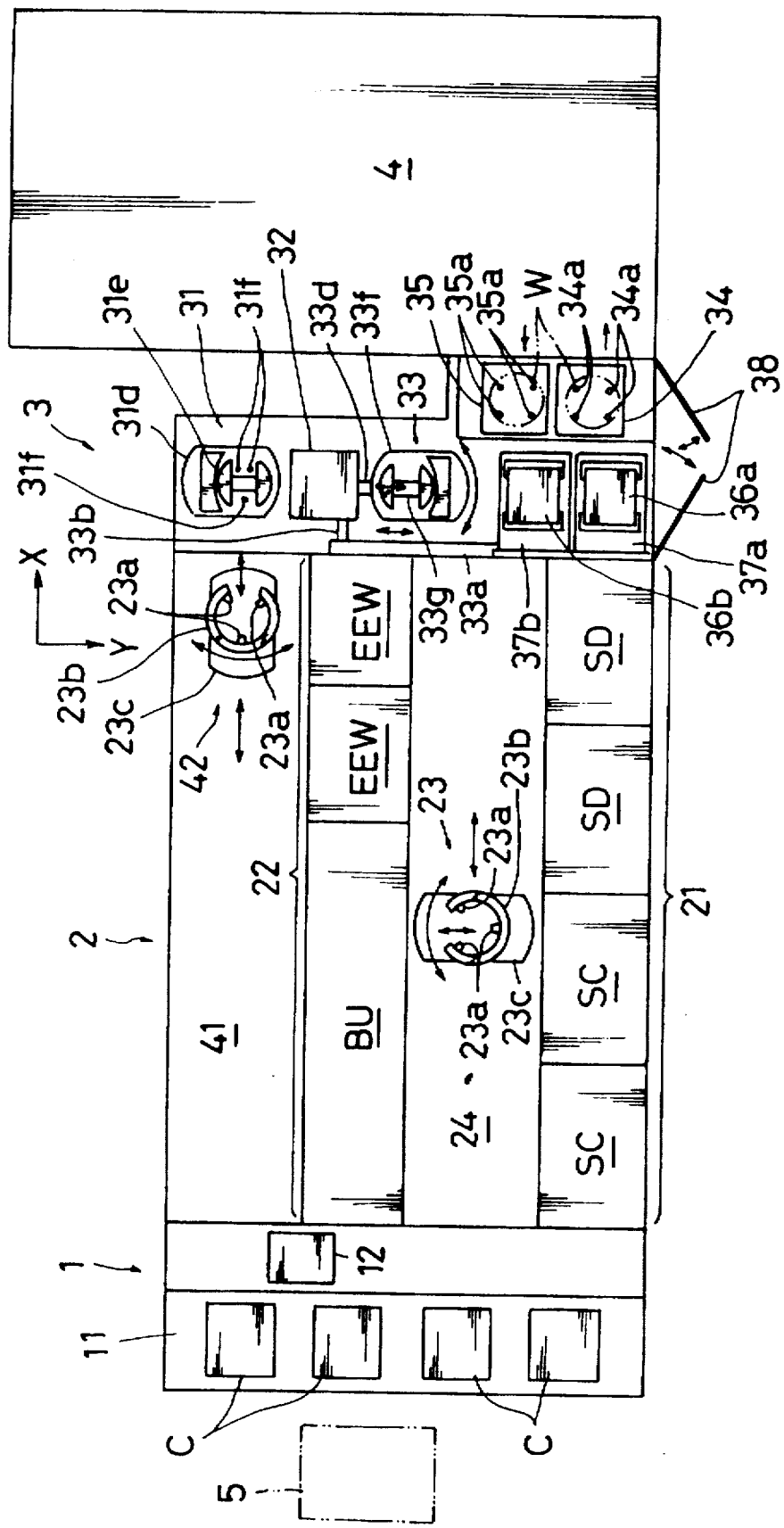

SUBSTRATE TRANSFER METHOD AND INTERFACE APPARATUS

BACKGROUND OF THE INVENTION

(1) Field of the Invention

This invention relates to a substrate transfer method and an interface apparatus for executing the method, when such apparatus is used with a substrate processing system for performing varied treatments (e.g. resist coating, prebaking, exposure, development and postbaking) in photolithographic processing of substrates such as semiconductor wafers or glass substrates for liquid crystal displays. Specifically, such a substrate transfer method and interface apparatus are used in transferring the substrates between a processing unit for performing the varied treatments before and after exposure, with such treatments including resist coating, baking and development, and an exposure unit for performing the exposure treatment.

(2) Description of the Related Art

A conventional substrate processing system for performing varied treatments of substrates in a photolithographic process is divided into a processing unit and an exposure unit. The processing unit performs varied substrate treatments before and after exposure, and the exposure unit carries out the exposure.

The processing unit includes various devices such as a spin coater, a spin developer and a baking unit (including hot plates and cool plates) for resist coating and prebaking before exposure and for development and postbaking after exposure. The processing unit also includes a substrate transport robot for transporting substrates therein. All these devices are integrated into a unit.

The exposure unit includes an exposing machine such as a reduction projecting/exposing machine (or stepper), an alignment mechanism for positioning the substrates to be printed with an exposure pattern by the exposing machine, and a substrate transport robot for transporting the substrates within the exposure unit. All these devices are integrated into a unit.

In the sequence of treatment by the substrate processing system, the processing unit treats a substrate before exposure, then the exposure unit does the exposure, and the processing unit again treats the substrate after the exposure. Thus, it is necessary to transfer the substrate between the processing unit and the exposure unit. A system of this type includes an interface apparatus for transferring substrates between these units. Conventional interface apparatus includes a substrate transfer robot, a substrate transfer table, a substrate input table, a substrate output table and a buffer section, all integrated into an interface unit.

The conventional interface unit (interface apparatus) will be described with reference to FIGS. 1A through 1C wherein FIG. 1A is an overall view in cross section of a substrate processing system having a conventional interface unit, FIG. 1B is a front view of the conventional interface unit seen from a processing unit, and FIG. 1C is a side view of the interface unit. Each of these figures includes rectangular coordinates XYZ to clearly indicate a positional relationship among these figures.

An interface unit 100 includes a substrate transfer robot 101 having a substrate support 102 for supporting a substrate W, an x-direction moving mechanism 103 for moving the substrate support 102 along the x-axis shown, a z-direction moving mechanism 104 for moving the substrate support 102 along the z-axis by means of the x-direction moving mechanism 103, and a y-direction moving mechanism 105 for moving the substrate support 102 along the y-axis by means of the z-direction moving mechanism 104 and x-direction moving mechanism 103. Thus, the substrate transfer robot 101 moves the substrate W placed on the substrate support 102 along x-, y- and z-axes (within a three-dimensional space). In this way, the substrate W may be transported among a substrate transfer table 110, a substrate input table 111, a substrate output table 112 and (a position on) a selected storage rack 113a in a buffer section 113.

The substrate transfer table 110 is used for transferring the substrate W to and from the processing unit 2 (i.e. a substrate transport robot 23 in the processing unit 2). The substrate input table 111 and substrate output table 112 are used for transferring the substrate W to and from the exposure unit 4 (i.e. a substrate transport robot, not shown, in the exposure unit 4).

An opening 4a shown in FIG. 1B is provided to allow passage of the substrate transport robot supporting the substrate W in the exposure unit 4 when the substrate W is transferred between the exposure unit 4 and interface unit 100. Although not shown, a similar opening is provided between the processing unit 2 and interface unit 100 for allowing passage of the substrate transport robot 23 supporting the substrate W in the processing unit 2 when the substrate W is transferred between the processing unit 2 and interface unit 100.

The buffer section 113 includes a plurality of racks 113a for temporarily storing substrates W. The substrates W are temporarily stored in the buffer section 113 in the event of a difference occurring in processing time between the processing unit 2 and the exposure unit 4.

The processing time in the exposure unit 4 is determined roughly by a period of time required for the exposing machine to print an exposure pattern, a period of time taken in transporting the substrate W within the exposure unit 4, and a period of time taken in positioning the substrate W. The first- and second-mentioned periods of time are substantially invariable whereas the positioning time is variable.

The processing time in the processing unit 2 is determined roughly by a period of time required for the processing unit 2 to carry out the substrate treating steps before and after the exposure, including resist coating, prebaking, development and postbaking, and a period of time taken in transporting the substrate W within the processing unit 2. These periods of time are substantially invariable. The substrate transport robot 23 in the processing unit 2 delivers a substrate W having undergone the treatment before exposure (hereinafter "unexposed substrate W") to the interface unit 100 to be passed on to the substrate transport robot in the exposure unit 4, and takes into the processing unit 2 the substrate W having undergone exposure (hereinafter "exposed substrate W") and transported from the exposure unit 4 through the interface unit 100. Generally, the output of unexposed substrate W to the interface unit 100 by the substrate transport robot 23 in the processing unit 2 and the intake of exposed substrate W to the processing unit 2 are timed on the basis of the exposure processing time (or average exposing time) in the exposure unit 4. The average exposing time is determined by taking into account an average period of time consumed in positioning the substrate W in the exposure unit 4.

As long as the exposure unit 4 operates according to the average exposing time, unexposed substrate W is smoothly transferred from the processing unit 2 through the interface unit 100 to the exposure unit 4, and exposed substrate W smoothly transferred from the exposure unit 4 through the interface unit 100 to the processing unit 2. However, since the time taken in positioning the substrate W in the exposure unit 4 is variable as noted above, the unexposed substrate W and exposed substrate W are not always transferred smoothly.

For example, a longer time than the average positioning time may be consumed in positioning an unexposed substrate W brought into the exposure unit 4. Meanwhile, a next unexposed substrate W may be delivered from the processing unit 2 to the interface unit 100. However, the substrate transfer robot 101 in the interface unit 100 cannot transfer the next unexposed substrate W to the substrate transport robot in the exposure unit 4 since exposure of the preceding substrate W is in progress in the exposure unit 4. The substrate transfer operation must stand still in the interface unit 100.

When the exposure unit 4 fails to perform exposure in the average exposing time, a time lag occurs between output of an exposed substrate W from the exposure unit 4 to the interface unit 100 and intake of an exposed substrate W from the interface unit 100 to the processing unit 2 by the substrate transport robot 23 in the processing unit 2. In such a case, the substrate transfer robot 101 in the interface unit 100 cannot transfer the exposed substrate W received from the exposure unit 4 to the substrate transport robot 23 in the processing unit 2. Again, the substrate transfer operation must stand still in the interface unit 100.

Such a stoppage of the substrate transfer operation in the interface unit 100 disrupts a series of treating steps within the processing unit 2 and a series of exposing steps within the exposure unit 4. This results in a reduction in throughput of the entire lithographic process.

Thus, the conventional system includes the buffer section 113 in the interface unit 100 in order to avoid a stoppage of the substrate transfer operation in the interface unit 100. Substrates W are temporarily stored on the storage racks 113a in the buffer section 113 as described hereinafter when unexposed substrates W cannot be transferred to the substrate transport robot in the exposure unit 4, or when exposed substrates W cannot be transferred to the substrate transport robot 23 in the processing unit 2.

The conventional interface unit 100 performs the substrate transfer operation according to the entire processing sequence of the substrate processing system, as follows.

First, the substrate transport robot 23 in the processing unit 2 loads an unexposed substrate W on the substrate transfer table 110. The substrate transfer robot 101 in the interface unit 100 raises the substrate support 102 (along the x-axis) from under the substrate W resting on the substrate transfer table 110. The substrate support 102 having picked up the substrate W is moved along the x-axis, y-axis or z-axis as appropriate. Then, the substrate support 102 is lowered (along the z-axis) to the substrate input table 111 to place the substrate W thereon. The unexposed substrate W placed on the substrate input table 111 is taken into the exposure unit 4 by the substrate transport robot thereof.

During the above operation for transferring the unexposed substrate W, a long time may be consumed in positioning an unexposed substrate W already taken into the exposure unit 4 (in the operation before last), resulting in a longer exposing time than the average exposing time. In this case, the unexposed substrate W placed on the substrate input table 111 by the substrate transfer robot 101 in the immediately preceding transfer operation remains on the substrate input table 111 instead of being taken into the exposure unit 4. Therefore, the substrate transfer robot 101 cannot place an unexposed substrate W that is newly received from the substrate transport robot 23 in the processing unit 2 on to input table 111. In such a case, the substrate transfer robot 101 temporarily stores this unexposed substrate W on a selected storage rack 113a in the buffer section 113. Subsequently, the unexposed substrate W on the substrate input table 111 is transported into the exposure unit 4 by the substrate transport robot thereof, leaving the substrate input table 111 vacant. The substrate transfer robot 101 then fetches the new unexposed substrate W stored in the buffer section 113, and loads this substrate W on the substrate input table 111. In this way, a delay in the exposing operation by the exposure unit 4 does not disrupt the substrate transfer operation of the interface unit 100. The interface unit 100 can accept an unexposed substrate W delivered from the processing unit 2 at a predetermined time, without leaving the substrate W on the substrate transfer table 110 for a long time.

An exposed substrate W is transported from the exposure unit 4 and loaded on the substrate output table 112 by the substrate transport robot in the exposure unit 4. The substrate transfer robot 101 in the interface unit 100 raises the substrate support 102 from under the substrate W resting on the substrate output table 112. The substrate support 102 having picked up the substrate W is moved along the x-axis, y-axis or z-axis as appropriate. Then, the substrate support 102 is lowered to the substrate transfer table 110 to place the substrate W thereon. The exposed substrate W placed on the substrate transfer table 110 is taken into the processing unit 2 by the substrate transport robot 23 thereof.

The exposure unit 4 may fail to perform exposure in the average exposing time, resulting in a time lag between output of an exposed substrate W from the exposure unit 4 to the interface unit 100 and intake of an exposed substrate W from the interface unit 100 to the processing unit 2 by the substrate transport robot 23 in the processing unit 2. In such a case, the exposed substrate W previously loaded on the substrate transfer table 110 (or an unexposed substrate W) may remain thereon. The substrate transfer robot 101 cannot place, on the substrate transfer table 110, the substrate W newly received from the substrate transport robot in the exposure unit 4. In this case also, the substrate transfer robot 101 temporarily stores this exposed substrate W on a selected storage rack 113a in the buffer section 113. Subsequently, the exposed substrate W on the substrate transfer table 110 may be taken into the processing unit 2 by the substrate transport robot 23 thereof, leaving the substrate transfer table 110 vacant. The substrate transfer robot 101 then fetches the exposed substrate W stored in the buffer section 113, and loads this substrate W on the substrate transfer table 110. In this way, a variation in the exposing time in the exposure unit 4 does not disrupt the substrate transfer operation of the interface unit 100. The exposed substrate W may be transported smoothly from the exposure unit 4 to the interface unit 100 without being left on the substrate output table 112 for a long time.

The conventional construction described above has the following drawbacks.

The conventional interface unit 100 includes the buffer section 113 to accommodate a lag in processing time between the processing unit 2 and exposure unit 4. The buffer section 113 is used frequently since the time required for positioning substrates W in the exposure unit 4 tends to vary from substrate to substrate. That is, in most cases, the substrate transfer robot 101 in the interface unit 100 once transfers an unexposed substrate W from the substrate transfer table 110 to the buffer section 113, and then transfers the unexposed substrate W from the buffer section 113 to the substrate input table 111. Similarly, the substrate transfer robot 101 transfers an exposed substrate W from the substrate output table 112 to the substrate transfer table 110 by way of the buffer section 113. In the conventional construction, therefore, the substrate transfer made via the buffer section 113 entails a correspondingly increased number of positions in which the substrate transfer robot 101 in the interface unit 100 transfers substrates W to cope with a lag in processing time between the processing unit 2 and exposure unit 4. It is difficult to reduce the time required for the substrate transfer operation per se.

As shown in FIG. 1A, the conventional processing unit 2 includes a substrate transport path 24 between a first apparatus area 21 (which usually accommodates spin coaters and spin developers) and a second apparatus area 22 (which usually accommodates a bake unit and other devices). The substrate transport robot 23 is movable through the substrate transport path 24. Therefore, as shown in FIGS. 1A and 1B, the substrate transfer table 110 of the interface unit 100 is disposed in a substantially middle position along the y-axis. That is, the substrate transfer table 110 is disposed in a range of movement of the substrate transfer robot 101. The substrate transfer robot 101 may have to circumvent the substrate transfer table 110 in transferring substrates W, for example, between the buffer section 113 and the substrate input table 111 or substrate output table 112 arranged at opposite sides of the substrate transfer table 110. Such a wasteful movement is obstructive to a reduction in the time consumed in transferring substrates W within the interface unit 100.

It is satisfactory if the substrate transfer within the interface unit 100 is carried out within a period of time needed to transfer a substrate W between the processing unit 2 and exposure unit 4. The timing of substrate transfer between the processing unit 2 and exposure unit 4 is dependent roughly on the average exposing time in the exposure unit 4. Conventionally, the average exposing time in the exposure unit 4 is relatively long, in the order of 60 sec. per substrate. It has been possible to carry out the substrate transfer in the interface unit 100 within a period of time taken in transferring a substrate W between the processing unit 2 and exposure unit 4, despite the large number of substrate transfer positions in the interface unit 100 or the wasteful movement circumventing the substrate transfer table 110. Thus, there has been no great problem.

High-speed exposure units have been developed recently, in which an average exposing time is reduced to 40 sec. per substrate, and to 30 sec. per substrate. As for the processing unit 2, the processing time may be reduced by optimizing the operation of the substrate transport robot 23, for example. Thus, the processing unit 2 can to some extent follow the processing in the exposure unit 4 even if the latter is expedited. However, where the conventional interface unit 100 is used for transferring substrates W between the high-speed exposure unit 4 and the processing unit 2 capable of following the exposre processing, the substrate transfer within the interface unit 100 is delayed with respect to the timing of substrate transfer between the processing unit 2 and exposure unit 4. The delay in the substrate transfer within the interface unit 100 is obstructive to smooth progress from pre-exposure substrate treatment (in the processing unit 2) to exposure and from exposure to post-exposure treatment (in the processing unit 2). Thus, although the exposure unit 4 and processing unit 2 are operable at high speed, the throughput of the entire photolithographic process remains slow. There has been no interface unit (interface apparatus) developed or offered heretofore, which is capable of following the timing of substrate transfer between the high-speed exposure unit 4 and the processing unit 2 adapted to follow the high-speed exposure.

SUMMARY OF THE INVENTION

This invention has been made having regard to the state of the art noted above, and its object is to provide a substrate transfer method and an interface apparatus, in which a substrate transfer operation within the interface apparatus is carried out at high speed while coping with a lag in processing time between a processing unit and an exposure unit.

The above object is fulfilled, according to one aspect of this invention, by a substrate transfer method for transferring substrates, in a photolithographic process, between a processing unit for performing varied treatments before and after exposure and an exposure unit for performing the exposure, the method comprising:

a first transfer step for transferring substrates, which are to be passed from the processing unit to the exposure unit, from the processing unit to a substrate storage having a plurality of storage portions for temporarily storing a plurality of substrates, and depositing the substrates in selected ones of the storage portions;

a second transfer step for fetching, from the substrate storage, the substrates stored therein in the first transfer step, and transferring the substrates to the exposure unit;

a third transfer step for transferring substrates, which are to be passed from the exposure unit to the processing unit, from the exposure unit to the substrate storage and depositing the substrates in selected ones of the storage portions; and a fourth transfer step for fetching, from the substrate storage, the substrates stored therein in the third transfer step, and transferring the substrates to the processing unit;

wherein the first transfer step and the fourth transfer step are executed by one substrate transfer device, and the second transfer step and the third transfer step are executed by another substrate transfer device.

An interface apparatus may include a first substrate transfer device for executing the first and fourth transfer steps, and a second substrate transfer device for executing the second and third transfer steps. The substrate transfer device for executing the second and third steps may be included in the interface apparatus, in which case the first transfer step and the fourth transfer step are executed by a substrate transport device in the processing unit. This substrate transport device is operable for transporting substrates within the processing unit and into and out of a plurality of processors in the processing unit for performing the varied treatments before and after exposure.

The first transfer step and the fourth transfer step may be executed based on operating information of the processing unit, and the second transfer step and the third transfer step executed based on operating information of the exposure unit.

Preferably, the storage portions are arranged in multiple vertical stages; the storage portions are vertically divided into two groups for use; one of the groups (i.e. the first group of storage portions) is used for storing the substrates received in the first transfer step; the other group (i.e. the second group of storage portions) is used for storing the substrates received in the third transfer step; the first transfer step is executed by searching the first group of storage portions upward for a vacancy, and depositing each of the substrates in a lowermost vacant storage portion; the second transfer step is executed by fetching, from the substrate storage, a substrate deposited earliest of all substrates during the first transfer step; the third transfer step is executed by searching the second group of storage portions upward for a vacancy, and depositing each of the substrates in a lowermost vacant storage portion; and the fourth transfer step is executed by fetching, from the substrate storage, a substrate deposited earliest of all substrates during the third transfer step. This method contributes to a reduction in substrate transfer time.

In a different mode, the storage portions are arranged in multiple vertical stages; the first transfer step is executed by searching all of the storage portions upward for a vacancy, and depositing each of the substrate in a lowermost vacant storage portion; the second transfer step is executed by fetching, from the substrate storage, a substrate deposited earliest of all substrates during the first transfer step; the third transfer step is executed by searching all of the storage portions upward for a vacancy, and depositing each of the substrates in a lowermost vacant storage portion; and the fourth transfer step is executed by fetching, from the substrate storage, a substrate deposited earliest of all substrates during the third transfer step. This method also contributes to a reduction in substrate transfer time.

The invention provides interface apparatus for executing the above substrate transfer method. The first interface apparatus according to this invention comprises:

a substrate storage having a plurality of storage portions for temporarily storing a plurality of substrates;

a first substrate transfer device for depositing substrates received from the processing unit in selected ones of the storage portions, and fetching substrates from selected ones of the storage portions and transferring the substrates to the processing unit; and a second substrate transfer device for fetching substrates from selected ones of the storage portions and transferring the substrates to the exposure unit, and depositing substrates received from the exposure unit in selected ones of the storage portions.

In transferring an unexposed substrate from the processing unit to the exposure unit through the first interface apparatus, the first substrate transfer device receives the unexposed substrate from the processing unit, and deposits the substrate in a selected storage portion of the substrate storage (the first transfer step). The second substrate transfer device fetches the substrate from the substrate storage, and transfers the substrate to the exposure unit (the second transfer step). In the event of a delay in the exposure process by the exposure unit, subsequent unexposed substrates received from the processing unit cannot be passed on to the exposure unit. In such a case, the first substrate transfer device successively deposits the unexposed substrates in vacant storage portions of the substrate storage. When the exposure unit becomes ready to accept unexposed substrates, the second substrate transfer device fetches the unexposed substrates from the substrate storage, and transfers the substrates to the exposure unit.

In transferring an exposed substrate from the exposure unit to the processing unit, the second substrate transfer device receives the unexposed substrate from the exposure unit, and deposits the substrate in a selected storage portion of the substrate storage (the third transfer step). The first substrate transfer device fetches the substrate from the substrate storage, and transfers the substrate to the processing unit (the fourth transfer step). When the substrate transfer cannot be conducted smoothly, one or more storage portions of the substrate storage are used for temporarily storing substrates.

Preferably, the first substrate transfer device is operable, based on operating information of the processing unit, for depositing substrates received from the processing unit in the selected ones of the storage portions, and fetching substrates from selected ones of the storage portions and transferring the substrates to the processing unit; and the second substrate transfer device is operable, based on operating information of the exposure unit, for fetching substrates from selected ones of the storage portions and transferring the substrates to the exposure unit, and depositing substrates received from the exposure unit in selected ones of the storage portions.

Specifically, the first substrate transfer device executes the first transfer step in timed relationship to output of unexposed substrates from the processing unit, and the fourth transfer step in timed relationship to intake of exposed substrates to the processing unit. The second substrate transfer device executes the second transfer step in timed relationship to intake of unexposed substrate to the exposure unit, and the third transfer step in timed relationship to output of exposed substrates from the exposure unit. Thus, the first substrate transfer device executes the first and fourth transfer steps based on substrate output from and substrate intake to the processing unit. On the other hand, the second substrate transfer device executes the second and third transfer steps based on substrate intake to and substrate output from the processing unit, asynchronously with the operation of the first substrate transfer device.

This construction has the flexibility for coping with a difference in processing time between the processing unit and exposure unit. The first and second substrate transfer devices have reduced numbers of transfer positions. The first and second substrate transfer devices perform the respective transfer operations independently of and parallel to each other. Consequently, substrates are transferred between the processing unit and exposure unit in a reduced time. Further, since substrates are transferred by the first and second substrate transfer devices with the substrate storage disposed in between, the substrate transfer devices need not move over the substrate transfer positions including the substrate storage, or take wasteful action circumventing the substrate transfer positions. Thus, a correspondingly reduced time is consumed in the substrate transfer between the processing unit and exposure unit.

Where the interface apparatus according to this invention is used between the high-speed exposure unit and the processing unit adapted to follow the high-speed exposure, the substrate transfer between the processing unit and exposure unit may follow the high-speed processes in the exposure unit and processing unit. This feature eliminates the inconvenience of lowering the throughput of the entire photolithographic process.

In the first interface apparatus, preferably, the storage portions are arranged in multiple vertical stages; the first substrate transfer device includes a device for exchanging substrates with the processing unit, a substrate depositing/fetching device extendible and retractable horizontally for supporting substrates and depositing and fetching the substrates in/from the selected ones of the storage portions, and a vertical direction moving device for vertically moving the substrate depositing/fetching device; the second substrate transfer device includes a substrate depositing/fetching device extendible and retractable horizontally for supporting substrates and depositing and fetching the substrates in/from the selected ones of the storage portions, and depositing and fetching substrates on/from a substrate input/output table for exchanging the substrates with the exposure unit, a rotary device for rotating the substrate depositing/fetching device about a vertical axis, a vertical direction moving device for vertically moving the substrate depositing/fetching device, and a uniaxial direction moving device for moving the substrate depositing/fetching device in horizontal uniaxial directions; and the first substrate transfer device, the substrate storage and the second substrate transfer device are arranged in this order substantially linearly and parallel to the direction of movement of the uniaxial direction moving device; the substrate input/output table being arranged along the direction of movement of the uniaxial direction moving device.

The apparatus having the above construction transfers substrates as follows.

In transferring an unexposed substrate from the processing unit to the exposure unit, the substrate exchanging device of the first substrate transfer device first receives an unexposed substrate from the processing unit, and the substrate depositing/fetching device of the first substrate transfer device supports the substrate. The vertical direction moving device of the first substrate transfer device moves the substrate depositing/fetching device vertically to adjust the depositing/fetching device to a height of a selected storage portion of the substrate storage in which the substrate is to be deposited. Then, the substrate depositing/fetching device supporting the substrate is extended horizontally to deposit the substrate in the selected storage portion.

Next, the rotary device of the second substrate transfer device rotates the substrate depositing/fetching device of the second substrate transfer device about the vertical axis, so that the depositing/fetching device is horizontally extendible to and retractable from the substrate storage. The vertical direction moving device of the second substrate transfer device vertically moves the substrate depositing/fetching device to adjust the height of the depositing/fetching device. Then, the substrate depositing/fetching device is extended to fetch the substrate from the storage portion in which the substrate has been deposited by the first substrate transfer device. The uniaxial direction moving device of the second substrate transfer device moves the depositing/fetching device supporting the substrate horizontally in a uniaxial direction, and stops the depositing/fetching device in a position opposed to the substrate input/output table. Then, the rotary device rotates the substrate depositing/fetching device of the second substrate transfer device about the vertical axis, so that the depositing/fetching device is horizontally extendible to and retractable from the substrate input/output table. The vertical direction moving device moves the substrate depositing/fetching device vertically to adjust the depositing/fetching device to the height of the substrate input/output table. Then, the substrate depositing/fetching device is extended to load the substrate on the input/output table. The substrate loaded on the input/output table is taken into the exposure unit by a substrate transport robot or the like in the exposure unit.

For the second substrate transfer device to fetch the substrate from the substrate storage, either of the rotation about the vertical axis or the vertical movement of the substrate depositing/fetching device may be carried out first. The movement in the horizontal uniaxial direction, rotation about the vertical axis and vertical movement of the depositing/fetching device may be carried out in any order after fetching the substrate from the substrate storage and before loading the substrate on the substrate input/output table.

The transfer of an exposed substrate from the exposure unit to the processing unit is carried out in an operation substantially reversed from the transfer of an unexposed substrate from the processing unit to the exposure unit. It is to be noted that an exposed substrate is discharged from the exposure unit by the substrate transport robot or the like in the exposure unit, and loaded on the substrate input/output table.

In the above apparatus, the first substrate transfer device, the substrate storage and the second substrate transfer device are arranged in this order substantially linearly and parallel to the direction of movement of the uniaxial direction moving device, with the substrate input/output table arranged along the direction of movement of the uniaxial direction moving device. Consequently, the first and second substrate transfer devices may deposit and fetch substrates in/from the substrate storage by moving substantially linearly, and may move in the horizontal uniaxial direction also substantially linearly. This interface apparatus is formed into a unit (interface unit) which may be elongated in the horizontal uniaxial direction. The interface unit is disposed between the processing unit and exposure unit. Where, for example, the processing unit, interface unit and exposure unit are arranged in the horizontal uniaxial direction, the interface unit may be elongated in a direction perpendicular to a direction wherein the three units are arranged. This results in a reduced spacing between the processing unit and exposure unit, and hence a reduced dimension from the processing unit to the exposure unit. Thus, a floor area dedicated to these units is used efficiently.

Preferably, the processing unit includes a plurality of processors for performing the varied treatments before and after exposure in the photolithographic process, a substrate transfer table having a plurality of substrate support pins erected thereon, and a substrate transport device for transporting substrates into and out of the processors, transporting the substrates within the processing unit, and depositing and fetching the substrates on/from the substrate transfer table; the processing unit further including a first apparatus area and a second apparatus area for separately accommodating the plurality of processors; the first apparatus area, a substrate transport path for movement of the substrate transport device, and the second apparatus area being arranged in this order in plan view; the substrate transfer table is disposed at an end of the first or second apparatus area adjacent the interface apparatus; the uniaxial direction moving device is movable parallel to that direction in which the first apparatus area, the substrate transport path and the second apparatus area are arranged; the first substrate transfer device is disposed adjacent the end of the first or second apparatus area where the substrate transfer table is disposed; and the first substrate transfer device is operable for exchanging substrates with the substrate transport device in the processing unit through the substrate transfer table, thereby receiving the substrates from the processing unit and transferring the substrates to the processing unit.

In an alternative construction, the processing unit includes a plurality of processors for performing the varied treatments before and after exposure in the photolithographic process, and first substrate transport device and second substrate transport devices for transporting substrates into and out of the processors, transporting the substrates within the processing unit, and sharing a function for exchanging the substrates with the first substrate transfer device; the processing unit further including a first apparatus area and a second apparatus area for separately accommodating the plurality of processors; the first apparatus area, a first substrate transport path for movement of the first substrate transport device, the second apparatus area, and a second substrate transport path for movement of the second substrate transport device being arranged in this order in plan view; the uniaxial direction moving device is movable parallel to a direction of arrangement of the first apparatus area, the first substrate transport path, the second apparatus area and the second substrate transport path; the first substrate transfer device is disposed adjacent an end of either the first or second substrate transport path; and the first substrate transfer device is operable for exchanging substrates with either the first or second substrate transport device in the processing unit, thereby receiving the substrates from the processing unit and transferring the substrates to the processing unit.

In the above interface apparatus, the storage portions are arranged in multiple vertical stages, and the first and second substrate transfer devices deposit and fetch substrates in/from the storage portions of the substrate storage by vertically moving the respective depositing/fetching devices. Thus, a reduced floor area is required for installing the substrate storage, to enable the interface unit to be horizontally compact and to diminish the floor area dedicated to the interface unit.

The processing unit, interface apparatus and exposure unit of the type noted above are installed in a cleanroom requiring a high running cost. The above construction makes efficient use of floor space in the cleanroom.

Preferably, the above interface apparatus further comprises a control device for controlling use of the storage portions as vertically divided into two groups, one of the groups (i.e. the first group of storage portions) being used for storing the substrates transferred from the processing unit to the first substrate transfer device, the other group (i.e. the second group of storage portions) being used for storing the substrates transferred from the exposure unit to the second substrate transfer device; searching the first group of storage portions upward for a vacancy, and causing the first substrate transfer device to deposit each of the substrates in the lowermost vacant storage portion, when the first substrate transfer device deposits the substrates in the first group of storage portions; causing the second substrate transfer device to fetch, from the substrate storage, a substrate deposited earliest of all substrates; searching the second group of storage portions upward for a vacancy, and causing the second substrate transfer device to deposit each of the substrates in the lowermost vacant storage portion, when the second substrate transfer device deposits the substrates in the second group of storage portions; and causing the first substrate transfer device to fetch, from the substrate storage, a substrate deposited earliest of all substrates deposited by the second substrate transfer device.

Alternatively, the interface apparatus may further comprise a control device for searching all of the storage portions upward for a vacancy, and causing the first substrate transfer device to deposit each of the substrates in the lowermost vacant storage portion, when the first substrate transfer device deposits the substrates in the substrate storage; causing the second substrate transfer device to fetch, from the substrate storage, a substrate deposited earliest of all substrates deposited by the first substrate transfer device; searching the storage portions upward for a vacancy, and causing the second substrate transfer device to deposit each of the substrates in the lowermost vacant storage portion, when the second substrate transfer device deposits the substrates in the substrate storage; and causing the first substrate transfer device to fetch, from the substrate storage, a substrate deposited earliest of all substrates deposited by the second substrate transfer device.

Because of the constructions of the processing unit and exposure unit, the interface apparatus often has the substrate storage disposed above the position of substrate exchange with the substrate transport device in the processing unit, the substrate transfer table and the substrate input/output table. In such a case, with the control for using the storage portions of the substrate storage successively from a lower one, the first and second substrate transfer devices are moved by correspondingly reduced amounts. Consequently, wasteful action is diminished in the transfer operations of the first and second substrate transfer devices, thereby contributing to high-speed substrate transfer within the interface apparatus.

The second interface apparatus for executing the foregoing substrate transfer method comprises:

a substrate storage having a plurality of storage portions for temporarily storing a plurality of substrates, the substrate storage being constructed for allowing a substrate transport device in the processing unit to deposit and fetch substrates in/from selected ones of the storage portions, the substrate transport device being operable for transporting substrates within the processing unit and into and out of a plurality of processors in the processing unit for performing the varied treatments before and after exposure; and a substrate transfer device for fetching substrates from selected ones of the storage portions and transferring the substrates to the exposure unit, and depositing substrates received from the exposure unit in selected ones of the storage portions.

Preferably, the substrate transfer device is operable, based on operating information of the exposure unit, for fetching substrates from selected ones of the storage portions and transferring the substrates to the exposure unit, and depositing substrates received from the exposure unit in selected ones of the storage portions.

In transferring an unexposed substrate from the processing unit to the exposure unit through this interface apparatus, the substrate transport device in the processing unit deposits the unexposed substrate outputted from the processing unit in a selected storage portion of the substrate storage. Next, the substrate transfer device fetches the substrate from the substrate storage, and transfers the substrate to the exposure unit. In the event of a delay in the exposure process by the exposure unit, subsequent unexposed substrates outputted from the processing unit cannot be passed on to the exposure unit. In such a case, the substrate transport device in the processing unit successively deposits the unexposed substrates in vacant storage portions of the substrate storage. When the exposure unit becomes ready to accept unexposed substrates, the substrate transfer device fetches the unexposed substrates from the substrate storage, and transfers the substrates to the exposure unit.

In transferring an exposed substrate from the exposure unit to the processing unit, the substrate transfer device receives the unexposed substrate from the exposure unit, and deposits the substrate in a selected storage portion of the substrate storage. The substrate transport device in the processing unit fetches the substrate from the substrate storage, and takes the substrate into the processing unit. When the exposure unit outputs exposed substrates faster than the substrate intake to the processing unit, the substrate transfer device temporarily stores the substrates in vacant storage portions of the substrate storage. The substrate transport device in the processing unit successively fetches the exposed substrates from the substrate storage, and brings the substrates into the processing unit in timed relationship to the intake of exposed substrates to the processing unit.

The second interface apparatus, with the substrate storage, has the flexibility for coping with a difference in processing time between the processing unit and exposure unit.

In the second interface apparatus, the substrate storage is used also as a position of transfer between the substrate transport device in the processing unit and the substrate transfer device in the interface apparatus. Thus, the substrate transfer device in the interface apparatus has a reduced number of substrate transfer positions, thereby expediting the substrate transfer operation within the interface apparatus.

Since the substrate storage is used also as a position of transfer between the substrate transport device in the processing unit and the substrate transfer device in the interface apparatus, the substrate transfer device in the interface apparatus fulfills its functions by transferring substrates between the substrate storage and exposure unit. The substrate transfer device is operable smoothly without the necessity of circumventing the substrate transfer positions including the substrate storage.

Where the second interface apparatus is used between the high-speed exposure unit and the processing unit adapted to follow the high-speed exposure, the substrate transfer between the processing unit and exposure unit may follow the high-speed processes in the exposure unit and processing unit. This feature eliminates the inconvenience of lowering the throughput of the entire photolithographic process.

In the second interface apparatus, preferably, the substrate transport device includes at least a substrate support for supporting a substrate, a device for extending and retracting the substrate support in horizontal directions, and a vertical direction moving device for moving the substrate support; vertically the storage portions are arranged in multiple vertical stages; the substrate transfer device includes a substrate depositing/fetching device extendible and retractable horizontally for supporting substrates and depositing and fetching the substrates in/from the selected ones of the storage portions, and depositing and fetching substrates on/from a substrate input/output table for exchanging the substrates with the exposure unit, a rotary device for rotating the substrate depositing/fetching device about a vertical axis, a vertical direction moving device for moving the substrate depositing/fetching device vertically, and a uniaxial direction moving device for moving the substrate depositing/fetching device in horizontal uniaxial directions; and the substrate storage and the substrate transfer device are arranged in this order substantially linearly and parallel to the direction of movement of the uniaxial direction moving device, the substrate input/output table being arranged along the direction of movement of the uniaxial direction moving device.

The substrate transfer device in this apparatus is operable in the same way as the second substrate transfer device in the first interface apparatus when depositing and fetching substrates in/from the substrate storage, and when loading and unloading substrates on/from the substrate input/output table. When the substrate transport device in the processing unit deposits unexposed substrates in selected storage portions of the substrate storage, the height of the substrate support supporting each unexposed substrate is adjusted, and then the substrate support is extended and retracted. This operation is reversed when the substrate transport device in the processing unit fetches exposed substrates from selected storage portions of the substrate storage.

Preferably, the processing unit includes the plurality of processors for performing the varied treatments before and after exposure in the photolithographic process, and the substrate transport device for transporting substrates into and out of the processors, transporting the substrates within the processing unit, and depositing and fetching the substrates in/from selected ones of the storage portions of the substrate storage in the interface apparatus; the processing unit further including a first apparatus area and a second apparatus area for separately accommodating the plurality of processors; the first apparatus area, a substrate transport path for movement of the substrate transport device, and the second apparatus area being arranged in this order in plan view; the uniaxial direction moving device is movable parallel to a direction of arrangement of the first apparatus area, the substrate transport path and the second apparatus area; the substrate storage is disposed adjacent an end of the interface apparatus opposed to an end of the substrate transport path.

In an alternative construction, the processing unit includes a plurality of processors for performing the varied treatments before and after exposure in the photolithographic process, and a first substrate transport device and a second substrate transport device for transporting substrates into and out of the processors, transporting the substrates within the processing unit, and sharing a function for depositing and fetching the substrates in/from selected ones of the storage portions of the substrate storage in the interface apparatus; the processing unit further including a first apparatus area and a second apparatus area for separately accommodating the plurality of processors; the first apparatus area, a first substrate transport path for movement of the first substrate transport device, the second apparatus area, and a second substrate transport path for movement of the second substrate transport device being arranged in this order in plan view; the uniaxial direction moving device is movable parallel to the direction of arrangement of the first apparatus area, the first substrate transport path, the second apparatus area and the second substrate transport path; and the substrate storage is disposed adjacent an end of either the first or second substrate transport paths. This construction makes efficient use of a floor space in a cleanroom.

Preferably, the above interface apparatus further comprises a control device for controlling use of the storage portions as vertically divided into two groups, one of the groups (i.e. the first group of storage portions) being used for storing the substrates received from the substrate transport device in the processing unit, the other group (i.e. the second group of storage portions) being used for storing the substrates transferred from the exposure unit to the substrate transfer device; searching the first group of storage portions upward for a vacancy, and causing the substrate transport device to deposit each of the substrates in the lowermost vacant storage portion, when the substrate transport device deposits the substrates in the first group of storage portions; causing the substrate transfer device to fetch, from the substrate storage, a substrate deposited earliest of all substrates; searching the second group of storage portions upward for a vacancy, and causing the substrate transfer device to deposit each of the substrates in the lowermost vacant storage portion, when the substrate transfer device deposits the substrates in the second group of storage portions; and causing the substrate transport device to fetch, from the substrate storage, a substrate deposited earliest of all substrates deposited by the substrate transfer device. This construction contribute to a reduction in the substrate transfer time.

Alternatively, the interface apparatus may further comprise a control device for searching all of the storage portions upward for a vacancy, and causing the substrate transport device in the processing unit to deposit each of the substrates in the lowermost vacant storage portion, when the substrate transport device deposits the substrates in the substrate storage; causing the substrate transfer device to fetch, from the substrate storage, a substrate deposited earliest of all substrates deposited by the substrate transport device; searching the storage portions upward for a vacancy, and causing the substrate transfer device to deposit each of the substrates in the lowermost vacant storage portion, when the substrate transfer device deposits the substrates in the substrate storage; and causing the substrate transport device to fetch, from the substrate storage, a substrate deposited earliest of all substrates deposited by the substrate transfer device. This construction also contribute to a reduction in the substrate transfer time.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIG. 2 is a plan view in cross section of a substrate processing system having an interface unit constructed according to a first embodiment of this invention;

FIGS. 8, 9A–9E, 10A–10E and 11A–11J are explanatory diagrams showing examples of use control of the buffer section;

FIG. 13 is a plan view in cross section of a substrate processing system having an interface unit constructed according to the second embodiment of this invention;

DESCRIPTION OF THE PREFERRED EMBODIMENTS

Preferred embodiments of this invention will be described in detail hereinafter with reference to the drawings.

<First Embodiment>

Figure 1A:
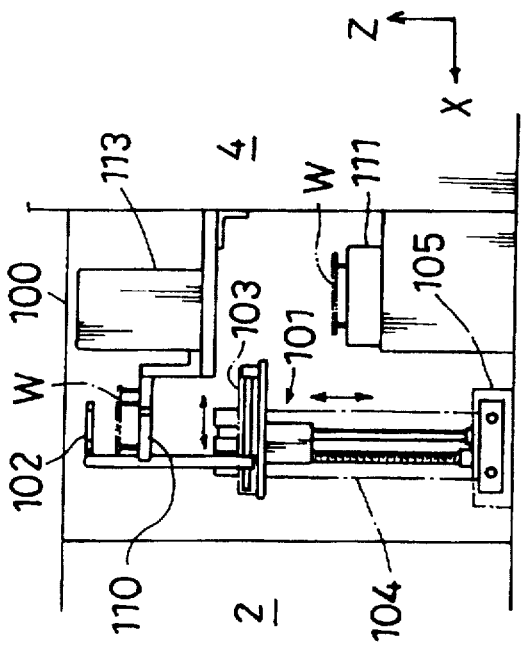
FIG. 1A is a plan view in cross section of a substrate processing system having a conventional interface unit.
Figure 1B:
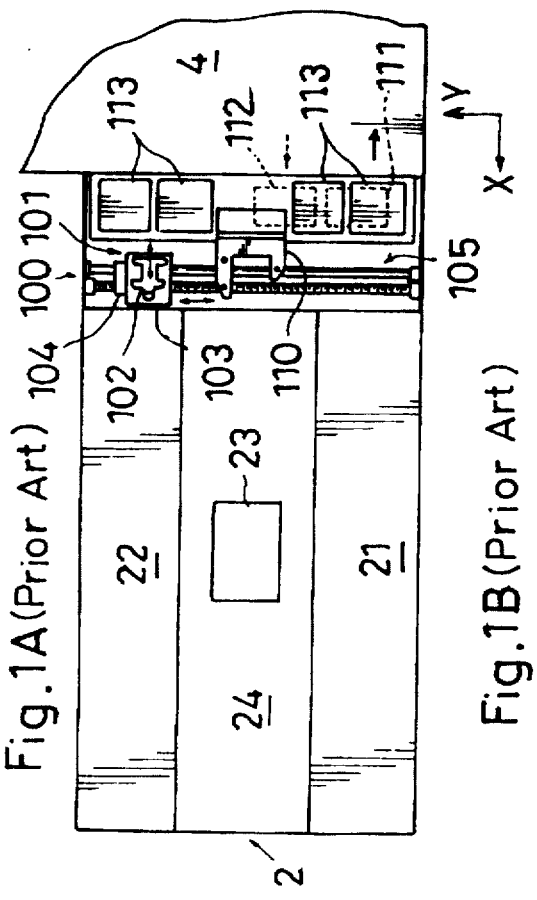
FIG. 1B is a front view of the conventional interface unit seen from a processing unit.
Figure 1C:
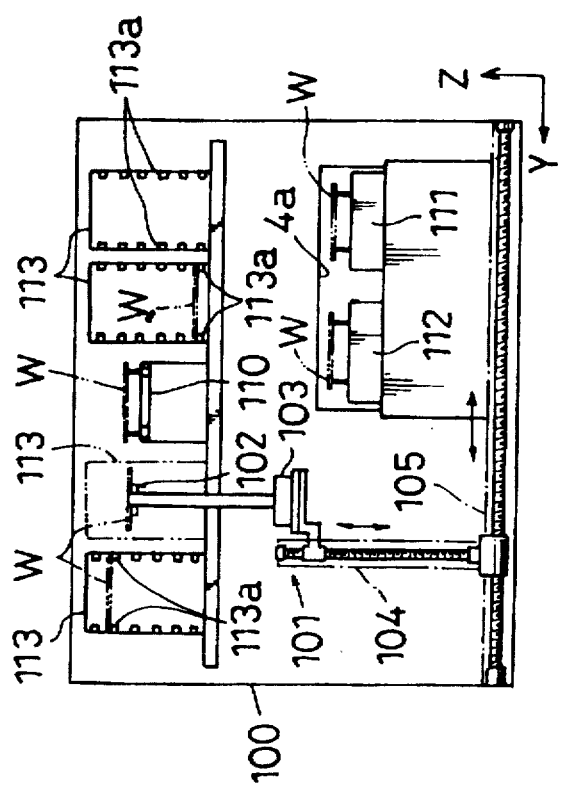
FIG. 1C is a side view of the conventional interface unit.
Figure 3:
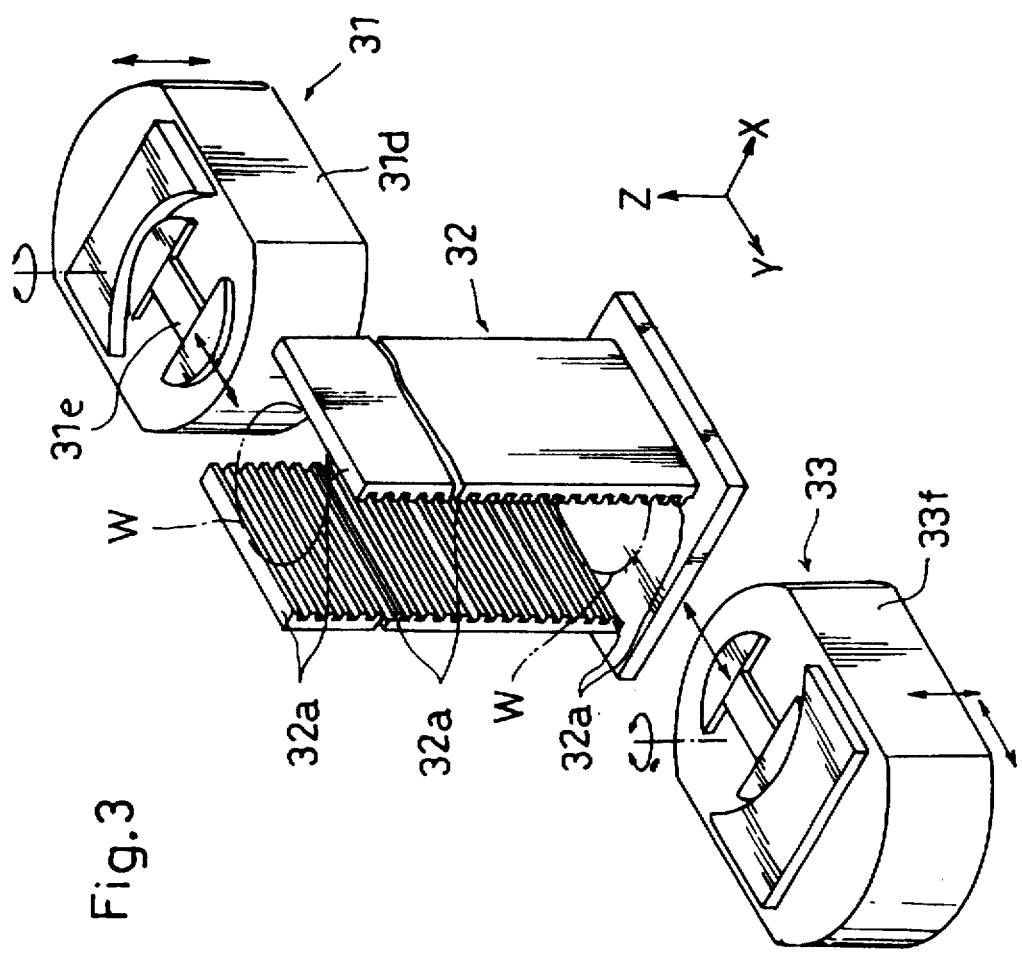
FIG. 3 is a perspective showing an outline of a buffer section and adjacent components of the interface unit in the first embodiment.
Figure 4:
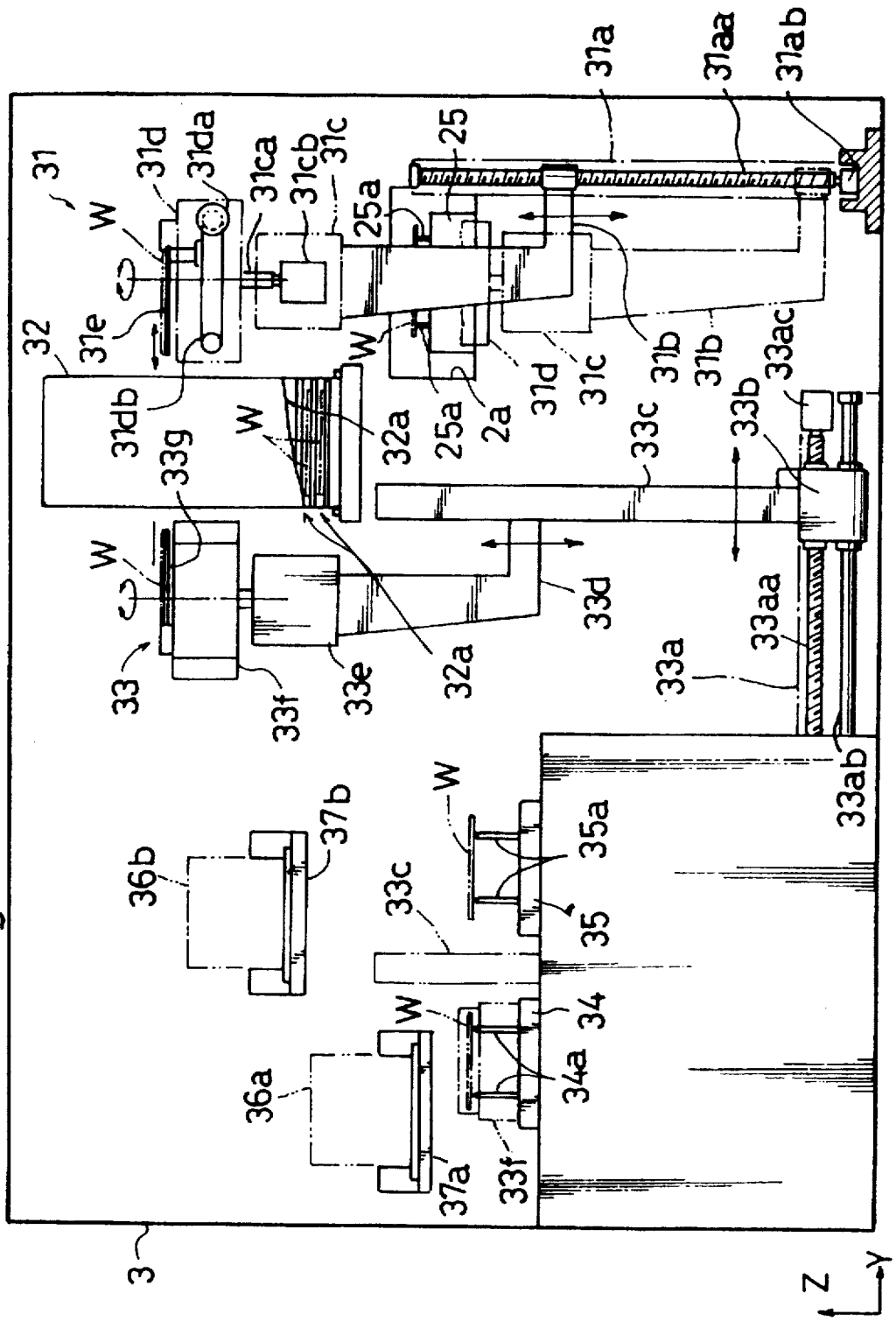
FIG. 4 is a front view of the interface unit in the first embodiment seen from an exposure unit.

Now referring particulary to FIGS. 2 through 4 which include XYZ rectangular coordinates to clearly indicate a positional relationship among these figures.

In the first embodiment of this invention (FIGS. 2–4), and other embodiments and various modifications thereof, this invention is applied to a substrate processing system for performing varied treatments of semiconductor wafers (substrates) in a photolithographic process. However, this invention is equally applicable to substrate processing systems for processing various other substrates including glass substrates for liquid crystal displays.

The first embodiment described hereinafter pertains to the substrate transfer method (claims 1 and 3–5) and the first interface apparatus (claims 6–9, 11 and 12) according to this invention.

As shown in FIG. 2, the substrate processing system employing the interface apparatus according to this invention includes a indexer 1, an processing unit (resist processing unit) 2, an interface unit 3 and an exposure unit 4. The indexer 1 is disposed at one end of the processing unit 2, and the exposure unit 4 is disposed adjacent the other end of the processing unit 2. The interface unit 3 is disposed between the processing unit 2 and exposure unit 4.

The indexer 1 includes an intake/output table 11 for exchanging carriers C each storing a plurality of wafers W with an auto guided vehicle (hereinafter "AGV"), and a substrate intake/output robot 12 for exchanging the wafers W with a substrate transport robot 23 in the processing unit 2.

The processing unit 2 includes a first apparatus area 21, a second apparatus area 22, and a substrate transport path 24 for passage of the substrate transport robot (the substrate transport device in the processing unit) 23. The first apparatus area 21 accommodates a plurality of spin coaters SC for performing resist coating, and a plurality of spin developers SD for performing development, which are arranged along the x-axis in FIG. 2. The second apparatus area 22 accommodates a bake unit BU for prebaking and postbaking wafers W, and a plurality of edge exposing units EEW. The bake unit BU includes a plurality of heaters for heating wafers W to a predetermined temperature, and a plurality of coolers for cooling the heated wafers W substantially to room temperature. The heaters and coolers are arranged two-dimensionally along the x-axis and in the vertical direction (along the z-axis perpendicular to the x- and y-axes or to the plane of FIG. 2). The second apparatus area 22 further accommodates a substrate transfer table 25 for exchanging wafers W with a first substrate transfer robot 31 in the interface unit 3 as described hereinafter. The substrate transfer table 25 has a plurality of substrate support pins 25a fixedly erected thereon for supporting a wafer W to be exchanged.

Figure 5A:
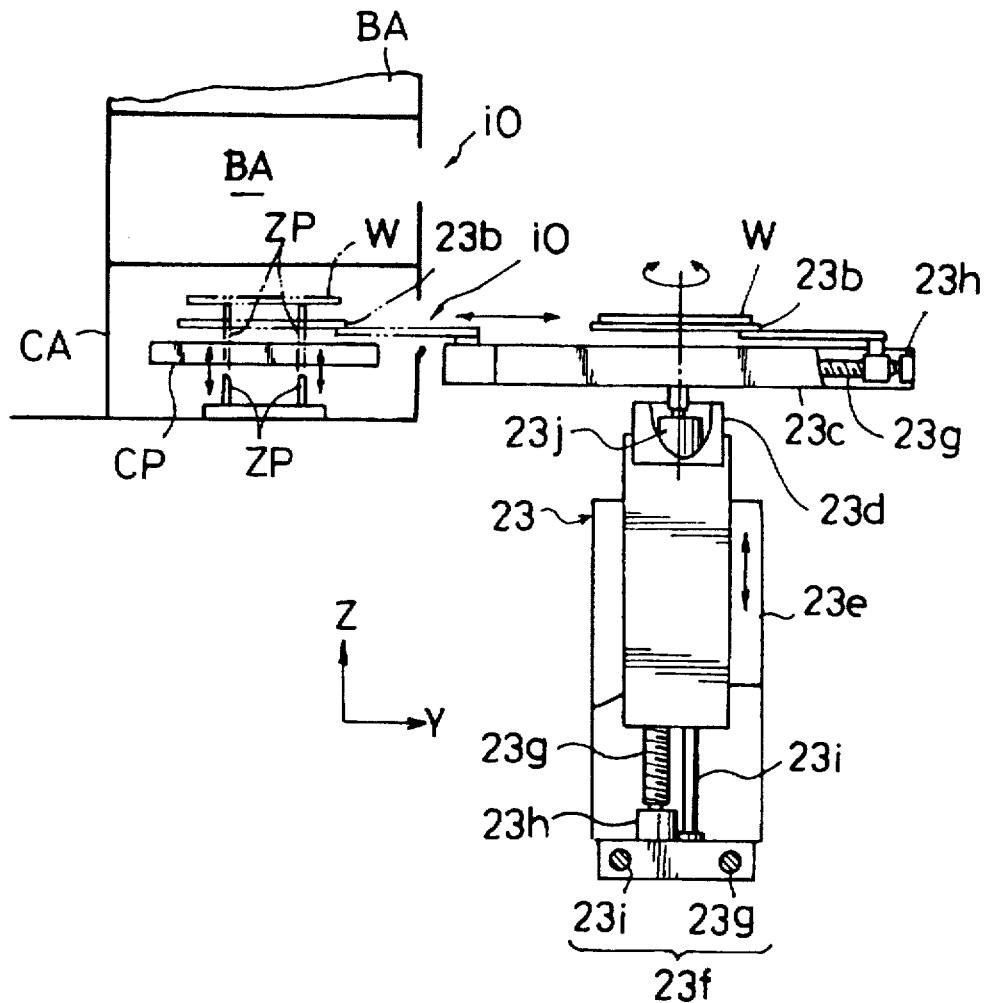
FIG. 5A is an explanatory diagram showing a sequence of access made to a cooler by a substrate transport robot in the processing unit.

The substrate transport path 24 of the substrate transport robot 23 is provided between the first and second apparatus areas 21 and 22. As shown in FIGS. 2 and 5A, the substrate transport robot 23 includes a horseshoe-shaped hand 23b having a plurality of projections 23a for supporting a wafer W, an extender 23c for horizontally extending and retracting the hand 23b (in the XY plane), a rotary driver 23d for rotating the hand 23b about the z-axis through the extender 23c, a z-direction mover 23e for moving the hand 23b along the z-axis through extender 23c and rotary driver 23d, and x-direction mover 23f for moving the hand 23b along the x-axis through the extender 23c, rotary driver 23d and z-direction mover 23e. Each of the extender 23c, z-direction mover 23e and x-direction mover 23f is in the form of a well-known uniaxial moving mechanism having a screw shaft 23g, a motor 23h and a guide rod 23i. The rotary driver 23d has a motor 23j.

With appropriate combinations of rotation about the z-axis, movement along the x-axis and z-axis, and extension and retraction of the hand 23b, the substrate transport robot 23 makes access to the processing devices (substrate processors) such as the spin coaters SC, spin developers SD, baking heaters, coolers and edge exposing units EEW, and transports wafers W to and from the substrate transfer table 25 and among the device in the processing unit 2.

The following action takes place, for example, when inserting a wafer W into a cooler CA shown in vertical section in FIG. 5A. First, the hand 23b is moved along the x-axis and z-axis to place the hand 23b opposite the cooler CA to be accessed. Then, the hand 23b is rotated about the z-axis to be ready for extension toward the cooler CA. Next, the hand 23b is inserted into the cooler CA through a substrate inlet/outlet "io" thereof, to place the wafer W supported by the hand 23b in the cooler CA. The cooler CA has vertically movable pins ZP arranged therein. The pins ZP are raised to receive the wafer W from the hand 23b. After delivering the wafer W, the hand 23b is retracted from the cooler CA. Next, the pins ZP are lowered to place the wafer W on a cool plate CP, thereby to start cooling the wafer W. The wafer W is withdrawn from the cooler CA in an operation reversed from the above. The substrate transport robot 23 operates in a similar manner when accessing the other processing devices. Reference BA in FIG. 5A denotes baking heaters.

Figure 5B:
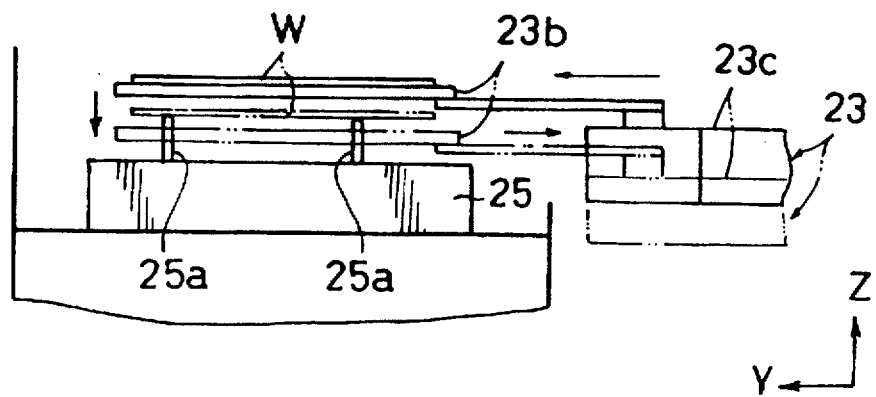
FIG. 5B is an explanatory diagram showing a sequence of placing a substrate on a substrate transfer table by the substrate transport robot in the processing unit.

When loading a wafer W on the substrate transfer table 25, as shown in FIG. 5B, the hand 23b is moved along the x-axis and z-axis and rotated about the z-axis as in the above operation, to be ready for extension to a position above the substrate transfer table 25. Next, the hand 23b is extended toward the substrate transfer table 25 to place the wafer W slightly above the substrate support pins 25a on the substrate transfer table 25. Then, the hand 23b is lowered along the z-axis to place the wafer on the substrate support pins 25a. The hand 23b is retracted after being slightly lowered further. When unloading the wafer W from the substrate transfer table 25, the operation is reversed for causing the hand 23b to lift, from below, the wafer W supported on the substrate transfer table 25.

The processing unit 2 includes treating solution supplying devices (not shown) for supplying treating solutions such as a resist solution, chemicals, a developing solution and a cleaning solution to the spin coaters SC and spin developers SD, and storages (not shown) for storing such treating solutions. The above apparatus and devices are integrated to form the processing unit 2.

The interface unit 3 corresponds to the interface apparatus of this invention and, as shown in FIGS. 2 through 4, includes the first substrate transfer robot 31, a buffer section 32, a second substrate transfer robot 33, a substrate input table 34 and a substrate output table 35. These components are integrated into a unit. In this embodiment, the interface unit 3 further includes two tables 37a and 37b for supporting a first and a second cassettes 36a and 36b, respectively.

The first substrate transfer robot 31 includes a z-direction driver 31a, a connector 31b, a rotary driver 31c, an extender 31d and a substrate support 31e.

The z-direction driver 31a is fixed to a bottom wall of the interface unit 3. The z-direction driver 31a has, mounted therein, a screw shaft 31aa rotatably extending along the z-axis, a guide rod (not shown) extending parallel to the screw shaft 31aa, and a motor 31ab for rotating the screw shaft 31aa in opposite directions.

The connector 31b has a proximal end thereof meshed with the screw shaft 31aa and slidably fitted on the guide rod in the z-direction driver 31a. With opposite rotations of the screw shaft 31aa, the connector 31b is movable along the z-axis (i.e. vertically). The connector 31b carries the rotary driver 31c fixed to a distal end thereof.

The rotary driver 31c has a rotary shaft 31ca extending upward along the z-axis, and houses a motor 31cb for rotating the rotary shaft 31ca in opposite directions.

The extender 31d is fixed to a distal end of the rotary shaft 31ca; and houses a timing belt 31db driven by a motor 31da. The substrate support 31e is connected at a proximal end thereof to a position of the timing belt 31db. By driving the timing belt 31db, the substrate support 31e is extendible and retractable relative to the extender 31d. Further, with opposite rotations of the rotary shaft 31ca of the rotary driver 31c, the extender 31d and substrate support 31e are rotatable about the (vertical) z-axis, whereby the substrate support 31e is extendible and retractable in selected directions in the XY plane (horizontal plane). With opposite rotations of the screw shaft 31aa of the z-direction driver 31a, a height along the (vertical) z-axis at which the substrate support 31e is extended and retracted is adjustable through the connector 31b, rotary driver 31c and extender 31d.

The extender 31d is opposed to the substrate transfer table 25 with respect to the x-axis direction, and to the buffer section 32 with respect to the y-axis direction, so that the substrate support 31e may be extended to and retracted from the substrate transfer table 25 in the processing unit 2 and the buffer section 32 which will be described hereinafter. Further, the z-direction driver 31a is offset, through the connector 31b, from a position under the extender 31d and rotary driver 31c, so that the extender 31d is rotatable about the z-axis even when lowered along the z-axis.

With the above construction, the first substrate transfer robot 31 loads a wafer W on and unloads a wafer W from the substrate transfer table 25 in the processing unit 2, and deposits a wafer W on and fetches a wafer W from a selected storage rack 32a of the buffer section 32 described hereinafter. Reference 2a in FIG. 4 denotes an opening for allowing passage of the first substrate transfer robot 31 supporting a wafer W when the wafer W is transferred between the processing unit 2 and interface unit 3.

A wafer W is loaded on or unloaded from the substrate transfer table 25 by setting the substrate support 31e to be extendible to and retractable from the substrate transfer table 25. The operation for loading or unloading the wafer W is carried out in the same way as the operation by the substrate transport robot 23 in the processing unit 2 for loading or unloading a wafer W on/from the substrate transfer table 25.

Figure 6:
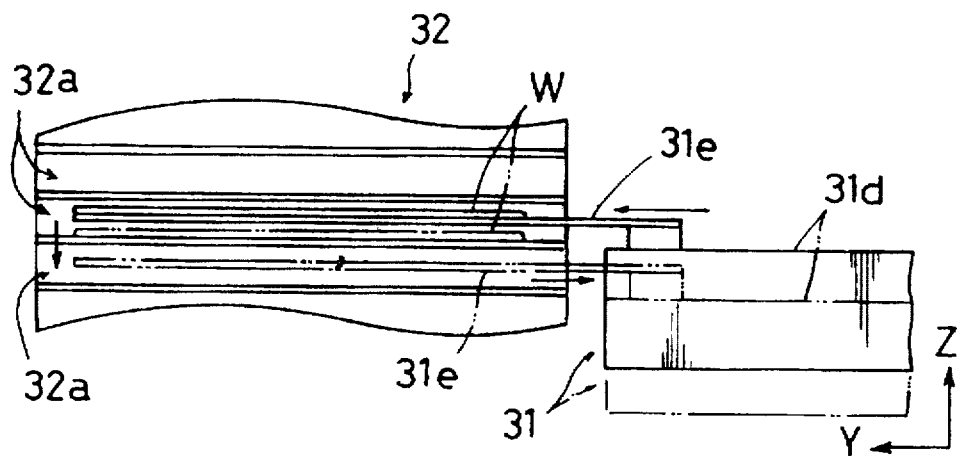
FIG. 6 is an explanatory diagram showing a sequence of depositing a substrate in the buffer section by a first substrate transfer robot in the interface unit.

FIG. 6 shows how a wafer W is deposited on a selected rack 32a in the buffer section 32. First, the rotary driver 31c directs the substrate support 31e to be extendible to and retractable from the buffer section 32. The z-direction driver 31a adjusts the height of the substrate support 31e to the level along the z-axis of the storage rack 32a on which the wafer W is to be deposited. Whichever of the rotation and the height adjustment may be carried out first. Next, the substrate support 31e is extended to place the wafer W supported thereon above the target rack 32a. Then, the z-direction driver 31a slightly lowers the substrate support 31e along the z-axis to deposit the wafer W on the rack 32a. The descent of the substrate support 31e is stopped in a position spaced from the lower surface of the wafer W resting on the storage rack 32a. The substrate support 31e is retracted from the storage rack 32a to complete the wafer depositing operation. When fetching a wafer W from a selected storage rack 32a in the buffer section 32, the operation is reversed for causing the substrate support 31e to lift the wafer W from below.

The first substrate transfer robot 31 corresponds to the first substrate transfer device of this invention. The extender 31d and substrate support 31e constitute the substrate depositing/fetching device of the first substrate transfer device of this invention. The substrate depositing/fetching device and the rotary driver 31c constitute the device for exchanging substrates with the processing unit, of the first substrate transfer device of this invention. The z-direction driver 31a corresponds to the vertical direction moving device of the first substrate transfer device of this invention.

The buffer section 32 is disposed between the first substrate transfer robot 31 and the second substrate transfer robot 33 described hereinafter, and is supported on an inner side wall of the interface unit 3. The buffer section 32 includes a plurality of (e.g. 50) storage racks 32a arranged in multiple stages along the z-axis (vertically). Each rack 32a is open toward the first substrate transfer robot 31 and second substrate transfer robot 33 to be accessible to the transfer robots 31 and 33 in substrate depositing and fetching operations. The buffer section 32 corresponds to the substrate storage of this invention. The storage racks 32a correspond to the storage portions of the substrate storage of this invention.

The second substrate transfer robot 33 includes a y-direction driver 33a, a first connector 33b, a z-direction driver 33c, a second connector 33d, a rotary driver 33e, an extender 33f and a substrate support 33g.

The y-direction driver 33a is fixed to an inner side wall of the interface unit 3. The y-direction driver 33a has, mounted therein, a screw shaft 33aa rotatably extending along the y-axis, a guide rod 33ab extending parallel to the screw shaft 33aa, and a motor 33ac for rotating the screw shaft 33aa in opposite directions. The y-direction driver 33a is arranged to move the extender 33f and substrate support 33e of the second substrate transfer robot 33 between a position opposed to the buffer section 32 with respect to the y-axis direction and a position opposed to the substrate input table 34 with respect to the x-axis direction.

The first connector 33b has a proximal end thereof meshed with the screw shaft 33aa and slidably fitted on the guide rod 33ab in the y-direction driver 33a. With opposite rotations of the screw shaft 33aa, the first connector 33b is movable along the y-axis (i.e. horizontally). The first connector 33b carries the z-direction driver 33c fixed to a distal end thereof.

The z-direction driver 33c, second connector 33d, rotary driver 33e, extender 33f and substrate support 33g of the second substrate transfer robot 33 are similar in construction and operation to the z-direction driver 31a, connector 31b, rotary driver 31c, extender 31d and substrate support 31e of the first substrate transfer robot 31. Specifically, the substrate support 33g is extendible and retractable relative to the extender 33f. The rotary driver 33e rotates the extender 33f and substrate support 33g about the (vertical) z-axis, whereby the substrate support 33g is extendible and retractable in selected directions in the XY plane (horizontal plane). The z-direction driver 33c is operable to adjust height along the (vertical) z-axis at which the substrate support 31e is extended and retracted through the second connector 33d, rotary driver 33e and extender 33f. Further, in the second substrate transfer robot 33, the y-direction driver 33a is operable to shift the extender 33f and substrate support 33g along the y-axis through the first connector 33b, z-direction driver 33c, second connector 33d and rotary driver 33e.

With the above construction, the second substrate transfer robot 33 deposits a wafer W on and fetches a wafer W from a selected storage rack 32a of the buffer section 32, loads a wafer W on the substrate input table 34, unloads a wafer W from the substrate output table 35, and deposits a wafer W in and fetches a wafer W from the cassette 36a or 36b described hereinafter.

For depositing a wafer W on or fetching a wafer W from a selected storage rack 32a in the buffer section 32, the substrate support 33g is directed to be extendible to and retractable from the buffer section 32, and the height of the substrate support 33g is adjusted to the level of the storage rack 32a to be accessed for depositing or fetching the wafer W. This wafer depositing or fetching operation is carried out in the same way as the first substrate transfer robot 31 deposits or fetches a wafer W on/from a selected rack 32a in the buffer section 32. For loading a wafer W on the substrate input table 34 or unloading a wafer W from the substrate output table 35, the substrate support 33g is directed to be extendible to and retractable from the substrate input table 34 or substrate output table 35. This wafer loading or unloading operation also is carried out in the same way as the substrate transport robot 23 loads or unloads a wafer W on/from the substrate transfer table 25 in the processing unit 2.

The second substrate transfer robot 33 corresponds to the second substrate transfer device of this invention. The extender 33f and substrate support 33g constitute the substrate depositing/fetching device of the second substrate transfer device of this invention. The rotary driver 33e corresponds to the rotary device of the second substrate transfer device of this invention. The z-direction driver 33c corresponds to the vertical direction moving device of the second substrate transfer device of this invention. The y-direction driver 33a corresponds to the uniaxial direction moving device of the second substrate transfer device of this invention. In this embodiment, the uniaxial direction moving device is movable along the y-axis (parallel to the direction of arrangement of the first apparatus area 21, substrate transport path 24 and second apparatus area 22 in the processing unit 2).

In this embodiment, the first substrate transfer robot 31, buffer section 32 and second substrate transfer robot 33 are linearly arranged in this order, parallel to the direction of movement (along the y-axis) of the y-direction driver 33a (the uniaxial direction moving device) of the second substrate transfer robot 33.

As does the substrate transfer table 25 in the processing unit 2, each of the substrate input and output tables 34, 35 has a plurality of substrate support pins 34a or 35a fixedly erected thereon for supporting a wafer W to be exchanged with the exposure unit 4 (i.e. with a substrate transport robot, not shown, in the exposure unit 4). The substrate input and substrate output tables 34, 35 correspond to the substrate input/output tables of this invention. In this embodiment, the substrate output table 35 and substrate input table 34 are arranged in this order from the buffer section 32, in the direction of movement (along the y-axis) of the y-direction driver 33a (the uniaxial direction moving device) of the second substrate transfer robot 33. Although not shown, an opening is provided between the exposure unit 4 and interface unit 3 for allowing passage of the substrate transport robot supporting a wafer W in the exposure unit 4 when the wafer W is transferred between the exposure unit 4 and interface unit 3.

The table 37a for setting the first cassette 36a is fixed to an inner side wall of the interface unit 3 to be opposed to the buffer section 32, and adjacent one end (remote from the buffer section 32) of the y-direction driver 33a of the second substrate transfer robot 33.

The table 37b for setting the second cassette 36b is fixed to the inner side wall of the interface unit 3, in a position closer along the y-axis than the table 37a to the buffer section 32 and higher along the z-axis than the table 37a. The table 37b is disposed at a height along the z-axis clear of an upper end of the z-direction driver 33c of the second substrate transfer robot 33 when the second substrate transfer robot 33 lies adjacent the substrate input table 34 (or the table 37a) as shown in a phantom line in FIG. 4.

Each of the first and second cassettes 36a and 36b has a plurality of storage racks (not shown) for storing wafers W in horizontal posture. These cassettes 36a and 36b are used, for example, for storing pilot wafers to be subjected to exposure testing, or when the interface unit 3 is used as the indexer 1.

The clause "when the interface unit 3 is used as the indexer 1" refers to a case in which only exposure is carried out in the exposure unit 4, skipping the indexer 1 and processing unit 2 in this embodiment. The cassette(s) 36a and/or 36b storing wafers (unexposed wafers) W which have been processed by other apparatus up to a stage immediately preceding the exposure stage is/are set to the table(s) 37a and/or 37b. The second substrate transfer robot 33 in the interface unit 3 successively transfers the unexposed wafers W from the cassette(s) 36a and/or 36b to the exposure unit 4 for exposure. The exposed wafers W are stored in cassette(s) 36a and/or 36b again, and transferred from the interface unit 3 to the other apparatus to receive post-exposure treatment.

The cassette(s) 36a and/or 36b is/are manually set to and removed from the table(s) 37a and/or 37b through a door 38 (FIG. 2) provided in one side wall of the interface unit 3.

The exposure unit 4 includes an exposing machine (not shown) such as a reduction projecting/exposing machine (or stepper), an alignment mechanism (not shown) for positioning wafers W to be printed with an exposure pattern by the exposing machine, and the substrate transport robot (not shown) for transporting the wafers W within the exposure unit 4. All these devices are integrated into a unit.

The substrate transport robot in the exposure unit 4 takes into the exposure unit 4 unexposed wafers W placed on the substrate input table 34 in the interface unit 3, and outputs exposed wafers W from the exposure unit 4 onto the substrate output table 35 in the interface unit 3. The operations of the substrate transport robot in the exposure unit 4 for taking the wafers W from the substrate input table 34 and placing the wafers W on the substrate output table 35 are carried out in the same way as the substrate transport robot 23 loads and unloads wafers W on/from the substrate transfer table 25 in the processing unit 2 as described with reference to FIG. 5B.

The substrate input table 34 and substrate output table 35 may be included in the exposure unit 4. In this case, the second substrate transfer robot 33 advances the substrate support 33g into the exposure unit 4 to load a wafer W on the substrate input table 34 and unload a wafer W from the substrate output table 35.

Figure 7:
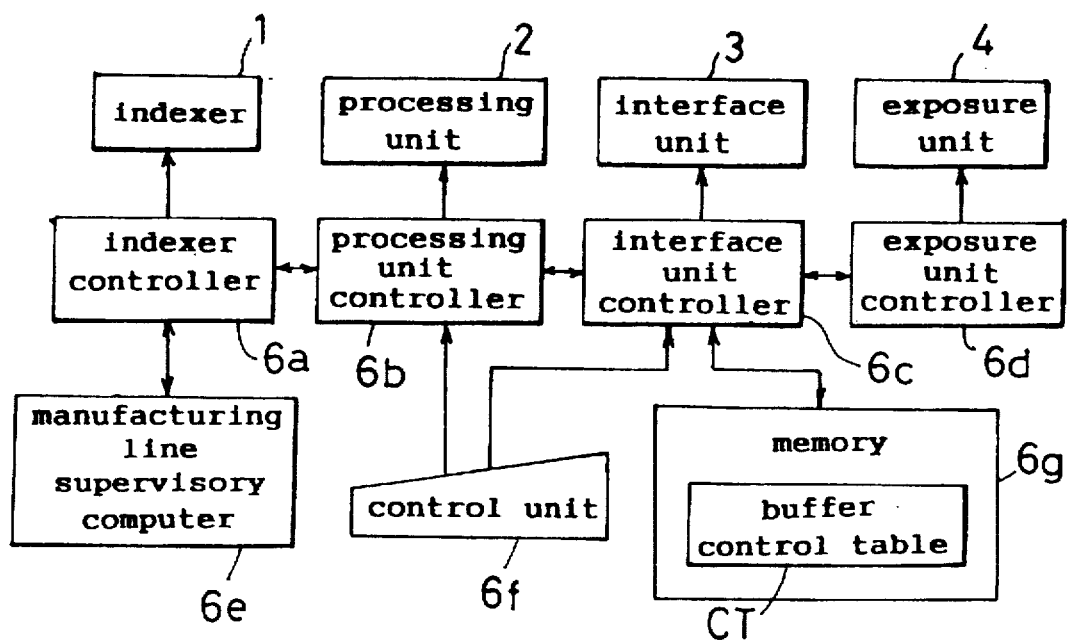
FIG. 7 is a block diagram showing an outline of a control system in the first embodiment (and a second embodiment)

Next, a control system for controlling the above substrate processing system will be described with reference to FIG. 7.

The control system includes an indexer controller 6a, a processing unit controller 6b, an interface unit controller 6c and an exposure unit controller 6d.

The indexer controller 6a controls the substrate intake/output robot 12 and the like in the indexer 1 to perform a wafer intake operation for fetching wafers W to be processed in the substrate processing system from the carriers C and transferring these wafers W to the substrate transport robot 23 in the processing unit 2, and a wafer output operation for receiving processed wafers W (after the series of treatments in the substrate processing system) and storing the processed wafers W in the carriers C. The indexer controller 6a is in communication with a manufacturing line supervisory computer 6e to exchange information on introduction of the carriers C by the AGV 5 and on timing of wafer intake. Further, the indexer controller 6a is in communication with the processing unit controller 6b to exchange information on timing of wafer exchange with the substrate transport robot 23 in the processing unit 2.

The processing unit controller 6b controls the various devices in the processing unit 2 (i.e. the spin coaters SC, spin developers SD, baking heaters BA, coolers CA, edge exposing units EEW, substrate transport robot 23 and processing solution feeders) to perform the series of treatments in the processing unit 2 according to a sequence set by a control unit 6f, and to load and unload wafers W on/from the substrate transfer table 25. The processing unit controller 6b also is in communication with the interface unit controller 6c to exchange information on timing of loading and unloading wafers W on/from the substrate transfer table 25.

The interface unit controller 6c controls the first and second substrate transfer robots 31 and 33 in the interface unit 3. More particularly, the interface unit controller 6c controls the motor 31ab of Z-direction driver 31a, the motor 31cd of rotary driver 31c and the motor 31da of extender 31d of the first substrate transfer robot 31, and the motor 33ac of Y-direction driver 33a, the motor of Z-direction driver 33c, the motor of rotary driver 33e and the motor of extender 33f of the second substrate transfer robot 33. Under control of the interface unit controller 6c, normal processing is performed to transfer unexposed wafers W from the processing unit 2 (substrate transfer table 25) to the exposure unit 4 (substrate input table 34), and exposed wafers W from the exposure unit 4 (substrate output table 35) to the processing unit 2 (substrate transfer table 25). In a special processing, unexposed wafers W are transferred from the cassettes 36a and 36b to the exposure unit 4 (substrate input table 34), and exposed wafers W from the exposure unit 4 (substrate output table 35) to the cassettes 36a and 36b.

The interface unit controller 6c also is in communication with the exposure unit controller 6d to exchange information on timing of loading and unloading wafers W on/from the substrate input table 34 and substrate output table 35. A selection between normal processing and special processing is instructed by the control unit 6f. The interface unit controller 6c is connected to a memory 6g storing a buffer control CT that is used for controlling use of the storage racks 32a in the buffer section 32 as described hereinafter.

The exposure unit controller 6d controls the various devices in the exposure unit 4 (i.e. the exposing machine, alignment mechanism and substrate transport robot). Under control of this controller 6d, a series of exposing steps are performed by taking in an unexposed wafer W from the substrate input table 34 in the interface unit 3, operating the alignment mechanism to position the wafer W, operating the exposing machine to print an exposure pattern, and discharging the exposed wafer W onto the substrate output table 35 in the interface unit 3.

Each of the indexer controller 6a, processing unit controller 6b, interface unit controller 6c and exposure unit controller 6d includes a microcomputer. Each of these controllers 6a, 6b, 6c and 6d performs the controls based on a program prepared and stored in advance.

Next, operations of the substrate processing system having the above construction will be described on the assumption that the interface unit 3 performs the normal processing.

Examples of steps taken are as set out hereunder:

[01] setting a carrier C to the intake/output table 11;

[02] transferring unexposed wafers W from the carrier C to the substrate transport robot 23 in the processing unit 2;

[03] baking in the baking heaters BA;

[04] cooling in the coolers CA;

[05] resist application by the spin coaters SC:

[06] baking in the baking heaters BA;

[07] cooling in the coolers CA;

[08] edge exposure by the edge exposing units EEW

[09] baking in the baking heaters BA;

[10] cooling in the coolers CA;

[11] transferring unexposed wafers W from the processing unit 2 to the exposure unit 4;

[12] exposure in the exposure unit 4;

[13] transferring exposed wafers W from the exposure unit 4 to the processing unit 2;

[14] development by the spin developers SD:

[15] baking in the baking heaters BA;

[16] cooling in the coolers CA;

[17] storing exposed wafers W in the carrier C; and

[18] removing the carrier C from the intake/output table 11.

Steps [01] and [18] above are executed by the AGV 5. Steps [02] and [17] are executed by the indexer 1. Steps [03] through [10] and [14] through [16] are executed by the processing unit 2. Steps [11] and [13] are executed by the interface unit 3. Step [12] is executed by the exposure unit 4.

First, the AGV 5 transports, from the preceding stage, a carrier C storing a plurality of wafers W to be processed by the substrate processing system. The AGV 5 places the carrier C in a predetermined position on the intake/output table 11 of the indexer 1 ([01]).

Next, the substrate intake/output robot 12 of the indexer 1 withdraws the unprocessed wafers W, one at a time, from the carrier C placed on the intake/output table 11, and successively passes the wafers W to the substrate transport robot 23 in the processing unit 2 ([02]).

The wafers W receive the pre-exposure treatments in the processing unit 2 ([03]–[10]). Specifically, the substrate transport robot 23 in the processing unit 2 feeds each wafer W into one of the baking heaters BA in which the wafer W is heated to a predetermined temperature (baked). After the baking, the substrate transport robot 23 withdraws the wafer W from the baking heater BA ([03]).

The processing unit 2 successively receives unprocessed wafers W, and also successively receives exposed wafers W. Consequently, the baking processes at the different stages ([03], [06], [09] and [15]) may take place concurrently. The processing unit 2 in this embodiment includes a plurality of baking heaters BA. Thus, the baking processes may be performed for a plurality of wafers W at the different stages in parallel, to realize an improved throughput of the processing unit 2. In this way, the processing unit 2 is devised to follow a high-speed exposure processing (reduced average exposing time) in the exposure unit 4. The baking heaters BA are used in a way to maximize throughput, which is determined empirically or theoretically in advance. The processing unit controller 6b operates the baking heaters BA according to a sequence determined as above.

Further, the processing unit 2 in this embodiment includes a plurality of coolers CA, a plurality of spin coaters SC, a plurality of edge exposing units EEW and a plurality of spin developers (see FIG. 2, for example), to contribute to the improved throughput of the processing unit 2. These devices CA, SC, EEW and SD, as well as the baking heaters BA, are used in a way to maximize throughput. Further, the substrate transport robot 23 is controlled to transport wafers W among the devices BA, CA, SC, EEW and SD in a way to maximize the throughput of the processing unit 2.

The substrate transport robot 23 transports the baked wafer W into one of the coolers CA in which the hot wafer W is cooled to room temperature or thereabout ([04]). The cooled wafer W is transported from the cooler CA to one of the spin coaters SC in which the wafer W is coated with resist ([05]). The substrate transport robot 23 transports the wafer W coated with resist to one of the baking heaters BA and then to one of the coolers CA for baking and cooling ([06] and [07]). Next, the wafer W is transported to one of the edge exposing units EEW for edge exposure ([08]). After the edge exposure the wafer W is transported again to one of the baking heaters BA and then to one of the coolers CA for baking and cooling ([09] and [10]). The wafer W cooled at stage [10] (which is an unexposed wafer W in this sequence) is loaded on the substrate transfer table 25 by the substrate transport robot 23. The timing for loading the unexposed wafer W on the substrate transfer table 25 by the substrate transport robot 23 is determined based on the average exposing time in the exposure unit 4 described hereinafter. Unexposed wafers W are loaded on the substrate transfer table 25 at predetermined intervals of time (e.g. 40 to 30 sec.).

The first substrate transfer robot 31 in the interface unit 3 picks up each unexposed wafer W loaded on the substrate transfer table 25, and deposits that wafer W on a selected storage rack 32a in the buffer section 32. The second substrate transfer robot 33 fetches each unexposed wafer W from the storage rack 32a, and loads it on the substrate input table 34 ([11]). When, for example, a delay occurs with the exposure process in the exposure unit 4, a preceding unexposed wafer remains on the substrate input table 34 instead of being taken into the exposure unit 4. Then, an unexposed wafer W newly loaded on the substrate transfer table 25 cannot be passed to the substrate input table 34. In this embodiment, however, when a new unexposed wafer W is loaded on the substrate transfer table 25, the first substrate transfer robot 31, regardless of the state of the substrate input table 34, deposits the wafer W on a selected storage rack 32a in the buffer section 32. When the substrate input table 34 becomes vacant, the second substrate transfer robot 33 fetches the wafer W from the storage rack 32a in the buffer section 32, and loads it on the substrate input table 34. Thus, regardless of a delay in the exposure process in the exposure unit 4. Unexposed wafers W are always collected from the substrate transfer table 25 at predetermined intervals of time (in timed relationship to the loading of the unexposed wafers W on the substrate transfer table 25 by the substrate transport robot 23 in the processing unit 2). No delay is caused in the transfer of unexposed wafers W from the processing unit 2 to the interface unit 3, and therefore no delay is caused in the processes in the processing unit 2. Details of use and control of the buffer section 32 will be described hereinafter.

The substrate transport robot in the exposure unit 4 takes each unexposed wafer W placed on the substrate input table 34 into the exposure unit 4. The wafer W is passed to the alignment mechanism to undergo a positioning process. The wafer W in a positioned state is passed on to the exposing machine for printing a predetermined exposure pattern thereon. The substrate transport robot in the exposure unit 4 transports the exposed wafer W out of the exposure unit 4, and loads it on the substrate output table 35 in the interface unit 3 ([12]).

The second substrate transfer robot 33 in the interface unit 3 collects each exposed wafer W from the substrate output table 35, and deposits it on a selected storage rack 32a in the buffer section 32. The first substrate transfer robot 31 fetches the exposed wafer W from the storage rack 32a, and loads it on the substrate transfer table 25 ([13]). For example, a variation in the exposing time in the exposure unit 4 may result in a lag between output of exposed wafer W from the exposure unit 4 and intake of exposed wafer W to the processing unit 2. In a conventional system, when an exposed wafer W is loaded on the substrate output table 35, a preceding exposed wafer W or even an unexposed wafer W may remain on the substrate transfer table 25. In such a case, the exposed wafer W cannot be loaded on the substrate transfer table 25. In this embodiment, when an exposed wafer W is loaded on the substrate output table 35, the second substrate transfer robot 33, regardless of the state of the substrate transfer table 25, deposits the wafer W on a selected storage rack 32a in the buffer section 32. In response to unloading of an exposed wafer W from the substrate transfer table 25 by the substrate transport robot 23 in the processing unit 2, the first substrate transfer robot 33 fetches an exposed wafer W from a storage rack 32a in the buffer section 32, and loads it on the substrate transfer table 25. Thus, regardless of variations in the exposing time in the exposure unit 4, an exposed wafer W loaded on the substrate output table 35 may be collected promptly without being left thereon for a prolonged time. The substrate transport robot in exposure unit 4 can thereby load an exposed wafer W on the substrate output table 35 without delay. There is no possibility of a holdup in the output of exposed wafers W from the exposure unit 4, which would cause a delay in acceptance of succeeding unexposed wafers W by the exposure unit 4. Details of use and control of the buffer section 32 for this instance will be described hereinafter.

The substrate transport robot 23 in the processing unit 2 transports each exposed wafer W from the substrate transfer table 25 to one of the spin developers SD for a developing process. The exposure pattern printed by the exposing machine in the exposure unit 4 is developed, with edges of the wafer W developed and removed by one of the edge exposing units EEW ([14]). The substrate transport robot 23 collects exposed wafers W from the substrate transfer table 25 at intervals of time determined on the basis of the average exposing time in the exposure unit 4 as described hereinafter. That is, the exposed wafers W are unloaded from the substrate transfer table 25 at predetermined intervals of time (e.g. 40 to 30 sec.).

The substrate transport robot 23 transports each developed wafer W to one of the baking heaters BA and then to one of the coolers CA to perform a baking process and a cooling process successively ([15] and [16]). The substrate transport robot 23 successively transfers cooled wafers (processed wafers in this sequence) W to the substrate intake/output robot 12 in the indexer 1. The substrate intake/output robot 12 successively deposits the processed wafers W in an empty carrier C standing by in a predetermined position on the intake/output table 11 ([17]). The carrier C storing a predetermined number of processed wafers W is transported by the AGV 5 from the intake/output table 11 to a subsequent stage ([18]).

An example of control and use of the buffer section 32 in the interface unit 3 will be described next with reference to FIGS. 8, 9, 10A through 10E and 11A through 11J.

In this example, as shown in FIG. 8, the storage racks 32a in the buffer section 32 are numbered 1 to n (n being 50, for example) successively from bottom to top. The storage racks 32a of Rack Nos. 1 through n/2 (e.g. 1 through 25) (the first group of storage portions) are used for storing unexposed wafers W (wafers W transferred from the substrate transfer table 25 to the substrate input table 34). The storage racks 32a of Rack Nos. n/2+1 through n (e.g. 26 through 50) (the second group of storage portions) are used for storing exposed wafers W (wafers W transferred from the substrate output table 35 to the substrate transfer table 25). In storing the wafers W, the storage racks 32a are used successively upward from the lowermost one (from rack No. 1 for the unexposed wafers W, and from rack No. 26 for the exposed wafers W).

As an alternative arrangement, the storage racks 32a of Rack Nos. 1 through n/2 may be used as the first group of storage portions for storing exposed wafers W, and the storage racks 32a of Rack Nos. n/2+1 through n as the second group of storage portions for storing unexposed wafers W.

As shown in FIG. 9A, the buffer control table CT includes areas MA1 assigned to the respective rack numbers for recording storage states of the corresponding storage racks 32a. The wafers W introduced into this substrate processing apparatus to undergo the series of treatments are affixed with sequence numbers (wafer numbers) for control purposes. When a wafer W is deposited on one of the storage racks 32a, the wafer number of this wafer W is written in the area MA1 of the buffer control table CT corresponding to the recipient storage rack 32a.

Figure 10A:
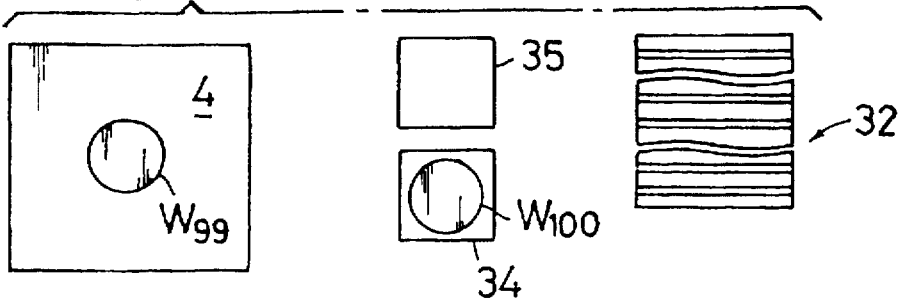

Assume that, as shown in FIG. 10A, for example, wafer W99 of wafer No. 99 is being exposed in the exposure unit 4, wafer W100 of wafer No. 100 is present on the substrate input table 34, and no wafer is stored in the buffer section 32. In this case, as shown in FIG. 9A, the buffer control table CT has nothing recorded in the areas MA1 corresponding to the rack numbers.

Figure 10B:
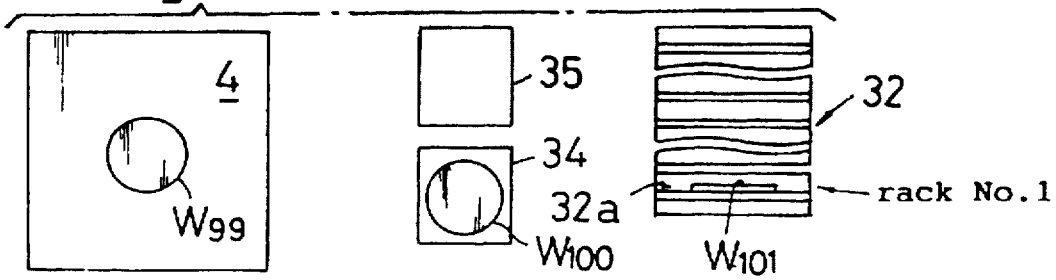

Assume that next unexposed wafer W101 (wafer No. 101) is loaded on the substrate transfer table 25 while the exposure of wafer W99 is in progress. At this time, the interface unit controller 6c refers to the buffer control table CT for the use state of the storage racks 32a (rack Nos. 1–25) assigned to unexposed wafers W, and determines a lowermost unoccupied rack number. Then, the interface unit controller 6c instructs the first substrate transfer robot 31 to transport the unexposed wafer W101 from the substrate transfer table 25 to the storage rack 32a of the rack number determined (which is rack No. 1 in this instance) in the buffer section 32. Consequently, as shown in FIG. 10B, unexposed wafer W101 of wafer No. 101 is deposited on the storage rack 32a of rack No. 1 in the buffer section 32. As shown in FIG. 9B, wafer No. 101 of wafer W101 is written in the area MA1 of the buffer control table CT corresponding to rack No. 1.

If the exposure process proceeds smoothly in the exposure unit 4, exposure of wafer W99 of wafer No. 99 is completed before next unexposed wafer W102 (wafer No. 102) is loaded on the substrate transfer table 25. The substrate transport robot in the exposure unit 4 loads the exposed wafer W99 on the substrate output table 35, and introduces the next unexposed wafer W100 of wafer No. 100 from the substrate input table 34 into the exposure unit 4. Then, the exposure process is started for the new wafer W100.

Figure 10C:
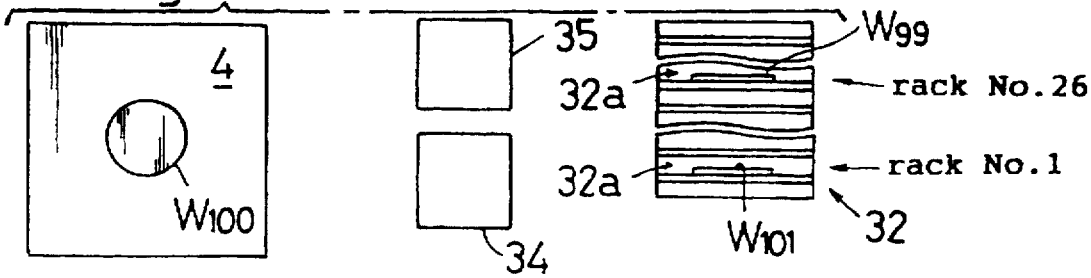

When exposed wafer W99 of wafer No. 99 is loaded on the substrate output table 35, the interface unit controller 6c refers to the buffer control table CT for the use state of the storage racks 32a (rack Nos. 26–50) assigned to exposed wafers W, and determines a lowermost unoccupied rack number. Then, the interface unit controller 6c instructs the second substrate transfer robot 33 to transport the exposed wafer W99 from the substrate output table 35 to the storage rack 32a of the rack number determined (which is rack No. 26 in this instance) in the buffer section 32. Consequently, as shown in FIG. 10C, exposed wafer W99 of wafer No. 99 is deposited on the storage rack 32a of rack No. 26 in the buffer section 32. As shown in FIG. 9C, wafer No. 99 of wafer W99 is written in the area MA1 of the buffer control table CT corresponding to rack No. 26.

Figure 10D:
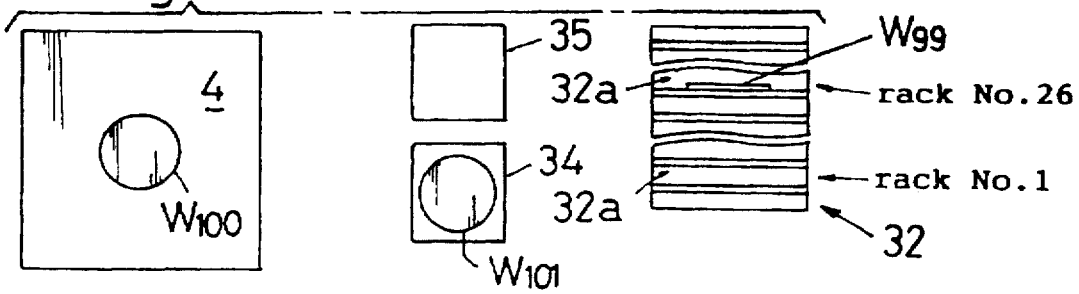

The substrate input table 34 becomes vacant after the substrate transport robot in the exposure unit 4 transports wafer W100 (wafer No. 100) from the substrate input table 34 into the exposure unit 4. The interface unit controller 6c refers to the buffer control table CT for the use state of the storage racks 32a of rack Nos. 1–25 assigned to unexposed wafers W, and determines a storage rack 32a holding unexposed wafer W of the smallest wafer number (i.e. the storage rack 32a of rack No. 1 in this instance). Then, the interface unit controller 6c instructs the second substrate transfer robot 33 to transport unexposed wafer W101 to the substrate input table 34. Consequently, as shown in FIG. 10D, the storage rack 32a of rack No. 1 in the buffer section 32 becomes vacant, and unexposed wafer W101 of wafer No. 101 is loaded on the substrate input table 34. As shown in FIG. 9D, wafer No. 101 is eliminated from area MA1 in the buffer control table CT corresponding to rack No. 1.

The operation of the substrate transport robot in the exposure unit 4 for introducing unexposed wafer W100 of wafer No. 100 into the exposure unit 4 is performed in parallel with the operation of the second substrate transfer robot 33 for transferring exposed wafer W99 of wafer No. 99 from the substrate output table 35 to the storage rack 32a of rack No. 26 in the buffer section 32. Thus, the substrate input table 34 is vacant when exposed wafer W99 of wafer No. 99 is deposited on the storage rack 32a of rack No. 26 in the buffer section 32. Consequently, the second substrate transfer robot 33 can immediately undertake the operation for transferring unexposed wafer W101 of wafer No. 101 to the substrate input table 34. At this time, the second substrate transfer robot 33 is situated adjacent the buffer section 32. Thus, the second substrate transfer robot 33 can undertake the operation for fetching unexposed wafer W101 of wafer No. 101 from the storage rack 32a of rack No. 1, by lowering the substrate support 33g and the like along the z-axis after depositing exposed wafer W99 of wafer No. 99 on the storage rack 32a of rack No. 26. In this way, the second substrate transfer robot 33 can execute a series of steps quickly, without taking useless action, from an operation for storing exposed wafer W on a predetermined storage rack 32a to an operation for fetching unexposed wafer W from a predetermined storage rack 32a.

Figure 10E:
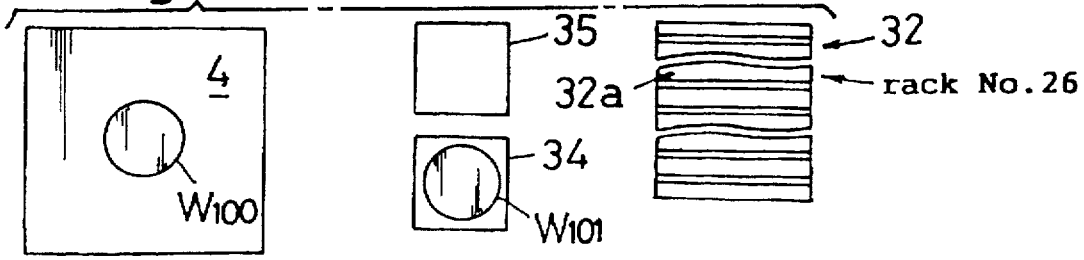

The interface unit controller 6c instructs the first substrate transfer robot 31 to transfer an exposed wafer W from the buffer section 32 to the substrate transfer table 25 before the substrate transport robot 23 in the processing unit 2 unloads the exposed wafer W from the substrate transfer table 25 (to take the exposed wafer W into the processing unit 2). In this case also, the interface unit controller 6c refers to the buffer control table CT for the use state of the storage racks 32a of rack Nos. 26–50 assigned to exposed wafers W, and determines a storage rack 32a holding exposed wafer W of the smallest wafer number (i.e. the storage rack 32a of rack No. 26 in this instance). Then, the interface unit controller 6c instructs the first substrate transfer robot 31 to transport unexposed wafer W99 to the substrate transfer table 25. Consequently, as shown in FIG. 10E, the storage rack 32a of rack No. 26 in the buffer section 32 becomes vacant, and exposed wafer W99 of wafer No. 99 is loaded on the substrate transfer table 25. As shown in FIG. 9E, wafer No. 99 is eliminated from area MA1 in the buffer control table CT corresponding to rack No. 26.

An overlap in time may occur between the operation for transferring unexposed wafer W101 from the storage rack 32a of rack No. 1 to the substrate input table 34 and the operation for transferring exposed wafer W99 from the storage rack 32a of rack No. 26 to the substrate transfer table 25. In this embodiment, however, the above operations are carried out independently of and parallel to each other, the former by the second substrate transfer robot 33 and the latter by the first substrate transfer robot 31. These series of transfer operations are performed smoothly without involving any waiting time despite overlapping of individual steps.

After the substrate transport robot 23 in the processing unit 2 unloads the exposed wafer W of wafer No. 99 from the substrate transfer table 25, the situation becomes similar to what is shown in FIGS. 9A and 10A (with the wafer numbers incremented by one). After new unexposed wafer W102 of wafer No. 102 is loaded on the substrate transfer table 25, the foregoing steps (FIGS. 9B–9E and 10B–10E) are repeated. In this way, unexposed wafers W are successively transferred from the processing unit 2 to the exposure unit 4, and exposed wafers W from the exposure unit 4 to the processing unit 2. While the exposure process is performed smoothly in the exposure unit 4, the wafer transfer is conducted using only the storage rack 32a of rack No. 1 for storing unexposed wafers W, and using only the storage rack 32a of rack No. 26 for storing exposed wafers W. That is, the storage racks 32a of rack Nos. 1 and 26 act merely as substrate transfer tables in transferring wafers W between the first substrate transfer robot 31 and second substrate transfer robot 31.

However, variations could occur in the processing time in the exposure unit 4. Wafers W must be exchanged through the interface unit 3 in a way to accommodate a time lag between the internal processing time in the processing unit 2 determined on the basis of the average exposing time in the exposure unit 4, and an actual exposing time in the exposure unit 4. The buffer section 32, by having a plurality of storage racks 32a is able to cope with such a situation.

Assume, for example, that a delay occurs in the exposure process in the exposure unit 4, with the result that, as shown in FIGS. 11A and 11B, new unexposed wafer Wm+1 of wafer No. m+1 is loaded on the substrate transfer table 25 while unexposed wafer Wm of wafer No. m remains on rack No. 1. Then, the interface unit controller 6c refers to the buffer control table CT for the use state of the storage racks 32a (rack Nos. 1-25) assigned to unexposed wafers W, and determines a lowermost unoccupied rack number. The interface unit controller 6c instructs the first substrate transfer robot 31 to transport the unexposed wafer Wm+1 from the substrate transfer table 25 to the storage rack 32a of the rack number determined (which is rack No. 2 in this instance) in the buffer section 32. FIGS. 11C and 11D show storage states of the buffer section 32 and buffer control table CT resulting from the above operation.

With a further delay in the exposure process in the exposure unit 4, new unexposed wafer Wm+2 of wafer No. m+2 may be loaded on the substrate transfer table 25 while the state shown in FIGS. 11C and 11D remains unchanged. Then, the new unexposed wafer Wm+2 is deposited on the storage rack 32a of rack No. 3 as shown in FIGS. 11E and 11F.

In this way, succeeding unexposed wafers W are temporarily stored. Where the number of storage racks 32a in the buffer section 32 is n (e.g. 50), the mixiumum number of unexposed wafers W temporarily storable is n/2 (25).

When, in the state shown in FIGS. 11E and 11F, the substrate input table 34 becomes vacant, for example, the second substrate transfer robot 33 fetches the unexposed wafer W having the smallest wafer number among the unexposed wafers W stored in the buffer section 32, and loads this wafer W on the substrate input table 34 (FIGS. 11G and 11H).In this instance, the earliest stored unexposed wafer Wm stored on storage rack 32a of rack No. 1 has the smallest wafer number.

When, in the state shown in FIGS. 11G and 11H, new unexposed wafer Wm+3 of wafer No. m+3 is loaded on the substrate transfer table 25, the new unexposed wafer Wm+3 is stored on the storage rack 32a of rack No. 1, which is the lowermost one of the vacant storage racks 32a, as shown in FIGS. 11I and 11J.

When, in the state shown in FIGS. 11I and 11J, the substrate input table 34 becomes vacant, the second substrate transfer robot 33 fetches the unexposed wafer W of the smallest wafer number (stored earliest) (which is unexposed wafer Wm+1 stored on the storage rack 32a of rack No. 2 in this instance) among the unexposed wafers W stored in the buffer section 32, and loads this wafer W on the substrate input table 34. When, in this state (with only the storage racks 32a of rack Nos. 1 and 3 storing unexposed wafers Wm+3 and Wm+2), the substrate input table 34 becomes vacant, the second substrate transfer robot 33 fetches unexposed wafer Wm+2 from the storage rack 32a of rack No. 3, and loads it on the substrate input table 34.

On the other hand, when, in the state shown in FIGS. 11I and 11J, new unexposed wafer Wm+4 of wafer No. m+4 is loaded on the substrate transfer table 25, the new unexposed wafer Wm+4 is stored on the storage rack 32a of rack No. 4, which is the lowermost one of the vacant storage racks 32a.

The use of racks Nos. n/2+1 to n (e.g. 26 to 50) for exposed wafers W is controlled in the same way as described above for control of racks Nos. 1 to n/2 (e.g. 1 to 25) for unexposed wafers W.

Thus, this embodiment with the buffer section 32 has the flexibility for accommodating any difference in processing time between the processing unit 2 and exposure unit 4. The series of wafer transfer steps may be carried out smoothly without leaving wafers W on the substrate transfer table 25 or substrate output table 35.

According to this embodiment, the first substrate transfer robot 31 transfers wafers W between the substrate transfer table 25 and buffer section 32, while the second substrate transfer robot 33 transfers wafers W between the buffer section 32 and substrate input table 34 or substrate output table 35. These substrate transfer robots 31 and 33 act in cooperation to transfer the wafers W within the interface unit 3. Consequently, each substrate transfer robot 31 or 33 has a reduced number of transfer positions. The respective transfer operations may be carried out independently of and parallel to each other to expedite the wafer transfer within the interface unit 3. The buffer section 32 is interposed between the 20 first and second substrate transfer robots 31 and 33. In transferring wafers W, each substrate transfer robot 31 or 33 is operable smoothly without the necessity of circumventing buffer section 32, substrate transfer table 25, substrate input table 34 or substrate output table 35. Thus, the wafer transfer within the interface unit 3 is expedited to keep pace with the high-speed exposure unit 4 and the processing unit 2 adapted to follow the high-speed exposure.

The first substrate transfer robot 31, buffer section 32 and second substrate transfer robot 33 are arranged in the stated order substantially linearly along the y-axis. The substrate input table 34 and substrate output table 35 are arranged also along the y-axis. The interface unit 3 integrating these components is elongated along the y-axis as shown in FIG. 2. Further, as shown in FIG. 2, the processing unit 2, interface unit 3 and exposure unit 4 are arranged along the x-axis perpendicular to the direction longitudinally of the interface unit 3. This arrangement realizes a diminished space B3 (see FIG. 2) between the processing unit 2 and exposure unit 4, resulting in a diminished dimension B from the processing unit 2 to the exposure unit 4. Thus, efficient use is made of a floor space dedicated to these units 2-4. Further, the storage racks 32a in the buffer section 32 are formed in multiple stages along the z-axis. This arrangement allows the buffer section 32 to occupy a reduced floor area, which in turn allows the interface unit 3 to be formed compact in horizontal directions. Thus, the interface unit 3 occupies a reduced floor area. This type of substrate processing system is installed in a cleanroom requiring a high running cost. According to this embodiment, efficient use is made of floor space in the cleanroom.

The use of the buffer section 32 is not limited to the method described hereinbefore. For example, the storage racks 32a may be used successively from a lower one, instead of using the storage racks 32a separately for storing unexposed wafers W and for storing exposed wafers W.

Figures 12A, 12B:
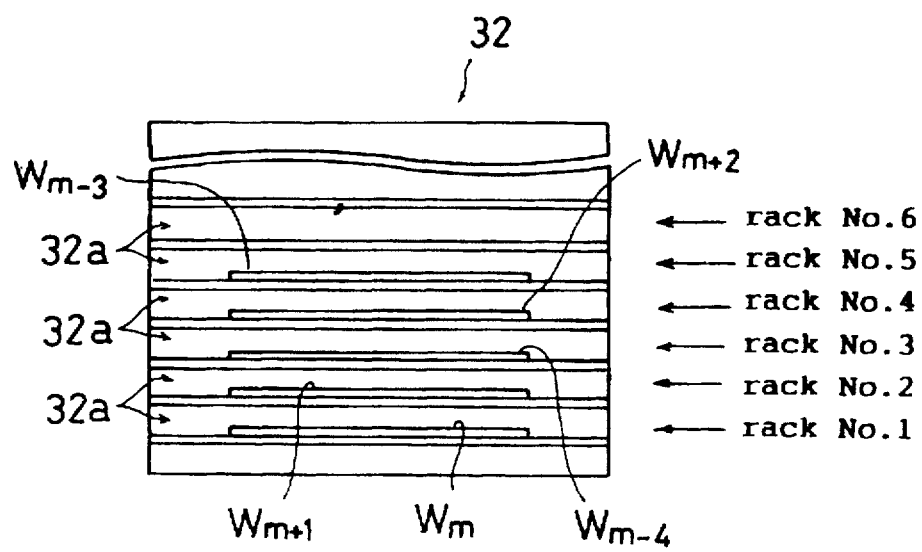
FIGS. 12A and 12B are explanatory diagrams showing a further example of use control of the buffer section.

When, for example, unexposed wafer Wm of wafer No. m, unexposed wafer Wm+1 of wafer No. m+1, exposed wafer Wm–4 of wafer No. m–4, unexposed wafer Wm+2 of wafer No. m+2 and exposed wafer Wm–3 of wafer No. m–3 are stored in this order in the buffer section 32 (in this case, unexposed wafer Wm–1 of wafer No. m–1 is present on the substrate input table 34, and wafer Wm–2 of wafer No. m–2 is being exposed in the exposure unit 4), the wafers Wm–4, Wm–2 and Wm to Wm+2 are stored, according to the above modified method, as shown in FIG. 12A. As shown in FIG. 12B, the buffer control table CT includes areas MA2 for storing flags indicating whether the wafers W stored are unexposed wafers W or exposed wafers W. In FIG. 12B, "0" is used to identify unexposed wafers W, and "1" to identify exposed wafers W.

When, in the state shown in FIGS. 12A and 12B, new unexposed wafer Wm+3 or exposed wafer Wm–2 is stored in the buffer section 32, the wafer W is deposited on the storage rack 32a of rack No. 6, which is the lowermost one of the vacant storage racks 32a. The wafer number of the newly stored wafer W is written in the area MA1 of the buffer control table CT corresponding to rack No. 6. The corresponding area MA2 records a flag ("0" or "1") indicating the type (unexposed or exposed) of the wafer W stored.

When, in the state shown in FIGS. 12A and 12B, one of the unexposed wafers W is transferred to the substrate input table 34, the buffer control table CT is searched (only in respect of the stored wafers W with flag "0") for the unexposed wafer W of the smallest wafer number (stored earliest) (which is unexposed wafer Wm of wafer No. m in this instance) among the unexposed wafers W stored in the buffer section 32. The wafer Wm is withdrawn from the storage rack 32a of rack No. 1 in the buffer section 32, and transferred to the substrate input table 34. The records are eliminated from the areas MA1 and MA2 of the buffer control table CT corresponding to rack No. 1. When newly storing the unexposed wafer Wm+3 or exposed wafer Wm–2 in the buffer section 32 after the unexposed wafer Wm is removed therefrom, this wafer W is deposited on the storage rack 32a of rack No. 1 which is the lowermost one of the vacant storage racks 32a. Relevant information is written in the pertinent areas of the buffer control table CT.

When, in the state shown in FIGS. 12A and 12B, one of the exposed wafers W is transferred to the substrate transfer table 25, the buffer control table CT is searched (only in respect of the stored wafers W with flag "1") for the exposed wafer W of the smallest wafer number (stored earliest) (which is exposed wafer Wm–4 of wafer No. m–4 in this instance) among the exposed wafers W stored in the buffer section 32. The wafer Wm–4 is withdrawn from the storage rack 32a of rack No. 3 in the buffer section 32, and transferred to the substrate transfer table 25. The records are eliminated from the areas MA1 and MA2 of the buffer control table CT corresponding to rack No. 3. When newly storing the unexposed wafer Wm+3 or exposed wafer Wm–2 in the buffer section 32 after the exposed wafer Wm–4 is removed therefrom, this wafer W is deposited on the storage rack 32a of rack No. 3 which is the lowermost one of the vacant storage racks 32a. Relevant information is written in the pertinent areas of the buffer control table CT.

By controlling use of the buffer section 32 as above, unexposed wafers W and exposed wafers W may temporarily be stored in a maximum total number corresponding to the number of storage racks 32a. This control method advantageously avoids such an inconvenience that unexposed wafers W or exposed wafers W cannot be stored temporarily in the event of a large difference in number between the two types of wafers W to be stored.

While the use of the buffer section 32 may be controlled in ways different than the above two methods, it is preferable to use the storage racks 32a successively from a lower one. The constructions of the processing unit 2 and exposure unit 4 require the substrate transfer table 25, substrate input table 34 and substrate output table 35 to be arranged below the buffer section 32. Consequently, the substrate supports 31e and 33g of the first and second substrate transfer robots 31 and 33 would have to be moved by large amounts along the z-axis when depositing or withdrawing wafers W on/from upper storage racks 32a in the buffer section 32. Compared with the above, the use of the storage racks 32a successively from a lower one reduces the amounts of movement along the z-axis of the substrate supports 31e and 33g of the first and second substrate transfer robots 31 and 33. The operations of the first and second substrate transfer robots 31 and 33 are correspondingly free from wasteful movement, to contribute to a high-speed wafer transfer within the interface unit 3.

Next, an operation of the interface unit 3 for the special processing will be described briefly.

The operator loads one or more unexposed wafers W in the cassette 36a or 36b, which has/have been processed by an apparatus other than the processing unit 2 up to the stage immediately preceding the exposure, for example. The operator opens the door 38 to the interface unit 3, sets the cassette 36a or 36b to the table 37a or 37b, and shuts the door 38. Then, the operator selects the special processing through the control unit 6f.

As a result, the second substrate transfer robot 33 in the interface unit 3 fetches (the) one unexposed wafer W from the cassette 36a or 36b, and loads it on the substrate input table 34. The wafer W is then taken into the exposure unit 4 to be exposed therein. When the substrate input table 34 becomes vacant, the second substrate transfer robot 33 fetches a next unexposed wafer W, if any, from the cassette 36a or 36b, and loads it on the substrate input table 34. When exposed wafer W is discharged onto the substrate output table 35, the second substrate transfer robot 33 fetches the exposed wafer W from the substrate output table 35, and deposits it in a predetermined storage position (where the wafer W was stored originally) in the cassette 36a or 36b. The above operation is repeated until all wafers W are exposed and stored back in the cassette 36a or 36b. Then, the operator opens the door 38, withdraws the cassette 36a or 36b from the interface unit 3, and shuts the door 38. The cassette 36a or 36b storing the exposed wafer or wafers W is carried to the other apparatus for varied wafer processes (e.g. development and postbaking) after the exposure. In the above operation, basically, when the substrate input table 34 becomes vacant, the second substrate transfer robot 33 fetches a next unexposed wafer W from the cassette 36a or 36b, and loads it on the substrate input table 34. When an exposed wafer W is placed on the substrate output table 35, the second substrate transfer robot 33 fetches the exposed wafer W from the substrate output table 35, and deposits it in the cassette 36a or 36b. Thus, variations in the exposing time in the exposure unit 4 present no problem.

A similar operation takes place in the interface unit 3 for testing exposed conditions of one or more wafers W (i.e. exposure testing). In this case, one or more pilot wafers W are stored in the cassette 36a or 36b, exposed in the exposure unit 4, and exposed pilot wafer or wafers W are tested.

As described above, this embodiment has the flexibility for allowing the interface unit 3 to be used as an indexer and enabling exposure testing.

<Second Embodiment>

Figure 14:
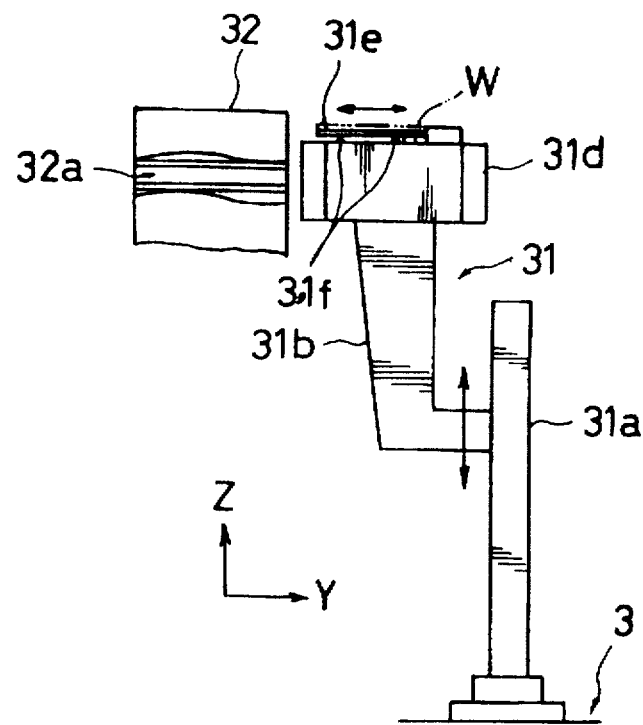
FIG. 14 is a front view showing an outline of a first substrate transport robot in the second embodiment.

A second embodiment of this invention will be described with reference to FIGS. 13, 14 and so on.

The second embodiment pertains to claims 1, 3–8 and 10–12.

In this embodiment, the rotary driver 31c is omitted from the first substrate transfer robot 31, and the substrate support 31e of the first substrate transfer robot 31 is extendible and retractable only toward and away from the buffer section 32. The first substrate transfer robot 31 in this embodiment includes a plurality of (three in the drawings) substrate support pins 31f arranged on the upper surface of the extender 31d to be extendible and retractable along the z-axis. The substrate support pins 31f are extendible and retractable by an air cylinder or the like (not shown) mounted in the extender 31d of the first substrate transfer robot 31. The other aspects are the same as in the first embodiment. Like parts are labeled with like reference numerals with respect to FIG. 2 and so on, and will not be described again to avoid unnecessary repetition.

The interface unit 3 (interface apparatus) is applicable to a processing unit 2 as shown in FIG. 13. This processing unit 2 additionally includes a second substrate transport path 41 opposed to the (first) substrate transport path 24 across the second apparatus area 22, and a second substrate transport robot 42 movable through the second substrate transport path 41.

The processing unit 2 having such a construction has been developed by Applicants to serve the purpose described hereinafter.

As noted hereinbefore, the processing unit 2 provides a baking process which is a type of heat treatment for heating wafers W. On the other hand, the treatments such as resist coating and development are normally performed at room temperature. For such non-heat treatments, the wafers W and the spin coaters SC and spin developers SD performing the treatments must strictly be controlled to and stabilized at predetermined temperatures around room temperature.

In the processing unit 2 as in the prior art or to which the foregoing first embodiment is applied (hereinafter the conventional processing unit), the single substrate transport robot 23 makes access to both the devices for performing the heat treatment (hereinafter heat treating devices) and the devices for performing the non-heat treatment (hereinafter non-heat treating devices). The hand 23b of the substrate transport robot 23 heated in the heat treating devices not only enters the non-heat treating devices, but supports a wafer W to be maintained at or adjacent room temperature. The temperatures of other wafers W and non-heat treating devices are partially raised by heat radiation from the heated wafer W. All this inhibits the thermal stability of processing.

Further, the conventional processing unit 2 has its limitations with respect to improvement in overall throughput since the single substrate transport robot 23 must access all of the devices BA, CA, SC, SD and EEW.

In the conventional processing unit 2, the substrate transport path 24 of the substrate transport robot 23 is disposed between the first apparatus area 21 and second apparatus area 22. Therefore, the substrate inlets/outlets "io" of the heat treating devices (FIG. 4) are directed toward the non-heat treating devices. Each time the hand 23b of the substrate transport robot 23 makes access to a heat treating device, hot gases and fine particles of dust are scattered from the heat treating device. Such gases and particles tend to mix into the non-heat treating devices to inhibit the thermal stability of and contaminate the non-heat treating devices.

In view of the above inconveniences, Applicants have improved the processing unit with the following in mind:

(1) to render the non-heat treating devices free from the influences of heat from the heat treating devices;

(2) to promote the throughput of the entire processing unit; and (3) to prevent the heat and particles from the heat treating devices from mixing into the non-heat treating devices.

Figure 15:
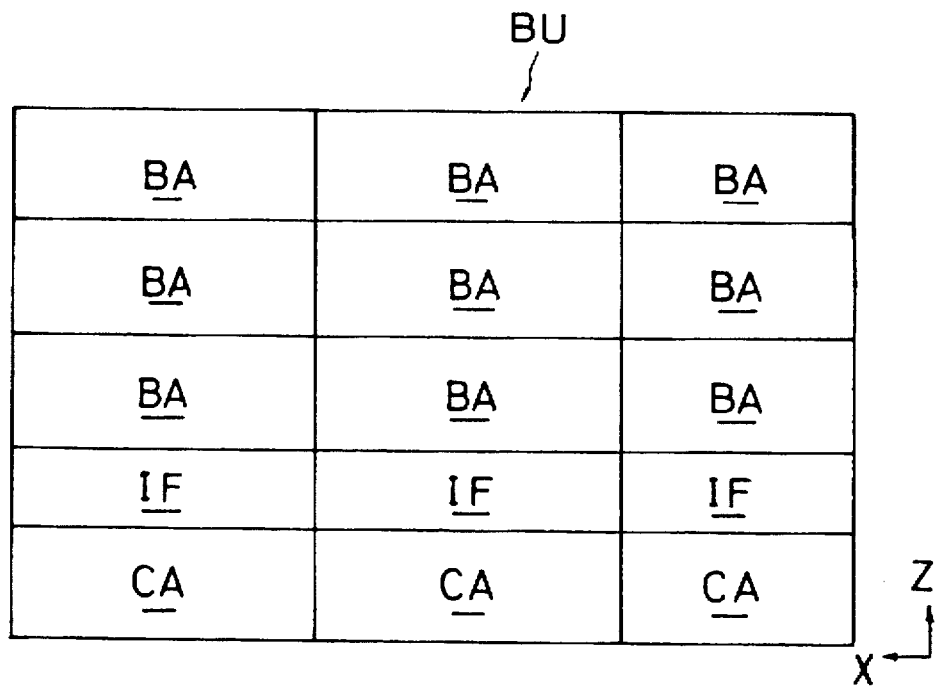
FIG. 15 is front view showing a baking unit in an improved processing unit.
Figure 16:
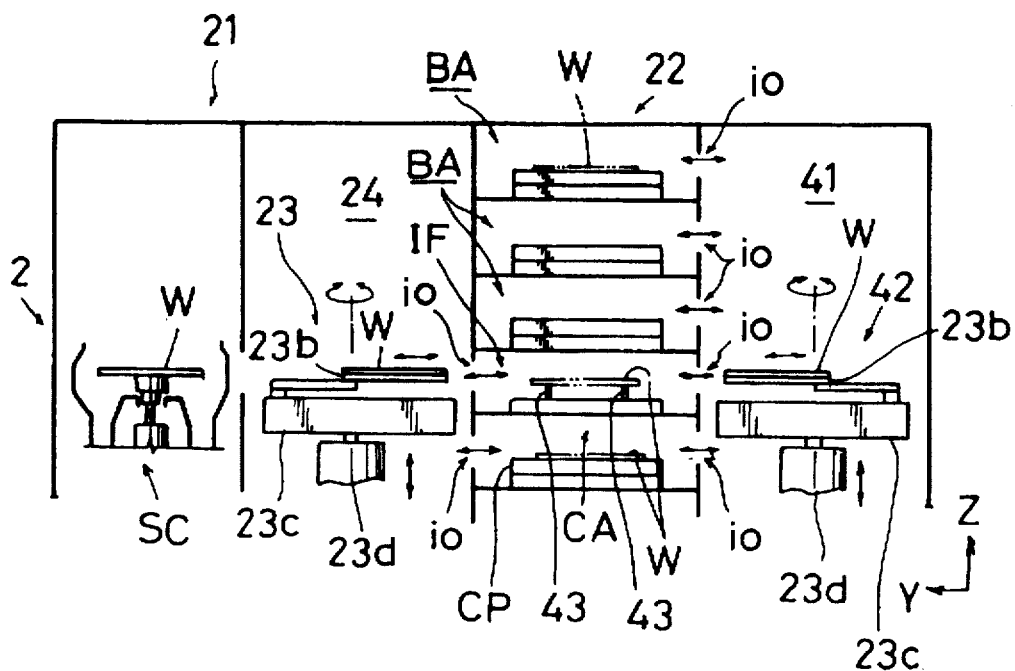
FIG. 16 is a vertical section of the improved processing unit.

A specific construction of the improved processing unit 2 will be described with reference to FIGS. 13, 15 and 16.

This processing unit 2 has a first apparatus area 21, a first substrate transport path 24 of a first substrate transport robot 23 (first substrate transport device in the processing unit), a second apparatus area 22, and a second substrate transport path 41 of a second substrate transport robot 42, arranged in this order in plan view.

As in the conventional processing unit 2, the first apparatus area 21 includes a plurality of (two each in the drawings) spin coaters SC and spin developers SD.

The first substrate transport robot 23 has the same construction as the substrate transport robot 23 in the conventional processing unit 2, and includes a hand 23b horizontally extendible and retractable, rotatable about the z-axis, and movable along the z-axis (i.e. vertically) and along the x-axis (longitudinally of the first substrate transport path 24). The first substrate transport robot 23 makes access to the non-heat treating devices SC and SD arranged in the first apparatus area 21, and to substrate interfaces IF, coolers CA and edge exposing units EEW arranged in the second apparatus area 22 as described hereinafter.

The second apparatus area 22 includes a bake unit BU and a plurality of edge exposing units EEW. As shown in FIG. 15, the bake unit BU includes a plurality of heaters BA, coolers CA and substrate interfaces IF arranged two-dimensionally along the x-axis and z-axis. As shown in FIG. 16, each substrate interface IF defines substrate inlets/outlets "io" opening to both the first substrate transport path 24 and second substrate transport path 41 to be accessible to both the first and second substrate transport robots 23 and 42. Each substrate interface IF has a plurality of substrate support pins 43 fixedly erected for supporting a wafer W therein. Each cooler CA has the same construction as in the prior art, except that substrate inlets/outlets "io" open to both the first substrate transport path 24 and second substrate transport path 41 to be accessible to both the first and second substrate transport robots 23 and 42. Each substrate interface IF is provided specially for transferring wafers W between the first and second substrate transport robots 23 and 42. Each cooler CA also is used for transferring wafers W between the first and second substrate transport robots 23 and 42. In each cooler CA, a hot wafer W is cooled to room temperature or therearound by the time of departure from the cooler CA. The first substrate transport robot 23 contacting the wafer W and transporting it out of each cooler CA has no possibility of thermally influencing the non-heat treating devices in the first apparatus area 21. Each heater BA has a substrate inlet/outlet "io" opening only to the second substrate transport path 41 to be accessible only to the second substrate transport robot 42. Thus, hot gases and particles from the substrate inlet/outlet "io" of each heater BA (heat treating device) are prevented from mixing into the non-heat treating devices (spin coaters SC and spin developers SD) in the first apparatus area 21. Though not shown in the drawings, each edge exposing unit EEW has a substrate inlet/outlet opening only to the first substrate transport path 24 to be accessible only to the first substrate transport robot 23. Thus, the hot gases and particles from the substrate inlet/outlet "io" of each heater BA (heat treating device) are prevented from mixing into the edge exposing units EEW (non-heat treating devices). Each substrate inlet/outlet of the devices has an openable and closable door (not shown), which is automatically opened only in time of access by the substrate transport robots 23 and 42.

The second substrate transport robot 42 also has the same construction as the substrate transport robot 23 in the conventional processing unit 2, and includes a hand 23b horizontally extendible and retractable, rotatable about the z-axis, and movable along the z-axis and x-axis. The second substrate transport robot 42 makes access to the heaters BA, coolers CA and substrate interfaces IF arranged in the second apparatus area 22.

When a wafer W is transferred from the first substrate transport robot 23 to the second substrate transport robot 42, the first substrate transport robot 23 places the wafer W on the substrate support pins 43 in one of the substrate interfaces IF, and then the second substrate transport robot 42 withdraws the wafer W from the substrate interface IF. In a wafer transfer from the second substrate transport robot 42 to the first substrate transport robot 23, the second substrate transport robot 42 inserts, into one of the coolers CA, a wafer W heated in one of the heaters BA. After the wafer W is cooled to room temperature or therearound, the first substrate transport robot 23 withdraws the wafer W from the cooler CA. In the series of treatments in the processing unit 2, a baking process in one of the heaters BA is followed by a cooling process in one of the coolers CA. Thus, wafers W are transferred in accordance with the processing sequence by using the coolers CA in transferring the wafers W from the second substrate transport robot 42 to the first substrate transport robot 23 as described above.

In this way, the heat treating devices are accessed only by the second substrate transport robot 42, and not by the first substrate transport robot 23 which accesses the non-heat treating devices. In transferring wafers W, the first and second substrate transport robots 23 do not contact or even come close to each other, thereby eliminating the inconvenience of the heat of the heat treating devices inhibiting the thermal stability of the non-heat treating devices. With this processing unit 2, the first and second substrate transport robots 23 and 42 cooperate to transport wafers W within the processing unit 2. Such cooperation improves the processing efficiency to promote the throughput of the processing unit 2.

The interface apparatus in the second embodiment applied to the above processing unit 2 has the first substrate transfer robot 31 disposed adjacent the second substrate transport robot 42 (adjacent an end of the second substrate transport path 41) in the processing unit 2.

Figures 17A, 17B:
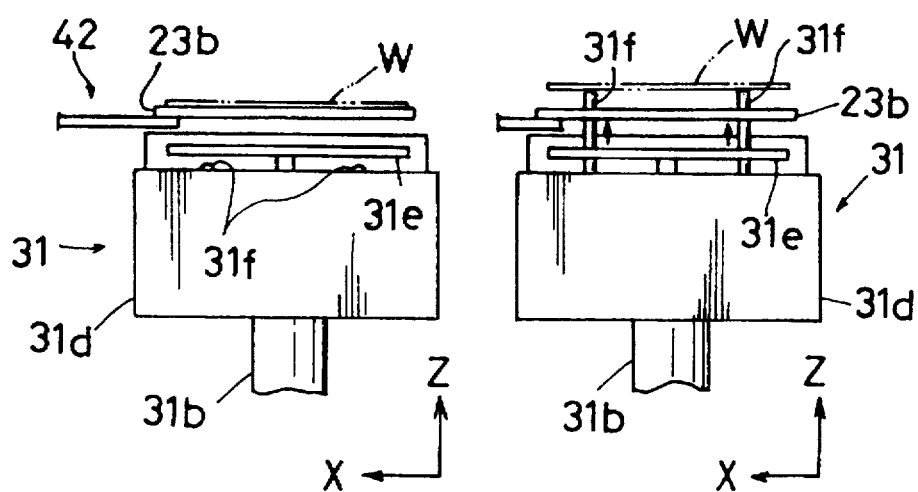
FIGS. 17A and 17B are explanatory diagrams showing a sequence of substrate transfer between the processing unit and interface unit in the second embodiment.

The wafer transfer between the processing unit 2 and interface unit 3 is carried out by the second substrate transport robot 42 in the processing unit 2 and the substrate support pins 31f of the first substrate transfer robot 31 in the interface unit 3. When an unexposed wafer W is transferred from the processing unit 2 to the interface unit 3, as shown in FIG. 17A, the hand 23b of the second substrate transport robot 42 in the processing unit 2 is extended toward the first substrate transfer robot 31 in the interface unit 3. The unexposed wafer W supported by the hand 23b is thereby positioned slightly above the substrate support 31e of the first substrate transfer robot 31 in the interface unit 3. Next, as shown in FIG. 17B, the first substrate transfer robot 31 in the interface unit 3 raises the substrate support pins 31f to receive the wafer W from the hand 23b. Then, the hand 23b is retracted, and the substrate support pins 31f are lowered, placing the wafer W on the substrate support 31e of the first substrate transfer robot 31 in the interface unit 3. The above operation is reversed for transferring an exposed wafer W from the interface unit 3 to the processing unit 2. That is, the substrate support pins 31f are raised to lift the exposed wafer W from the substrate support 31e. The hand 23b is moved under the wafer W, and the substrate support pins 31f are lowered to transfer the wafer W onto the hand 23b.

Apart from the wafer transfer between the processing unit 2 and interface unit 3, the operations within the interface unit 3 are the same as in the first embodiment and will not particularly be described here. In the second embodiment, the substrate support pins 31f of the first substrate transfer robot 31 in the interface unit 3 constitute the device of the first substrate transfer device for exchanging substrates with the processing unit.

When the system having the processing unit 2 shown in FIG. 13 executes the series of steps in the sequence [01] through [18] described in the first embodiment, unexposed wafers W after "cooling in the coolers CA" at step [10] are transferred to the first substrate transfer robot 31 in the interface unit 3. Thus, the wafers W cooled at step [10] are withdrawn from the coolers CA by the second substrate transport robot 42 in the processing unit 2. Exposed wafers W received by the first substrate transfer robot 31 in the interface unit 3 are subjected to the "development by the spin developers SD" at step [14]. These exposed wafers W are passed from the interface unit 3 to the second substrate transport robot 42 in the processing unit 2, and transported into the spin developers SD by the first substrate transport robot 23 in the processing unit 2. Thus, the wafers W are to be transferred from the second substrate transport robot 42 to the first substrate transport robot 23. This wafer transfer is conducted through the substrate interfaces IF rather than through the coolers CA.

<Third Embodiment>

Figure 18:
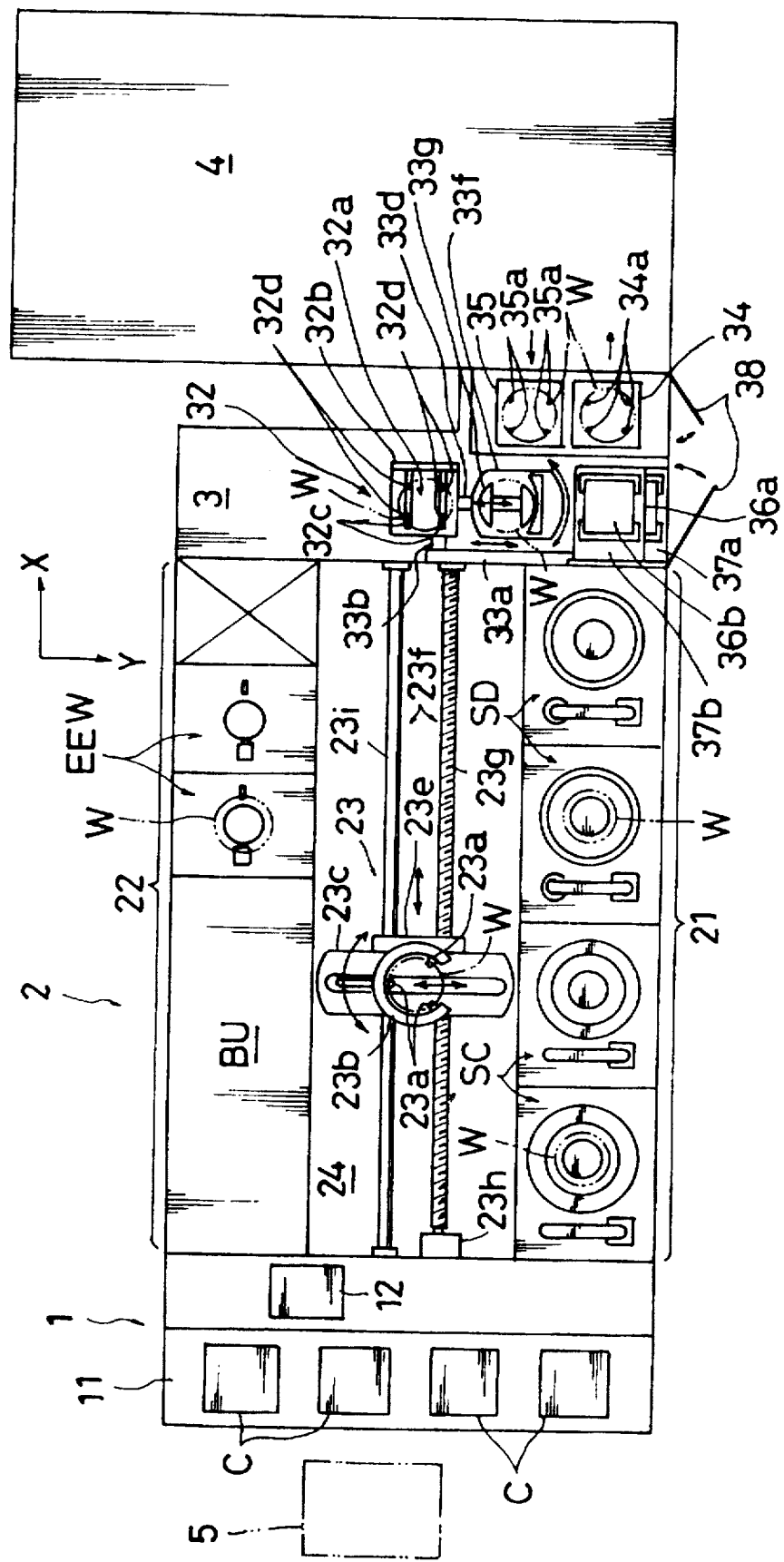
FIG. 18 is a plan view in cross section of a substrate processing system having an interface unit constructed according to a third embodiment of this invention.
Figure 19:
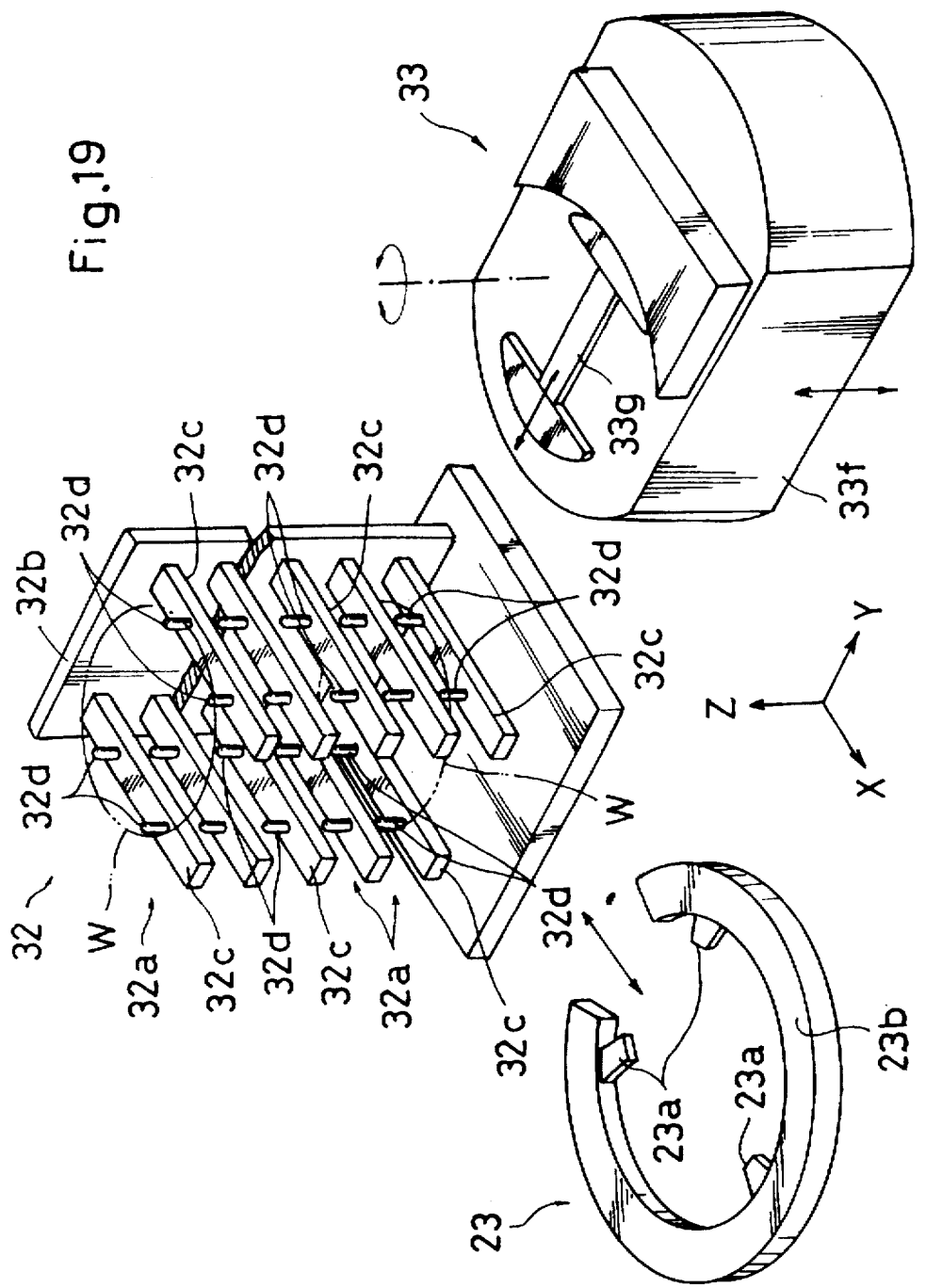
FIG. 19 is a perspective showing an outline of a buffer section and adjacent components of the interface unit in the third embodiment.
Figure 20:
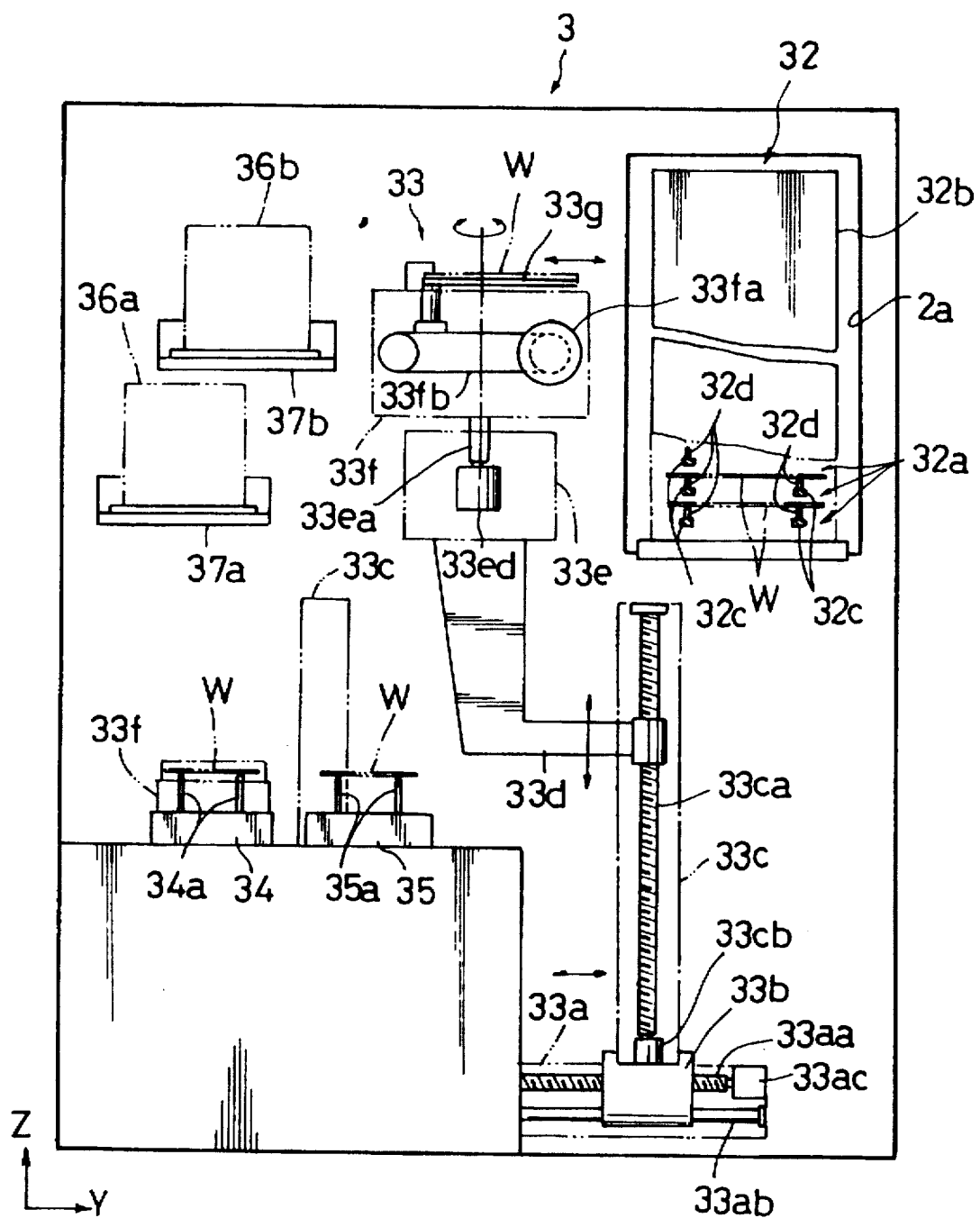
FIG. 20 is a front view of the interface unit in the third embodiment seen from the exposure unit.

FIG. 18 is an overall view in cross section of a substrate processing system having an interface unit in a third embodiment of this invention. FIG. 19 is a perspective showing an outline of a buffer section and adjacent components of the interface unit in the third to-embodiment, and FIG. 20 is a front view of the interface unit in the third embodiment seen from the exposure unit.

The third embodiment pertains to the substrate transfer method (claims 1–5) and the second interface apparatus (claims 13–16, 18 and 19) according to this invention.

In the third embodiment, the buffer section 32 is constructed for allowing the substrate transport robot 23 in the processing unit 2 to deposit and fetch wafers W on/from selected storage racks 32a of the buffer section 32. The first substrate transfer robot 31 provided in the first embodiment is omitted from the third embodiment. However, the third embodiment includes a substrate transfer robot 33 for exchanging wafers W with the substrate input table 34 and substrate output table 35. This robot 33 has the same construction and is operable in the same way as the second substrate transfer robot 33 in the first embodiment. This substrate transfer robot 33 corresponds to the substrate transfer means recited in claim 13, for example. In FIG. 20, a screw shaft 33aa, a guide rod 33ab and a motor 33ac constitute the drive mechanism of a y-direction driver 33a of the substrate transfer robot 33. A screw shaft 33ca and a motor 33cb constitute the drive mechanism of a z-direction driver 33c. A rotary shaft 33ea and motor 33ed constitute the drive mechanism of a rotary driver 33e. A motor 33fa and a timing belt 33fb constitute the drive mechanism of an extender 33f.

The buffer section 32 in the third embodiment is constructed for allowing the substrate transport robot 23 in the processing unit 2 and the substrate transfer robot 33 in the interface unit 3 to deposit and fetch wafers W on/from selected storage racks 32a. The construction of the buffer section 32 will be described hereinafter.

The buffer section 32 is disposed at the intersection (adjacent an end of the substrate transport path) of an extension from the moving path along the x-axis of the substrate transport robot 23 in the processing unit 2 and an extension from the moving path along the y-axis of the substrate transfer robot 33 in the interface unit 3. The buffer section 32 includes a plurality of storage racks 32a arranged in multiple stages along z-axis (vertically). Each rack 32a has a pair of support arms 32c extending toward the processing unit 2 from a side wall 32b opposed to the exposure unit 4, and a plurality of substrate support pins 32d fixedly erected on each support arm 32c. A wafer W deposited on each storage rack 32a rests on the substrate support pins 32d. Each rack 32a is open toward the substrate transport robot 23 in the processing unit 2 and the substrate transfer robot 33 in the interface unit 3.

The substrate transport robot 23 in the processing unit 2 has the same construction as the substrate transport robot 23 in the first embodiment. With appropriate combinations of rotation about the z-axis, movement along the x-axis and z-axis, and extension and retraction of the hand 23b, the substrate transport robot 23 makes access to the processing apparatus such as the spin coaters SC, spin developers SD, baking heaters BA, coolers CA and edge exposing units EEW, deposits and fetches wafers W on/from selected storage racks 32a of the buffer section 32, and transports wafers W among the devices in the processing unit 2 and to and from the buffer section 32. It is to be noted that the substrate transfer table 25 is omitted from the processing unit 2 in the third embodiment. The projections 23a and hand 23b constitute the substrate support of the substrate transport device in the processing unit. The extender 23c corresponds to the extension/retraction device of the substrate transport device in the processing unit. The z-direction mover 23e corresponds to the vertical direction moving device of the substrate transport device in the processing unit.

Figure 21A:
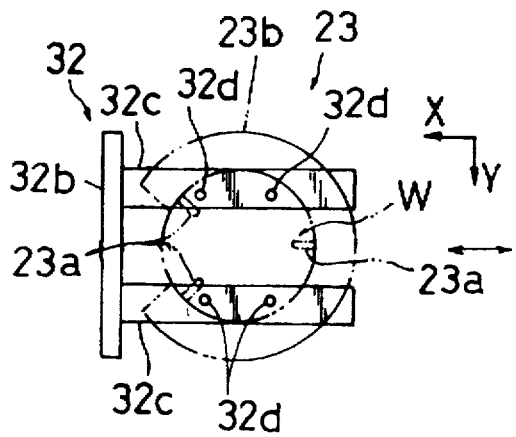
FIGS. 21A and 21B are explanatory diagrams showing a sequence of depositing a substrate on a storage rack in the buffer section by a substrate transport robot in the processing unit.
Figure 21B:
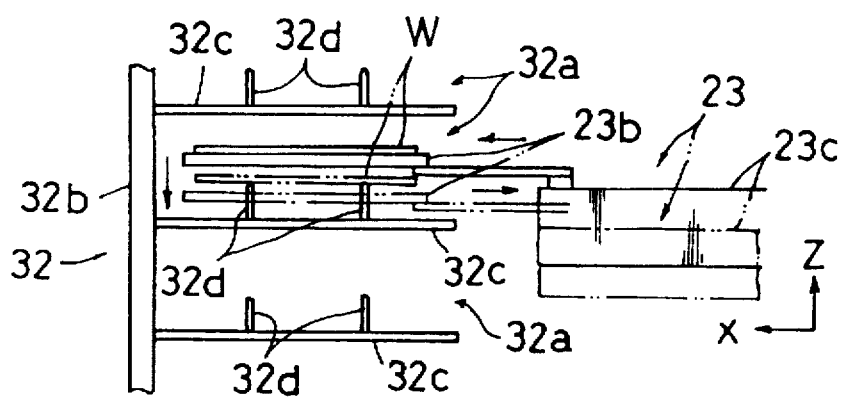

The substrate transport robot 23 in the processing unit 2 deposits a wafer W in the buffer section 32 as shown in FIGS. 21A and 21B. First, the x-direction mover 23f moves the hand 23b along the x-axis toward the end adjacent the interface unit 3. The rotary driver 23d rotates the hand 23b about the z-axis to be ready for extension toward the buffer section 32. The z-direction mover 23e adjusts the height of the hand 23b to the level (vertically) along the z-axis of the storage rack 32a on which the wafer W is to be deposited. Whichever of the movement along the x-axis, rotation about the z-axis and movement along the z-axis may be carried out first. Next, the hand 23b is extended to place the wafer W supported thereon above the target rack 32a. Then, the z-direction mover 23e slightly lowers the hand 23b along the z-axis to deposit the wafer W on the rack 32a. The descent of the hand 23b is stopped in a position between the lower surface of the wafer W resting on the storage rack 32a and upper surfaces of the support arms 32c of the rack 32a, so that the hand 23b is clear of the lower surface of the wafer W. The hand 23b is retracted from the storage rack 32a to complete the wafer storing operation. When fetching a wafer W from a selected storage rack 32a in the buffer section 32, the operation is reversed for causing the hand 23b to lift the wafer W from below.

When the substrate transfer robot 33 deposits a wafer W on or fetches a wafer W from a selected storage rack 32a in the buffer section 32, the substrate support 33g is directed to be extendible to and retractable from the buffer section 32, and the height of the substrate support 33g is adjusted to the level of the storage rack 32a to be accessed for depositing or fetching the wafer W. This wafer depositing or fetching operation is carried out in the same way as the substrate transport robot 23 in the processing unit 2 or the (first or) second substrate transfer robot (31 or) 33 in the first embodiment deposits or fetches a wafer W on/from a selected rack 32a in the buffer section 32.

In the third embodiment, the substrate transport robot 23 in the processing unit 2 directly deposits unexposed wafers W on selected storage racks 32a in the buffer section 32 when transferring the unexposed wafers W to the interface unit 3 (e.g. every 30 to 40 seconds). Further, the substrate transport robot 23 directly fetches exposed wafers W from the buffer section 32 when taking the unexposed wafers W into the processing unit 2 (e.g. every 30 to 40 seconds). On the other hand, the substrate transfer robot 33 in the interface unit 3 is operable in accordance with progress of the processing in the exposure unit 4. When the substrate input table 34 becomes vacant, the substrate transfer robot 33 fetches an unexposed wafer W from the buffer section 32, and loads it on the substrate input table 34. When an exposed wafer W is loaded on the substrate output table 35, the substrate transfer robot 33 fetches the wafer W from the substrate output table 35, and deposits it on a selected storage rack 32a in the buffer section 32.

Figure 22:
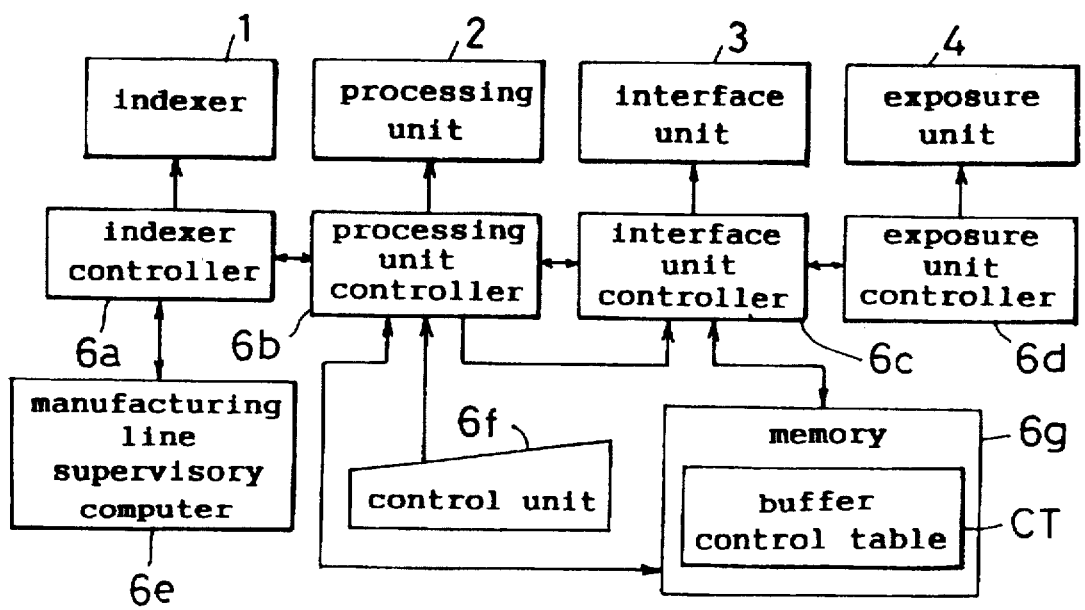
FIG. 22 is a block diagram showing an outline of a control system in the third embodiment (and a fourth embodiment)

In the third embodiment, as shown in FIG. 22, the memory 6g storing the buffer control table CT is connected also to the processing unit controller 6b. Thus, the processing unit controller 6b and interface unit controller 6c control use of the buffer section 32 as described in the first embodiment.

The other aspects are the same as in the first embodiment. Like parts are labeled with like reference numerals with respect to FIGS. 2 through 12, and will not particularly be described again.

As does the first embodiment, the third embodiment has the flexibility for accommodating any difference in processing time between the processing unit 2 and exposure unit 4. The operations are carried out quickly for transferring unexposed wafers W from the processing unit 2 to the interface unit 3, and exposed wafers W from the exposure unit 4 to the interface unit 3. No standstill occurs in exchange of wafers W between the processing unit 2 and exposure unit 4.

In the third embodiment, the buffer section 32 is used also as the position of wafer transfer between the substrate transport robot 23 in the processing unit 2 and the substrate transfer robot 33 in the interface unit 3. Consequently, the substrate transfer robot 33 in the interface unit 3 has a reduced number of transfer positions to expedite the wafer transfer within the interface unit 3. Further, the substrate transfer robot 33 in the interface unit 3 fulfills its functions by transferring wafers W between the buffer section 32 and the substrate input table 34 or substrate output table 35. The substrate transfer robot 33 is operable smoothly without the necessity to circumvent the buffer section 32, substrate input table 34 and substrate output table 35. Besides, the wafer transfer by the first substrate transfer robot 31 in the first embodiment is eliminated from the third embodiment, thereby to simplify and speed up the wafer transfer operation correspondingly. Thus, the wafer transfer within the interface unit 3 is expedited to keep pace with the high-speed exposure unit 4 and the processing unit 2 adapted to follow the high-speed exposure.

<Fourth Embodiment>

Figure 23:
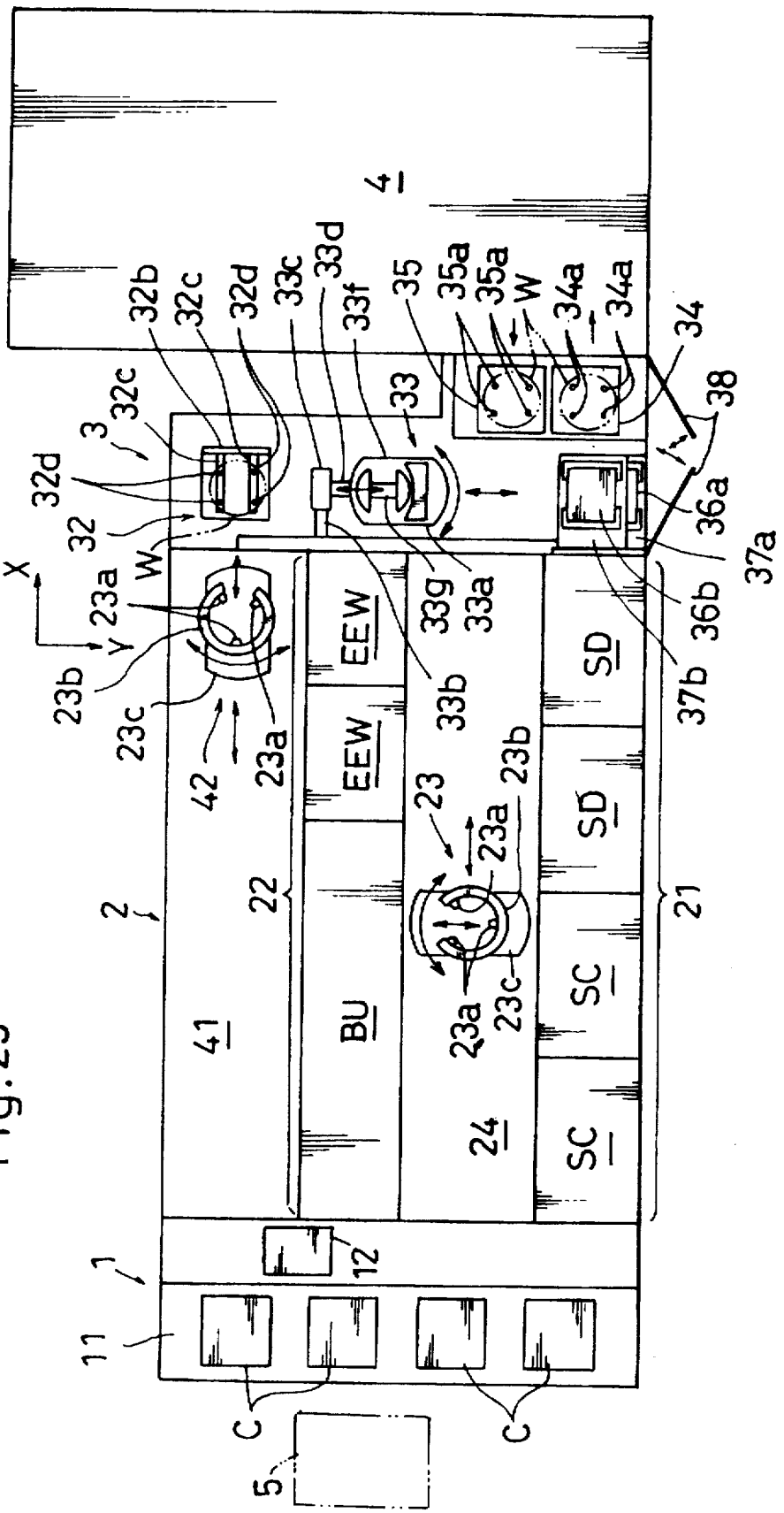
FIG. 23 is a plan view in cross section of a substrate processing system having an interface unit constructed according to the fourth embodiment of this invention.

A fourth embodiment of this invention will be described with reference to FIG. 23.

The fourth embodiment pertains to claims 1–5, 13–15 and 17–19, in which the second interface apparatus according to this invention is applied to the improved processing unit 2 described in the second embodiment. In the fourth embodiment, the buffer section 32 is disposed adjacent the end of the second substrate transport path 41 for allowing the second substrate transport robot 42 to deposit and fetch wafers W on/from selected storage racks 32a of the buffer section 32. The other aspects are the same as in the second and third embodiments. Like parts are labeled with like reference numerals with respect to FIGS. 13 through 22, and will not particularly be described again.

Some modifications of the foregoing embodiments will be set forth hereunder.

Figure 24A:
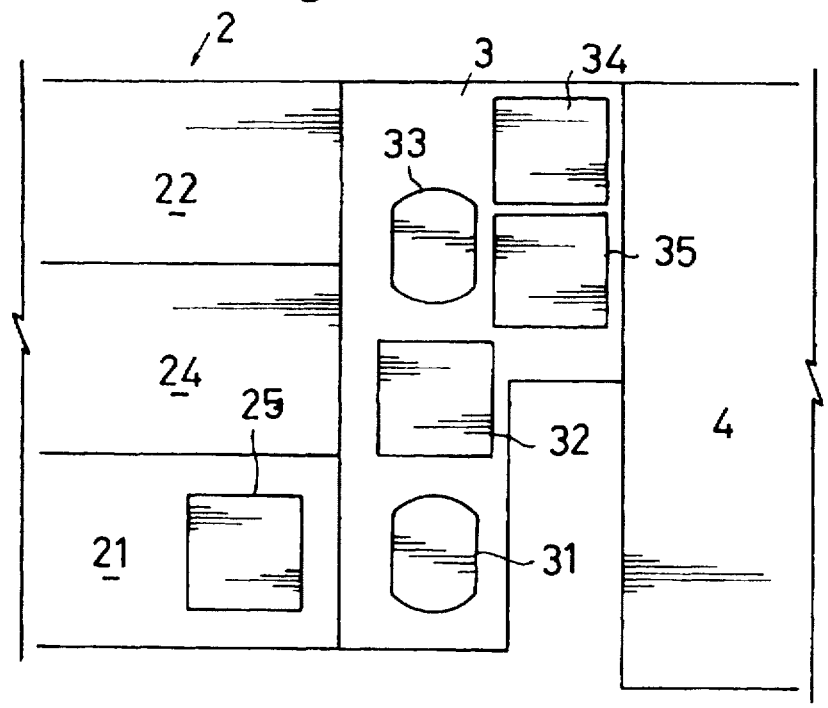
FIGS. 24A, 24B, 25A, 25B, 26A–26D, 27A–27C, 28A–28D and 29A–29F are diagrams showing various modifications according to this invention.
Figure 24B:
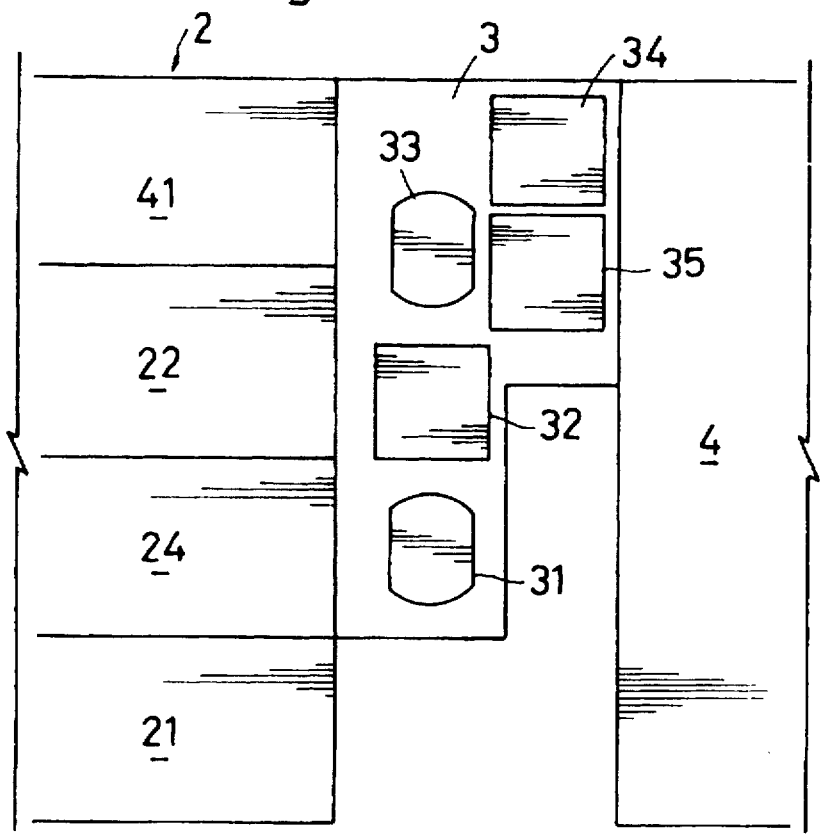

In the first embodiment, the first substrate transfer robot 31 is disposed adjacent the end of the second apparatus area 22. As shown in FIG. 24A, the first substrate transfer robot 31 may be disposed adjacent the end of the first apparatus area 21 instead. In the second embodiment, the first substrate transfer robot 31 is disposed adjacent the end of the second substrate transport path 41. As shown in FIG. 24B, the first substrate transfer robot 31 may be disposed adjacent the end of the first substrate transport path 24 instead, for enabling wafer transfer between the first substrate transport robot 23 and the first substrate transfer robot 31. In the fourth embodiment, the buffer section 32 is disposed adjacent the end of the second substrate transport path 41. However, the buffer section 32 may be disposed adjacent the end of the first substrate transport path 24 for allowing the first substrate transport robot 23 to deposit and fetch wafers W in/from the buffer section 32.

To enable wafer transfer between the improved processing unit 2 described in the second embodiment and the interface unit 3, the first substrate transfer robot 31 in the interface unit 3 has the substrate support 31e extendible toward and retractable from only the buffer section 32, with the substrate support pins 31f extendible and retractable relative to the upper surface of the extender 31d, as described in the second embodiment. This construction may be modified such that the first substrate transfer robot 31 in the interface unit 3 has the extender 31d and substrate support 31e rotatable about the z-axis as in the first embodiment, and that the substrate transfer table 25 is disposed at the end, adjacent the interface unit 3, of the first substrate transport path 24 or second substrate transport path 41 of the improved processing unit 2. Such a modification also is capable of transferring wafers W between the two units 2 and 3.

Figure 25A:
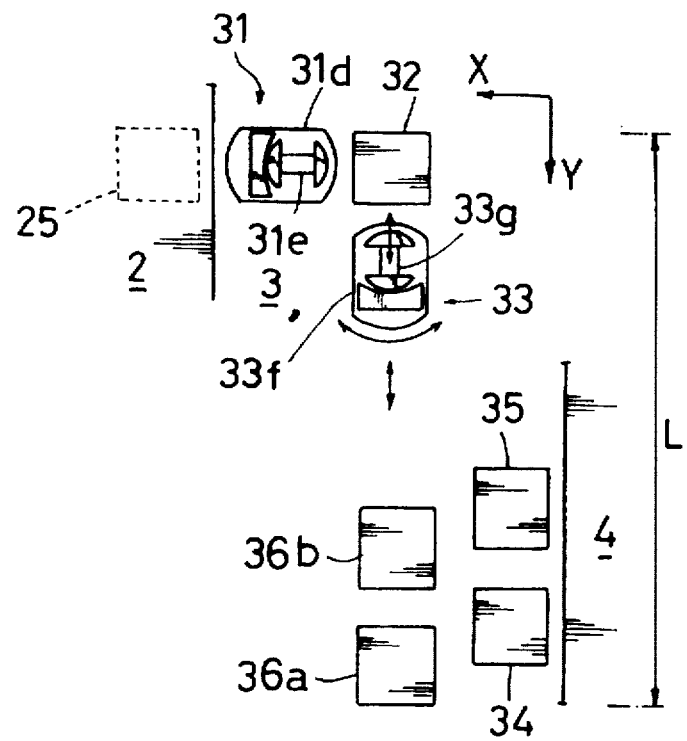
Figure 25B:
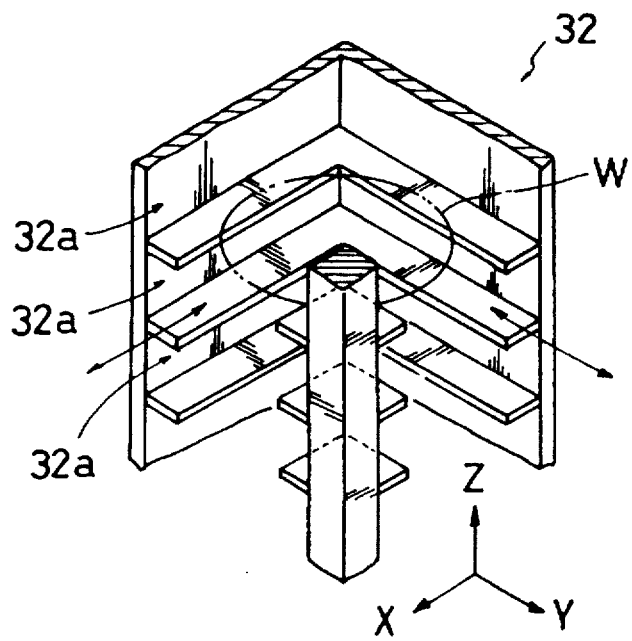

In the first and second embodiments, the interface unit 3 has the first substrate transfer robot 31, buffer section 32 and second substrate transfer robot 33 arranged linearly in this order, parallel to the direction of movement (along the y-axis) of the uniaxial direction moving device of the second substrate transfer robot 33. As shown in FIG. 25A, the buffer section 32 and second substrate transfer robot 33 may be arranged linearly and parallel to the direction of movement (along the y-axis) of the uniaxial direction moving device of the second substrate transfer robot 33, and the first substrate transfer robot 31 and buffer section 32 arranged substantially perpendicular (parallel to the x-axis) to the direction of arrangement (along the y-axis) of the buffer section 32 and second substrate transfer robot 33. In this case, the buffer section 32 has storage racks 32a constructed as shown in FIG. 25B, for allowing wafers W to be deposited and withdrawn through side planes adjacent each other (along the x-axis and y-axis).

The above arrangement also enables the wafer transfer between the processing unit 2 and interface unit 3 to be carried out with a construction as described in the first or second embodiment. Where, as in the first embodiment, the first substrate transfer robot 31 has the extender 31d and substrate support 31e rotatable about the z-axis, the substrate transfer table 25 may be disposed in a position shown in a dotted line in FIG. 25A.

Where, as in the second embodiment, the first substrate transfer robot 31 has the substrate support 31e extendible toward and retractable from only the buffer section 32, with the substrate support pins 31f extendible and retractable relative to the upper surface of the extender 31d, these substrate support pins 31f and the substrate transport robot 23 or 42 in the processing unit 2 may cooperate to transfer wafers W between the processing unit 2 and interface unit 3. In this case, a length L (FIG. 25A) along the y-axis from the first substrate transfer robot 31 to the first cassette 36a (on the table 67a) is smaller than in the first and second embodiments. Consequently, wafers W may be exchanged with the substrate transport robot 23 in the conventional processing unit 2 described in the first embodiment. The first substrate transfer robot 31 in the interface unit 3 may be constructed as in the second embodiment, and yet applied to the substrate processing system having the conventional processing unit 2. Further, when exchanging wafers W with the improved processing unit 2 described in the second embodiment, the wafers W may be exchanged with either one of the first and second substrate transport robots 23 and 42 in the processing unit 2.

In the third and fourth embodiments, the arrangement of the buffer section 32, substrate transfer robot 33, substrate input table 34 and substrate output table 35 is not limited to what is described therein. The arrangement may be modified as shown in FIGS. 26A through 26D and 27A through 27C.

Figure 26A:
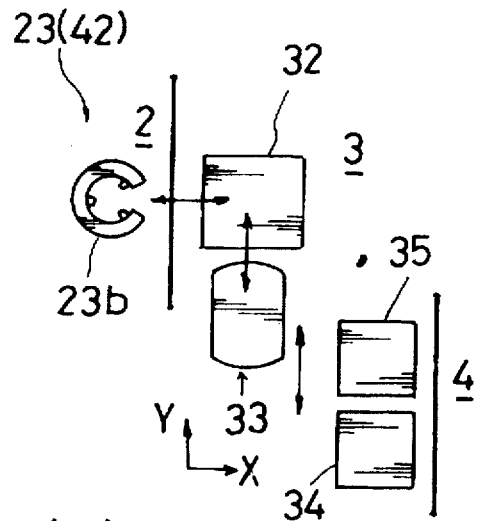
Figure 26B:
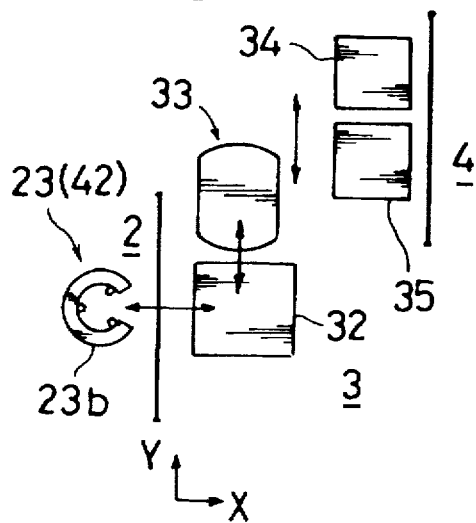

In 26B, the positional relationship to the buffer section 32 of the substrate transfer robot 33, substrate input table 34 and substrate output table 35 is reversed along the y-axis from what it is in the third and fourth embodiments. For the sake of comparison, FIG. 26A shows the arrangement of the principal elements in the interface unit 3 in the third and fourth embodiments. As noted hereinbefore, the buffer section 32 may be accessed for depositing and withdrawing wafers W by either one of the first and second substrate transport robots 23 and 42 in the improved processing unit 2 in the fourth embodiment. This applies also to the arrangements shown in FIGS. 26C, 26D and 27A through 27C. In these figures, the substrate transport robot in the processing unit 2 is affixed with reference numeral 23 (or 42).

Figure 26C:
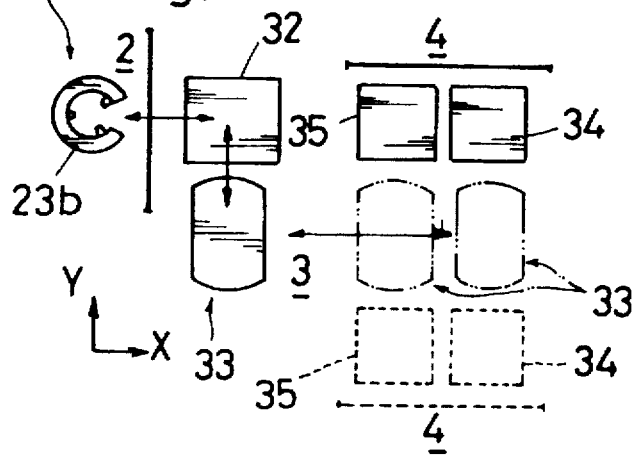
Figure 26D:
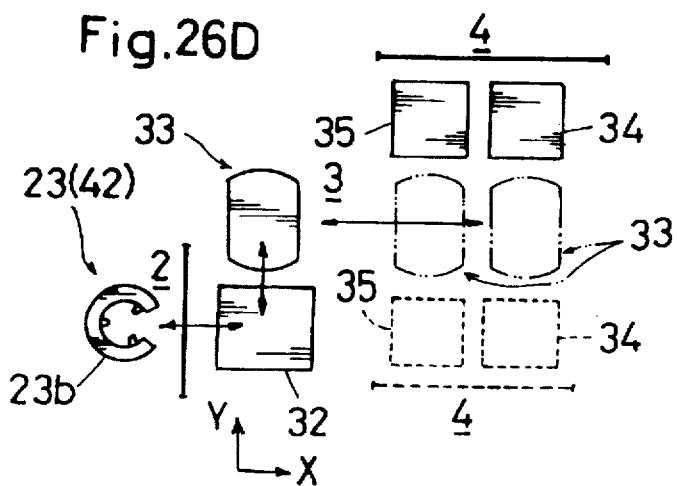

In FIGS. 26C and 26D, the substrate transfer robot 33 in the interface unit 3 is movable along the x-axis (as opposed to the y-axis in the third and fourth embodiments) in XY plane. The substrate input table 34 and substrate output table 35 may be arranged in an upper portion (as shown in solid lines) or a lower portion (as shown in dotted lines) of the drawings as long as the tables 34 and 35 are arranged along the x-axis or a moving track of the substrate transfer robot 33. Where the substrate input table 34 and substrate output table 35 are arranged in the positions shown in the solid lines in FIG. 26C, the substrate transfer robot 33 in the interface unit 3 can deposit and withdraw wafers W on/from selected storage racks 32a in the buffer section 32 and load and unload wafers W on/from the substrate input table 34 and substrate output table 35 without rotating the substrate support 33g about the z-axis. Thus, the rotary driver 33e may be omitted from the substrate transfer robot 33. This applies also where the substrate input table 34 and substrate output table 35 are arranged in the positions shown in the dotted lines in FIG. 26D. The arrangements shown in FIGS. 26C and 26D are equally applicable to the second substrate transfer robot 33 in the first and second embodiments.

Figure 27A:
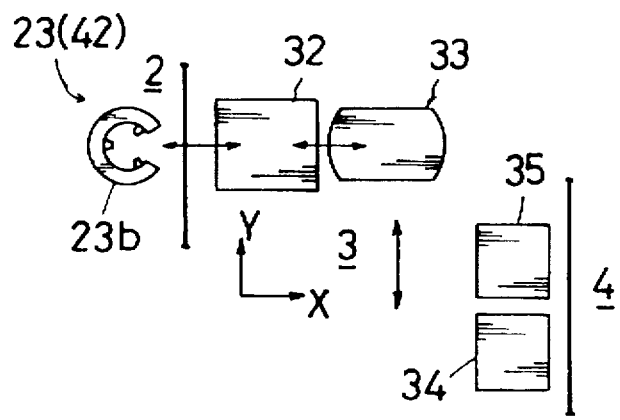
Figure 27B:
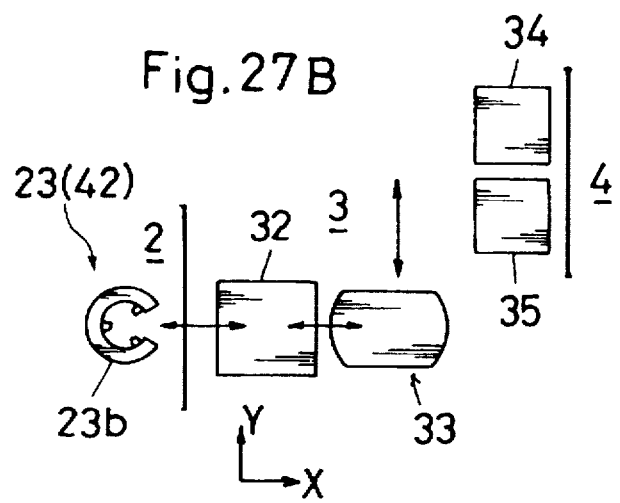

In FIGS. 27A and 27B, the substrate transfer robot 33 in the interface unit 3 deposits and fetches wafers W in/from the buffer section 32 by moving along the x-axis (as opposed to the y-axis in the third and fourth embodiments) as does the substrate transport robot 23 (or 42) in the processing unit 2 when depositing and fetching wafers W in/from the buffer section 32.

Figure 27C:
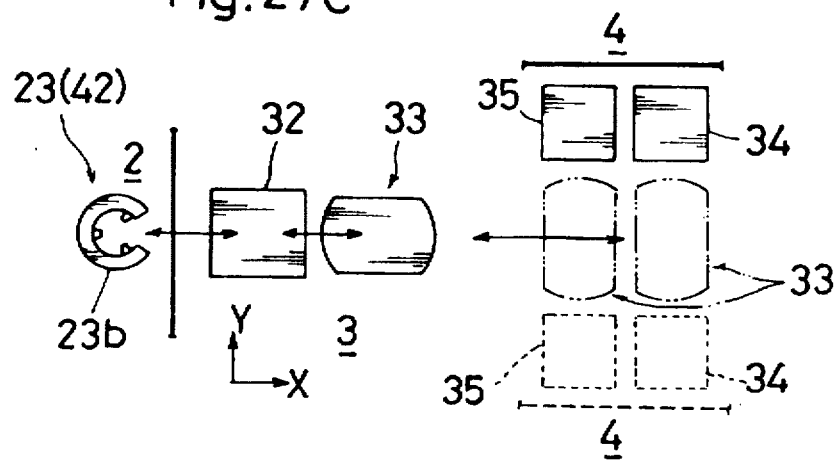

In FIG. 27C, the substrate transfer robot 33 in the interface unit 3 deposits and fetches wafers W in/from the buffer section 32 by moving along the x-axis as does the substrate transport robot 23 (or 42) in the processing unit 2 when depositing and fetching wafers W in/from the buffer section 32, and is movable along the x-axis in XY plane. In this arrangement, as in the modifications shown in FIGS. 26C and 26D, the substrate input table 34 and substrate output table 35 may be arranged in an upper portion (as shown in solid lines) or a lower portion (as shown in dotted lines) of the drawing as long as the tables 34 and 35 are arranged along the x-axis or a moving track of the substrate transfer robot 33.

In the arrangements shown in FIGS. 26A through 26D and 27A through 27C, the positions of substrate input table 34 and substrate output table 35 are interchangeable.

The layouts relating to FIGS. 26A through 26D and 27A through 27C are applicable also to the first and second embodiments.

The layout of the processing unit 2, interface unit 3 and exposure unit 4 are not limited to the arrangement along one horizontal axis as in the foregoing embodiment, but may be arranged in a U-shaped layout or L-shaped layout. This invention is equally applicable to various layouts as shown in FIGS. 28A through 28D (for the first and second embodiments) and FIGS. 29A through 29F (for the third and fourth embodiments).

Figure 28A:
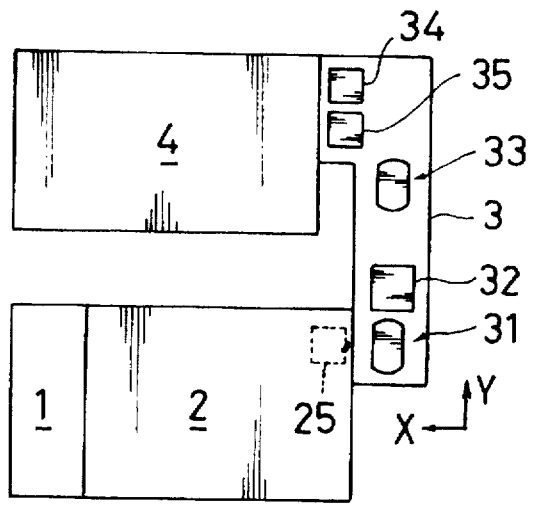
Figure 28B:
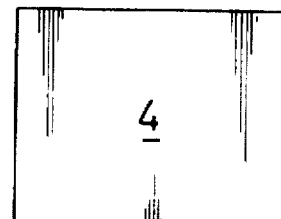

In the layouts shown in FIGS. 28A and 28B, the substrate transfer table 25 may be disposed in positions shown in dotted lines where the first substrate transfer robot 31 in the interface unit 3 is constructed as in the first embodiment. In this case, where the conventional processing unit 2 described in the first embodiment is employed, the substrate transfer table 25 is disposed at the end of the second apparatus area 22 opposed to the interface unit 3. Where the improved processing unit 2 described in the second embodiment is employed, the substrate transfer table 25 is disposed at the end of the second substrate transport path 41 opposed to the interface unit 3.

In the layouts shown in FIGS. 28A and 28B, where the first substrate transfer robot 31 in the interface unit 3 is constructed as in the second embodiment, wafers W may be transferred between the improved processing unit 2 and the interface unit 3 by cooperation of the first substrate transfer robot 31 and the second substrate transport robot 42 in the improved processing unit 2.

Figure 28C:
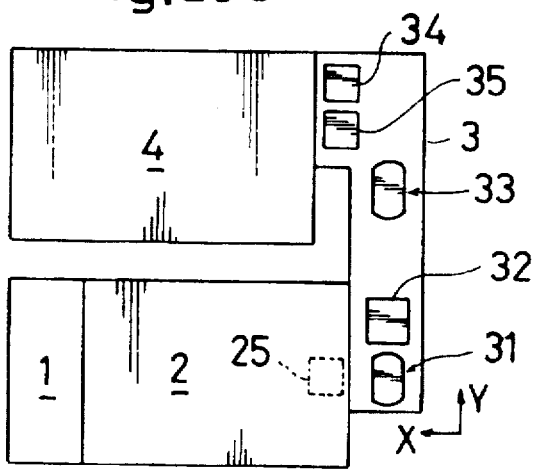
Figure 28D:
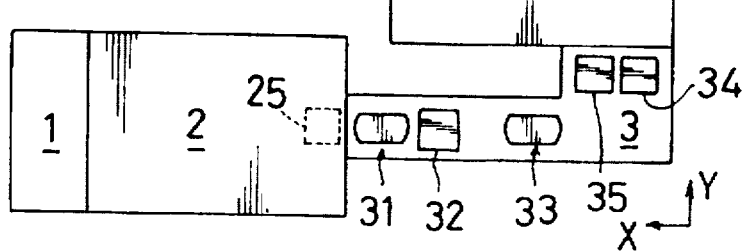

As shown in FIGS. 28C and 28D, the first substrate transfer robot 31 in the interface unit 3 may have a position of interaction with the processing unit 2 shifted toward the middle point in the end plane of the processing unit 2 from the position shown in FIGS. 28A and 28B. Then, where the first substrate transfer robot 31 in the interface unit 3 is constructed as in the second embodiment and the conventional processing unit 2 is employed, wafers W may be transferred between the processing unit 2 and interface unit 3 by cooperation of the substrate support pins 31f of the first substrate transfer robot 31 and the substrate transport robot 23 in the processing unit 2. In the layouts shown in FIGS. 28C and 28D, where the first substrate transfer robot 31 in the interface unit 3 is constructed as in the second embodiment and the conventional processing unit 2 is employed, wafers W may be transferred between the processing unit 2 and the interface unit 3 by disposing the substrate transfer table 25, as shown in dotted lines, at the end of the substrate transport path 24 opposed to the interface unit 3.

In the layouts shown in FIGS. 28C and 28D, where the first substrate transfer robot 31 in the interface unit 3 is constructed as in the second embodiment and the improved processing unit 2 is employed, wafers W may be transferred between the processing unit 2 and interface unit 3 by cooperation of the substrate support pins 31f of the first substrate transfer robot 31 and the first substrate transport robot 23 in the processing unit 2. Where the first substrate transfer robot 31 in the interface unit 3 is constructed as in the first embodiment, wafers W may be transferred between the improved processing unit 2 and the interface unit 3 by disposing the substrate transfer table 25 at the end of the second apparatus area 22 or substrate transport path 24 opposed to the interface unit 3.

Where the first substrate transfer robot 31 in the interface unit 3 has a position of interaction with the processing unit 2 further shifted to the vicinity of the first apparatus area 21 in the processing unit 2, wafers W may be transferred between the processing unit 2 and the interface unit 3 by constructing the first substrate transfer robot 31 as in the first embodiment and disposing the substrate transfer table 25 at the end of the first apparatus area 21 of the processing unit 2 (which may be the conventional unit or improved unit) opposed to the interface unit 3.

The layouts shown in FIGS. 28A through 28D may also employ the interface unit 3 in which the arrangement of the first substrate transfer robot 31, buffer section 32 and second substrate transfer robot 33 is modified as shown in FIGS. 25A, 25B, 26A through 26D and 27A through 27C.

The arrangement in the interface unit 3 of the buffer section 32, substrate transfer robot 33, substrate input table 34 and substrate output table 35 in the layouts shown in FIGS. 29A through 29F may be applied to the interface unit 3 modified as shown in FIGS. 26A through 26D and 27A through 27C.

Figure 29A:
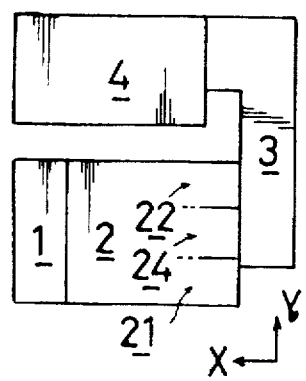
Figure 29B:
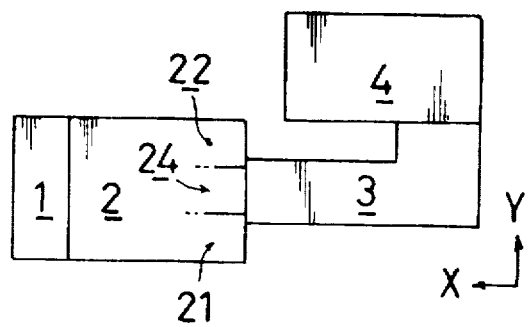
Figure 29C:
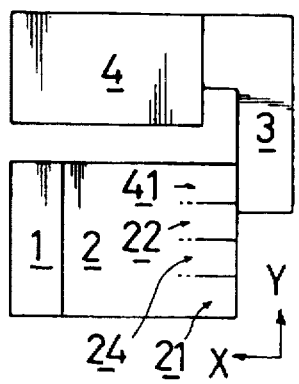
Figure 29D:
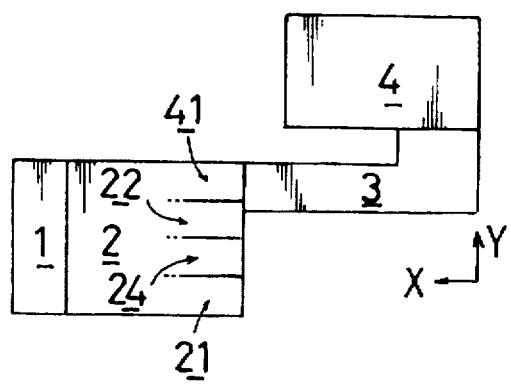
Figure 29E:
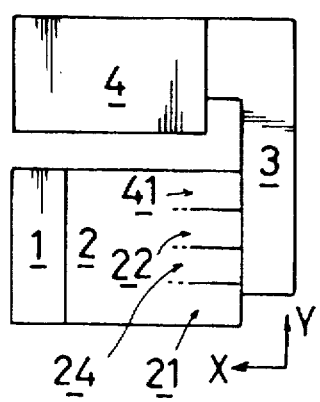
Figure 29F:
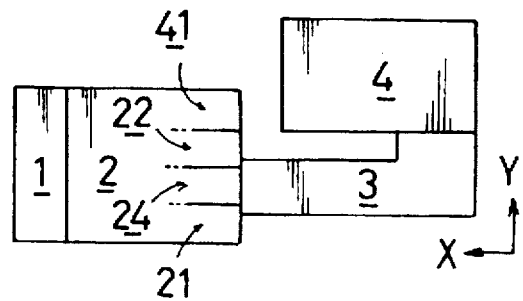

FIGS. 29A and 29B show layouts employing the conventional processing unit 2 described in the third embodiment. FIGS. 29C through 29F show layouts employing the improved processing unit 2 described in the fourth embodiment. In FIGS. 29C and 29D, the second substrate transport robot 42 in the processing unit 2 is used to deposit and fetch wafers W in/from the buffer section 32. In FIGS. 29E and 29F, the first substrate transport robot 23 in the processing unit 2 is used to deposit and fetch wafers W in/from the buffer section 32.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate transfer method for transferring substrates in a photolithographic process, between a processing unit for performing varied treatments on said substrates before and after exposure, and an exposure unit for performing the exposure, said method comprising:

a first transfer step for transferring substrates, which are to be passed from said processing unit to said exposure unit, from said processing unit to a substrate storage having a plurality of storage portions for temporarily storing a plurality of substrates, and depositing said substrates in selected ones of said storage portions;

a second transfer step for fetching, from said substrate storage, said substrates stored in said substrate storage by said first transfer step, and transferring said substrates transferred by said first transfer step from said substrate storage to said exposure unit;

a third transfer step for transferring substrates, which are to be passed from said exposure unit to said processing unit, from said exposure unit to said substrate storage and depositing said substrates in selected ones of said storage portions; and a fourth transfer step for fetching, from said substrate storage, said substrates stored in said substrate storage by said third transfer step, and transferring said substrates transferred by said third transfer step from said substrate storage to said processing unit;

wherein said first transfer step and said fourth transfer step are executed by one substrate transfer means, and said second transfer step and said third transfer step are executed by another substrate transfer means.

2. A substrate transfer method as defined in claim 1, wherein said first transfer step and said fourth transfer step are executed by substrate transport means in said processing unit, said substrate transport means being operable for transporting substrates within said processing unit and into and out of a plurality of processors in said processing unit for performing said varied treatments before and after exposure of said substrates.

3. A substrate transfer method as defined in claim 1, wherein said first transfer step and said fourth transfer step are executed based on operating information of said processing unit, and said second transfer step and said third transfer step are executed based on operating information of said exposure unit.

4. A substrate transfer method as defined in claim 1, wherein:

said storage portions are arranged in multiple vertical stages;

said storage portions being vertically divided into first and second groups for use;

said first group of storage portions being used for storing said substrates received in said first transfer step;

said second group of storage portions being used for storing said substrates received in said third transfer step;

said first transfer step being executed by searching said first group of storage portions upward for a vacancy, and depositing each of said substrates in a lowermost vacant storage portion;

said second transfer step being executed by fetching, from said substrate storage, a substrate deposited earliest of all substrates during said first transfer step;

said third transfer step being executed by searching said second group of storage portions upward for a vacancy, and depositing each of said substrates in a lowermost vacant storage portion; and said fourth transfer step being executed by fetching, from said substrate storage, a substrate deposited earliest of all substrates during said third transfer step.

5. A substrate transfer method as defined in claim 1, wherein:

said storage portions are arranged in multiple vertical stages;

said first transfer step being executed by searching all of said storage portions upward for a vacancy, and depositing each of said substrate in a lowermost vacant storage portion;

said second transfer step being executed by fetching, from said substrate storage, a substrate deposited earliest of all substrates during said first transfer step;

said third transfer step being executed by searching all of said storage portions upward for a vacancy, and depositing each of said substrates in a lowermost vacant storage portion; and said fourth transfer step being executed by fetching, from said substrate storage, a substrate deposited earliest of all substrates during said third transfer step.

6. An interface apparatus for transferring substrates, in a photolithographic process, between a processing unit, for performing varied treatments on said substrates before and after exposure, and an exposure unit, for performing the exposure, said apparatus comprising:

a substrate storage having a plurality of storage portions for temporarily storing a plurality of substrates;

first substrate transfer means for depositing substrates received from said processing unit in selected ones of said storage portions, and fetching substrates from selected ones of said storage portions and transferring said substrates to said processing unit; and second substrate transfer means for fetching substrates from selected ones of said storage portions and transferring said substrates to said exposure unit, and depositing substrates received from said exposure unit in selected ones of said storage portions.

7. An interface apparatus as defined in claim 6, wherein:

said first substrate transfer means being operable, based on operating information of said processing unit, for depositing substrates received from said processing unit in said selected ones of said storage portions, and fetching substrates from selected ones of said storage portions and transferring said substrates to said processing unit; and said second substrate transfer means being operable, based on operating information of said exposure unit, for fetching substrates from selected ones of said storage portions and transferring said substrates to said exposure unit, and depositing substrates received from said exposure unit in selected ones of said storage portions.

8. An interface apparatus as defined in claim 6, wherein:

said storage portions are arranged in multiple vertical stages;

said first substrate transfer means including:

means for exchanging substrates with said processing unit;

substrate depositing/fetching means extendible and retractable horizontally for supporting substrates and depositing and fetching said substrates in/from said selected ones of said storage portions; and vertical direction moving means for vertically moving said substrate depositing/fetching means;

said second substrate transfer means including:

substrate depositing/fetching means extendible and retractable horizontally for supporting substrates and depositing and fetching said substrates in/from said selected ones of said storage portions, and depositing and fetching substrates on/from a substrate input/ output table for exchanging said substrates with said exposure unit;

rotary means for rotating said substrate depositing/ fetching means about a vertical axis;

vertical direction moving means for vertically moving said substrate depositing/fetching means; and uniaxial direction moving means for moving said substrate depositing/fetching means in horizontal uniaxial directions; and said first substrate transfer means, said substrate storage and said second substrate transfer means being arranged in that order substantially linearly and parallel to the direction of movement of said uniaxial direction moving means, said substrate input/output table being arranged along said direction of movement of said uniaxial direction moving means.

9. An interface apparatus as defined in claim 8, wherein:

said processing unit includes a plurality of processors for performing said varied treatments before and after exposure of said substrates in the photolithographic process, a substrate transfer table having a plurality of substrate support pins erected thereon, and substrate transport means for transporting substrates into and out of said processors, transporting said substrates within said processing unit, and depositing and fetching said substrates on/from said substrate transfer table;

said processing unit further including a first apparatus area and a second apparatus area for separately accommodating said plurality of processors;

said first apparatus area, a substrate transport path for movement of said substrate transport means, and said second apparatus area being arranged in that order in plan view;

said substrate transfer table being disposed at an end of one of said first apparatus area and said second apparatus area adjacent said interface apparatus;

said uniaxial direction moving means being movable parallel to a direction of arrangement of said first apparatus area, said substrate transport path and said second apparatus area;

said first substrate transfer means being disposed adjacent said end of one of said first apparatus area and said second apparatus area where said substrate transfer table is disposed; and said first substrate transfer means being operable for exchanging substrates with said substrate transport means in said processing unit through said substrate transfer table, thereby receiving said substrates from said processing unit and transferring said substrates to said processing unit.

10. An interface apparatus as defined in claim 8, wherein:

said processing unit includes a plurality of processors for performing said varied treatments before and after exposure in the photolithographic process, and first substrate transport means and second substrate transport means for transporting substrates into and out of said processors, transporting said substrates within said processing unit, and sharing a function for exchanging said substrates with said first substrate transfer means;

said processing unit further including a first apparatus area and a second apparatus area for separately accommodating said plurality of processors;

said first apparatus area, a first substrate transport path for movement of said first substrate transport means, said second apparatus area, and a second substrate transport path for movement of said second substrate transport means being arranged in that order in plan view;

said uniaxial direction moving means being movable parallel to a direction of arrangement of said first apparatus area, said first substrate transport path, said second apparatus area and said second substrate transport path;

said first substrate transfer means being disposed adjacent an end of one of said first substrate transport path and said second substrate transport path; and said first substrate transfer means being operable for exchanging substrates with one of said first substrate transport means and said second substrate transport means in said processing unit, thereby receiving said substrates from said processing unit and transferring said substrates to said processing unit.

11. An interface apparatus as defined in claim 8, further comprising control means for controlling use of said storage portions as vertically divided into first and second groups, said first group of storage portions being used for storing said substrates transferred from said processing unit to said first substrate transfer means, said second group of storage portions being used for storing said substrates transferred from said exposure unit to said second substrate transfer means; said control means causing said first transfer means to search said first group of storage portions upward for a vacancy, and causing said first substrate transfer means to deposit each of said substrates in a lowermost vacant storage portion, when said first substrate transfer means deposits said substrates in said first group of storage portions; said control means causing said second substrate transfer means to fetch, from said substrate storage, a substrate deposited earliest of all substrates and searching said second group of storage portions upward for a vacancy, and causing said second substrate transfer means to deposit each of said substrates in a lowermost vacant storage portion, when said second substrate transfer means deposits said substrates in said second group of storage portions; said control means causing said first substrate transfer means to fetch, from said substrate storage, a substrate deposited earliest of all substrates deposited by said second substrate transfer means.

12. An interface apparatus as defined in claim 8, further comprising control means for searching all of said storage portions upward for a vacancy, and causing said first substrate transfer means to deposit each of said substrates in a lowermost vacant storage portion, when said first substrate transfer means deposits said substrates in said substrate storage; said control means also causing said second substrate transfer means to fetch, from said substrate storage, a substrate deposited earliest of all substrates deposited by said first substrate transfer means; said control means further searching said storage portions upward for a vacancy, and causing said second substrate transfer means to deposit each of said substrates in a lowermost vacant storage portion, when said second substrate transfer means deposits said substrates in said substrate storage; and said control means also causing said first substrate transfer means to fetch, from said substrate storage, a substrate deposited earliest of all substrates deposited by said second substrate transfer means.

13. An interface apparatus for transferring substrates, in a photolithographic process, between a processing unit for performing varied treatments before and after exposure and an exposure unit for performing the exposure, said apparatus comprising:

a substrate storage having a plurality of storage portions for temporarily storing a plurality of substrates, said substrate storage being constructed for allowing substrate transport means in said processing unit to deposit and fetch substrates in/from selected ones of said storage portions, said substrate transport means being operable for transporting substrates within said processing unit and into and out of a plurality of processors in said processing unit for performing said varied treatments before and after exposure; and substrate transfer means for fetching substrates from selected ones of said storage portions and transferring said substrates to said exposure unit, and depositing substrates received from said exposure unit in selected ones of said storage portions.

14. An interface apparatus as defined in claim 13, wherein said substrate transfer means is operable, based on operating information of said exposure unit, for fetching substrates from selected ones of said storage portions and transferring said substrates to said exposure unit, and depositing substrates received from said exposure unit in selected ones of said storage portions.

15. An interface apparatus as defined in claim 13, wherein:

said substrate transport means includes:
a substrate support for supporting a substrate;
means for extending and retracting said substrate support in horizontal directions; and
vertical direction moving means for vertically moving said substrate support;
said storage portions being arranged in multiple vertical stages;

said substrate transfer means including:
substrate depositing/fetching means extendible and retractable horizontally for supporting substrates and depositing and fetching said substrates in/from said selected ones of said storage portions, and depositing and fetching substrates on/from a substrate input/output table for exchanging said substrates with said exposure unit;
rotary means for rotating said substrate depositing/fetching means about a vertical axis;
vertical direction moving means for vertically moving said substrate depositing/fetching means; and
uniaxial direction moving means for moving said substrate depositing/fetching means in horizontal uniaxial directions; and said substrate storage and said substrate transfer means being arranged in this order substantially linearly and parallel to the direction of movement of said uniaxial direction moving means, said substrate input/output table being arranged along said direction of movemen of said uniaxial direction moving means.

16. An interface apparatus as defined in claim 15, wherein:

said processing unit includes said plurality of processors for performing said varied treatments before and after exposure in the photolithographic process, and said substrate transport means for transporting substrates into and out of said processors, transporting said substrates within said processing unit, and depositing and fetching said substrates in/from selected ones of said storage portions of said substrate storage in said interface apparatus;

said processing unit further including a first apparatus area and a second apparatus area for separately accommodating said plurality of processors;

said first apparatus area, a substrate transport path for movement of said substrate transport means, and said second apparatus area being arranged in this order in plan view;

said uniaxial direction moving means being movable parallel to a direction of arrangement of said first apparatus area, said substrate transport path and said second apparatus area;

said substrate storage being disposed adjacent an end of said interface apparatus opposed to an end of said substrate transport path.

17. An interface apparatus as defined in claim 15, wherein:

said processing unit includes said plurality of processors for performing said varied treatments before and after exposure in the photolithographic process, and first substrate transport means and second substrate transport means for transporting substrates into and out of said processors, transporting said substrates within said processing unit, and sharing a function for depositing and fetching said substrates in/from selected ones of said storage portions of said substrate storage in said interface apparatus;

said processing unit further including a first apparatus area and a second apparatus area for separately accommodating said plurality of processors;

said first apparatus area, a first substrate transport path for movement of said first substrate transport means, said second apparatus area, and a second substrate transport path for movement of said second substrate transport means being arranged in this order in plan view;

said uniaxial direction moving means being movable parallel to a direction of arrangement of said first apparatus area, said first substrate transport path, said second apparatus area and said second substrate transport path; and said substrate storage is disposed adjacent an end of one of said first substrate transport path and said second substrate transport path.

18. An interface apparatus as defined in claim 15, further comprising control means for controlling use of said storage portions as vertically divided into first and second groups, said first group of storage portions being used for storing said substrates received from said substrate transport means in said processing unit, said second group of storage portions being used for storing said substrates transferred from said exposure unit to said substrate transfer means; said control means controlling searching of said first group of storage portions upward for a vacancy, and causing said substrate transport means to deposit each of said substrates in a lowermost vacant storage portion, when said substrate transport means deposits said substrates in said first group of storage portions; said control means causing said substrate transfer means to fetch, from said substrate storage, a substrate deposited earliest of all substrates; said control means also controlling searching of said second group of storage portions upward for a vacancy, and causing said substrate transfer means to deposit each of said substrates in a lowermost vacant storage portion, when said substrate transfer means deposits said substrates in said second group of storage portions; and said control means further causing said substrate transport means to fetch, from said substrate storage, a substrate deposited earliest of all substrates deposited by said substrate transfer means.

19. An interface apparatus as defined in claim 15, further comprising control means for searching all of said storage portions upward for a vacancy, and causing said substrate transport means in said processing unit to deposit each of said substrates in a lowermost vacant storage portion, when said substrate transport means deposits said substrates in said substrate storage; said control means also causing said substrate transfer means to fetch, from said substrate storage, a substrate deposited earliest of all substrates deposited by said substrate transport means; searching said storage portions upward for a vacancy, and causing said substrate transfer means to deposit each of said substrates in a lowermost vacant storage portion, when said substrate transfer means deposits said substrates in said substrate storage; and causing said substrate transport means to fetch, from said substrate storage, a substrate deposited earliest of all substrates deposited by said substrate transfer means.

* * * * *